(12) United States Patent
Wakayama et al.

(10) Patent No.: US 6,205,076 B1
(45) Date of Patent: Mar. 20, 2001

(54) DESTRUCTIVE READ TYPE MEMORY CIRCUIT, RESTORING CIRCUIT FOR THE SAME AND SENSE AMPLIFIER

(75) Inventors: Shigetoshi Wakayama; Kohtaroh Gotoh; Miyoshi Saito; Junji Ogawa, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/276,690

(22) Filed: Mar. 26, 1999

(30) Foreign Application Priority Data

Mar. 27, 1998 (JP) .................................................. 10-082295
Mar. 27, 1998 (JP) .................................................. 10-082296

(51) Int. Cl.[7] ...................................................... G11C 7/00
(52) U.S. Cl. ................ 365/222; 365/230.03; 365/230.06
(58) Field of Search ................................... 365/149, 222, 365/230.03, 230.06

(56) References Cited

U.S. PATENT DOCUMENTS 5,623,446 * 4/1997 Hisada et al. .................... 365/189.11
5,625,602 * 4/1997 Hasegawa et al. .................. 365/222
5,822,266 * 10/1998 Kikinis ................................. 365/222
5,856,938 * 1/1999 Kasai et al. .......................... 365/149

* cited by examiner

Primary Examiner—Son Mai
(74) Attorney, Agent, or Firm—Arent Fox Kintner Plotkin & Kahn, PLLC

(57) ABSTRACT

A restoring circuit 24, provided for each of the memory blocks 191 and 192, having registers and a selector for selecting one of the present row address and the output of the registers, provides the output of the selector to a word decoder 26. The present row address is held in one of the registers. When amplification is started by a sense amplifier 15, transfer gates 10 and 11 connected between the bit lines BL1 and *BL1 and the sense amplifier 15 are turned off to decrease the load of the sense amplifier 15, the amplified signal is stored in a buffer memory cell circuit 18, and accessing is completed with omitting restoring to the memory cell 12. While the memory cell block 191 is not selected, the data held in the buffer memory cell circuit 18 is stored into the memory cell row addressed by the content of the selected register. The sense amplifier 15 has PMOS and NMOS sense amplifiers. The PMOS sense amplifier, having a pair of cross-coupled PMOS transistors and a pair of transfer gates, the potential of the sources of the PMOS transistors being fixed at Vii, operates in a direct sensing mode when the transfer gates are off state, and then functions as a usual PMOS sense amplifier by turning on the transfer gates. Likewise for the NMOS sense amplifier.

16 Claims, 34 Drawing Sheets

DESTRUCTIVE READ TYPE MEMORY CIRCUIT, RESTORING CIRCUIT FOR THE SAME AND SENSE AMPLIFIER

BACKGROUND OF THE INVENTION

1. Field of the Invention

The present invention relates to a destructive read type memory circuit, a restoring circuit for the same, a sense amplifier, and a semiconductor device including any one of the same.

2. Description of the Related Art

With increasing in the operation frequency of microprocessor, improving in the data transfer rate of memory device is required.

FIG. 33 shows a circuit connected to a bit line pair of a prior art DRAM.

A pair of complementary bit lines BL1 and *BL1 are, respectively, connected through transfer gates 10 and 11 to sense amplifier side wirings SA and *SA. A number of memory cells are connected to each of the bit lines BL1 and *BL1, and in FIG. 33, only memory cells 12 and 13 are illustrated. A precharge circuit 14 with an equalizer and a CMOS sense amplifier 15 are connected between the wirings SA and *SA. The wiring SA is connected to a data bus line DB via a column gate 16, and the wiring *SA is connected to a data bus line *DB via a column gate 17.

FIG. 34 shows a read operation of the circuit in FIG. 33 in a case where both of a cell plate potential Vcp at one end of a capacitor 121 of a memory cell 12 and a precharge potential of the bit lines BL1 and *BL1 are Vii/2.

In the initial state, the transfer gates 10 and 11 are on, the bit lines BL1 and *BL1 and the wirings SA and *SA are precharged to the potential Vii/2, and drive signals PSA and NSA of the CMOS sense amplifier 15 are at the potential of Vii/2, wherein a precharge signal PR is set to low, thereby NMOS transistors 141 through 143 are all off.

In this state, the row address is changed to raise the potential of the word line WL1, whereby the transfer gate 122 of the memory cell 12 is turned on, and a small potential difference arises between the bit lines BL1 and *BL1 by movement of electric charge between the capacitor 121 and the bit line BL1.

Next, the drive signal PSA is made to a potential Vii and the drive signal NSA is made to a potential Vss, whereby the CMOS sense amplifier 15 is activated and the small potential difference between the wirings SA and *SA is amplified.

Next, a column selection signal CL1 is made high, and the column gates 16 and 17 are turned on, whereby data is read out onto the data bus lines DB and *DB.

The potential Vc of the capacitor 121 changes as shown with a dashed line in FIG. 34. The rise of the potential Vc is gentle because of a time constant τ=(resistances of the bit line BL1 and transfer gate 122)×(Capacitances of the capacitor 121 and bit line BL1). Time is denoted as t, and Vc is roughly expressed by Vc=Vii{1−0.5EXP(−t/τ)}. For example, when Vii=2.4 V and Vss=0 V, it is necessary to fall down potential of a word line WL1 after waiting until Vc becomes 2.35 V in order to rewrite data in the memory cell 12. The time of restoring from the fall of the column selection signal CL1 to the beginning of the fall of the word line WL1 is about 20 ns.

After the potential of the word line WL1 have fallen, the potential of the drive signals PSA and NSA is made at a potential of Vii/2, and the precharge signal PR is made high, whereby the bit lines BL1 and *BL1 are precharged to the potential Vii/2.

The row cycle time from the transition of row address to the completion of the precharge is about 40 ns.

Since data of the memory cells connected to the other bit lines (not illustrated) are read out on the respective bit line pairs at the same time if the word line WL1 is selected, the data transfer is carried out at a high rate in a burst mode in which a column address is changed with the same row address, whereby the restoring time rate becomes rather small. Further, in a multi-bank type DRAM, in a case where data are accessed with the banks alternately changed, since the banks are changed when performing a restoring, the restoring time is concealed.

However, even in a multi-bank type DRAM, in random accesses wherein row addresses are frequently changed in the same bank, the data transfer ability is remarkably decreased by the restoring times.

Further, due to the following reasons, the access time from the potential rise of the word line WL1 to a reading of data out of a memory device is lengthened.

(1) The CMOS sense amplifier 15 can not be activated to prevent an erroneous operation during the time from turning on of the transfer gate 122 to getting small potential difference of about 200 mV between the bit lines BL1 and *BL1 by movement of electric charge between the capacitor 121 and the bit line BL1. The time is comparatively long due to parasitic capacity and resistance of the bit line and transfer gate 122.

(2) The size of transistors 151 through 154 of the CMOS sense amplifier 15 is greater by several times than that of transistors of the transfer gate 10, etc., in order to prevent erroneous operations by decreasing characteristic variations resulting from process dispersion. Thereby, the gate capacities of the transistors 151 through 154 are comparatively great, and the activation time until the potential of the drive signal PSA becomes to Vii from Vii/2 and until the potential of the drive signal NSA becomes to Vss from Vii/2 is made long. Further, since sense amplifiers connected to respective bit line pairs, for example, 1024 bit line pairs, are simultaneously activated, the activation time is made still longer.

(3) Since the potential difference between the wirings SA and *SA is temporarily decreased as shown in FIG. 34 when the column gates 16 and 17 are turned on, the column gates 16 and 17 are not able to be turned on until the potential difference becomes a certain value, in order to prevent erroneous operations of the CMOS sense amplifier 15.

These problems decrease by employing a direct sensing system. However, since the amplification factor of the direct sensing system is smaller than in a case where a CMOS sense amplifier is used, the data access time can not be sufficiently shortened. Further, the above-described problem (2) can not be solved even if both the direct sensing system and CMOS sense amplifier are concurrently employed.

SUMMARY OF THE INVENTION

In view of the above-described problems, it is an object of the present invention to provide a destructive read type memory circuit, a restoring circuit, and a semiconductor device, which are able to shorten a row cycle time by omitting a restoring operation.

It is another object of the present invention to provide a sense amplifier circuit, a memory device and a semiconductor device including the same, which are able to shorten a row cycle time by adding a direct sensing function to the sense amplifier circuit.

In the 1st aspect of the present invention, there is provided a destructive read type memory circuit comprising: a memory cell array having a plurality of memory cells each of which is selected by a row address; a buffer memory cell; a restoring address register; and a control circuit for storing a present row address into the restoring address register, storing a content of the selected memory cell into the buffer memory cell, completing an access to the selected memory cell with a destructed content without restoring to the selected memory cell, and restoring in a free time the content of the stored buffer memory cell into the memory cell addressed by the content held in the restoring address register.

With the 1st aspect of the present invention, since restoring operation is omitted from data access operation and the content of the buffer memory cell is restored in the memory cell addressed by the contents held in the register in free time, for example, in a period of time during which a memory cell block, bank or chip is not selected, or in a period of refreshing time, the row cycle can be shortened, and particularly the data transfer rate can be improved in a random access where row addresses are frequently changed in the same memory block or the same bank.

In the 2nd aspect of the present invention, there is provided a destructive read type memory circuit as defined in the 1st aspect, wherein each of the memory cell is connected operatively to a bit line, the memory circuit further comprising a sense amplifier for amplifying a signal read out from the selected memory cell onto the bit line.

In the 3rd aspect of the present invention, there is provided a destructive read type memory circuit as defined in the 2nd aspect, further comprising a switching element connected between the bit line and the sense amplifier, wherein the control circuit turns off the switching element when the sense amplifier starts to amplify.

With the 3rd aspect of the present invention, since the output load of the sense amplifier is made small when amplification is carried out, the amplification operation becomes fast.

In the 4th aspect of the present invention, there is provided a destructive read type memory circuit comprising: a plurality of memory cell blocks, the memory cell blocks having respective memory cell arrays, each of the memory cell arrays having a plurality of memory cells, one of the memory cell blocks and one of the memory cells being selected by an address; buffer memory cells provided for respective buffer memory cell blocks; restore address registers provided for respective buffer memory cell blocks; and a control circuit for storing a present row address into the restoring address register corresponding to the selected memory cell block, storing a content of the selected memory cell into the buffer memory cell corresponding to the selected memory cell block, completing an access to the selected memory cell with a destructed content without restoring to the selected memory cell, and restoring in a free time the content of the stored buffer memory cell into the memory cell addressed by the content held in the corresponding restoring address register.

In the 5th aspect of the present invention, there is provided a destructive read type memory circuit as defined in the 4th aspect, further comprising selection circuits provided for the respective memory cell blocks, each of the selection circuit being for selecting one of a present row address and an output of the corresponding restoring address register, wherein the control circuit causes the selection circuit corresponding to the selected memory cell block to select the present row address and causes the selection circuit to select the output of the corresponding restoring address register in the free time.

With the 5th aspect of the present invention, since it is not necessary to lay long address lines for restoring along the usual address lines in order to perform restoring, the construction can be simplified.

In the 6th aspect of the present invention, there is provided a destructive read type memory circuit as defined in the 5th aspect, further comprises an row address transition detecting circuit, wherein there are provided N buffer memory cells and N restoring address registers for each of the memory cell blocks, wherein the selection circuit selects one of a present row address and outputs of the corresponding N restoring address registers, wherein the control circuit comprises for each of the memory cell blocks: an up/down counter; and an up/down signal generating circuit for providing the up/down counter with a signal to count up if a row address transition is detected, a corresponding memory cell block is selected and the count of the up/down counter is smaller than N, and with a signal to count down if an address transition is detected, it is in the free time and the count of the up/down counter is not zero.

With the 6th aspect of the present invention, since storing and selection of row addresses are carried out in compliance with the count of the up-down counter, the construction can be simplified.

In the 7th aspect of the present invention, there is provided a destructive read type memory circuit as defined in the 6th aspect, wherein the control circuit further comprises in-block row address control circuits provided for the respective memory cell blocks, each of the in-block row address control circuits is, when the corresponding memory cell block is selected, in regard to the corresponding memory cell block, for causing the restoring address register corresponding to the count of the up/down counter to latch the present row address and causing the corresponding selection circuit to select the present row address, if the count is smaller than n; and for outputting control signals to carry out a restoring to the selected memory cell in a memory access cycle if the count is n, and each of the in-block row address control circuits is, when it is in the free time, in regard to the corresponding memory cell block, for causing the corresponding selection circuit to select an output of the restoring address register corresponding to the count if the count is not zero.

In the 8th aspect of the present invention, there is provided a destructive read type memory circuit as defined in the 7th aspect, wherein each of the in-block row address control circuits is for selecting the buffer memory cell corresponding to the count when causing the corresponding selection circuit to select.

With the 8th aspect of the present invention, selection and control of the buffer memory cell can be made easy.

In the 9th aspect of the present invention, there is provided a destructive read type memory circuit as defined in the 5th aspect, further comprising a predecoder for a row address; and word decoders, each for further decoding an output of the predecoder, provided for the respective memory cell blocks, wherein the selection circuits are connected between the predecoder and the corresponding word decoder.

With the 9th aspect of the present invention, it is possible to dispose the selection circuit near the memory cell block.

In the 10th aspect of the present invention, there is provided a destructive read type memory circuit as defined in the 5th aspect, wherein there are provided N buffer memory cells and N restoring address registers for each of the memory cell blocks, wherein the selection circuit selects one of a present row address and outputs of the corresponding N restoring address registers, the memory circuit further comprises N flag-storage cells provided for the respective N restoring address registers, each of the N flag-storage cells is for storing a flag designating whether a content of the corresponding restoring address resister is 'EFFECTIVE' or 'INEFFECTIVE', wherein the control circuit, when one of the memory cell blocks is selected by a present row address, causes the flag corresponding to the selected memory cell block to change to 'EFFECTIVE' if the same is 'INEFFECTIVE', and causes the restoring address register corresponding thereto to latch the present row address, and wherein the control circuit, if a flag of the flag-storage cells is 'EFFECTIVE' in the free time, causes the same to change to 'INEFFECTIVE' and causes the selection circuit corresponding thereto to select the content of the restoring address register corresponding thereto.

In the 11th aspect of the present invention, there is provided a destructive read type memory circuit comprising: a plurality of banks having respective memory cell blocks, the memory cell blocks having respective memory cell arrays, each of the memory cell arrays having a plurality of memory cells, one of the banks, one of the memory cell blocks and one of the memory cells being selected by an address; buffer memory cells provided for respective buffer memory cell blocks; restore address registers provided for respective buffer memory cell blocks; and a control circuit for storing a present row address into the restoring address register corresponding to the selected bank and selected memory cell block therein, storing a content of the selected memory cell into the buffer memory cell corresponding to the selected memory cell block, completing an access to the selected memory cell without restoring to the selected memory cell, and restoring in a free time the content of the stored buffer memory cell into the memory cell addressed by the content held in the corresponding restoring address register.

With the 11th aspect of the present invention, it is possible to dispose the restoring circuit with respect to the memory cell block at an area independent from the memory cell array.

In the 12th aspect of the present invention, there is provided a destructive read type memory circuit as defined in the 11th aspect, further comprising: flag-storage cells provided for the respective restoring address registers, each of the flag-storage cells is for storing a flag designating whether a content of the corresponding restoring address resister is 'EFFECTIVE' or 'INEFFECTIVE'; an effective flag selection circuit for selecting a flag from 'EFFECTIVE' flags in the flag-storage cells; and a selection circuit for selecting one of the outputs of the restoring address registers, this one corresponding to the selected 'EFFECTIVE' flag; wherein the control circuit, in regard to the selected memory cell block by a present row address, causes the corresponding flag to change to 'EFFECTIVE' if the same is 'INEFFECTIVE', and causes the restoring address register corresponding thereto to latch the present row address, and wherein the control circuit, in regard to a non-selected memory cell block by the present row address, causes the flag of the flag-storage cell corresponding to the selected 'EFFECTIVE' flag by the effective flag selection circuit to change to 'INEFFECTIVE' and causes the content of the corresponding buffer memory cell to store into the memory cell addressed by the output of the selection circuit.

In the 13th aspect of the present invention, there is provided a restoring circuit, comprising: a restoring address storage circuit for storing a plurality of restoring addresses; a control circuit for storing a row address in the restoring address storage circuit without causing a memory device to restoring when a first chip selection signal is active, and outputting a content of the restoring address storage circuit, an activated restoring signal and an activated second chip selection signal when the first chip selection signal is inactive.

With the 13th aspect of the present invention, the restoring circuit can be constructed independently from a destructive read type memory device.

In the 14th aspect of the present invention, there is provided a restoring circuit, as defined in the 13th aspect, further comprising: a flag-storage circuit for storing flags designating whether the respective row addresses stored in the restoring address storage circuit are 'EFFECTIVE' or 'INEFFECTIVE'; an effective flag selection circuit for selecting one flag from the 'EFFECTIVE' flags in the flag-storage circuit; and a selection circuit for selecting one of the addresses stored in the restoring address storage circuit, this one corresponding to the selected 'EFFECTIVE' flag; wherein the control circuit, when the first chip selection signal is active, causes a flag to change to 'EFFECTIVE' if the same is 'INEFFECTIVE' and causes at a storage place in the restoring address circuit to latch the present row address, the place corresponding to this flag, and wherein the control circuit, when the first chip selection signal is inactive, causes the flag in the flag-storage circuit corresponding to the selected 'EFFECTIVE' flag to change to 'INEFFECTIVE'.

In the 15th aspect of the present invention, there is provided a destructive read type memory circuit, comprising: a memory cell block; a buffer memory cell provided for the memory cell block; a control circuit for storing the content of an addressed memory cell in the memory cell block into the buffer memory cell with omitting a restoring operation to the addressed memory cell in response to a restoring omission instruction, and storing the content of the buffer memory cell into an addressed memory cell in the memory cell block in response to a restoring instruction.

With the 15th aspect of the present invention, the effect of the above 1st aspect can be obtained by a combination with a restoring circuit independent from the memory circuit.

In the 16th aspect of the present invention, there is provided a semiconductor device including a destructive read type memory circuit which comprises: a memory cell array having a plurality of memory cells each of which is selected by an address; a buffer memory cell; a restoring address register; and a control circuit for storing a present row address into the restoring address register, storing a content of the selected memory cell into the buffer memory cell, completing an access to the selected memory cell without restoring to the selected memory cell, and restoring in a free time the content of the stored buffer memory cell into the memory cell addressed by the content held in the restoring address register.

In the 17th aspect of the present invention, there is provided a sense amplifier circuit comprising: a first switching element having first and second electrodes for conducting a current between them; a second switching element having first and second electrodes for conducting a current between them, the second switching element being on-off controlled together with the first switching element; a first FET, the gate and drain of which are connected to the first electrode of the first switching element and the second electrode of the second switching element, respectively; and a second FET, the gate and drain of which are connected to the first electrode of the second switching element and the second electrode of the first switching element, respectively, and the source of which is connected to the source of the first FET.

With the 17th aspect of the present invention, the direct sensing is performed by setting the 1st and 2nd switching elements at off state, whereby the sources of the 1st and 2nd FETs can be fixed at an active potential. Therefore, without changing the sources from an inactive potential to an active potential, a difference in current flowing through the 1st and 2nd FETs arises in response to the potential difference between the 1st electrodes of the 1st and 2nd switching elements, whereby an amplification is carried out. Subsequently, by turning on the 1st and 2nd switching elements, the sense amplifier circuit functions as a usual flip-flop type sense amplifier.

Therefore, by using the sense amplifier circuit for memory device, the row cycle time can be shortened.

In the 18th aspect of the present invention, there is provided a sense amplifier circuit comprises: a PMIS cross-coupled circuit including: a first switching element having first and second electrodes for conducting a current between them; a second switching element having first and second electrodes for conducting a current between them, the second switching element being on-off controlled together with the first switching element; a first PMIS transistor, the gate and drain of which are connected to the first electrode of the first switching element and the second electrode of the second switching element, respectively; and a second PMIS transistor, the gate and drain of which are connected to the first electrode of the second switching element and the second electrode of the first switching element, respectively, and the source of which is connected to the source of the first PMIS transistor, and a NMIS cross-coupled circuit including: a third switching element having first and second electrodes for conducting a current between them; a fourth switching element having first and second electrodes for conducting a current between them, the second switching element being on-off controlled together with the third switching element; a first NMIS transistor, the gate and drain of which are connected to the first electrode of the third switching element and the second electrode of the fourth switching element, respectively; and a second NMIS transistor, the gate and drain of which are connected to the first electrode of the fourth switching element and the second electrode of the third switching element, respectively, and the source of which is connected to the source of the first NMIS transistor, wherein the PMIS cross-coupled circuit is cascaded to the NMIS cross-coupled circuit with the first and third switching elements connecting in series and the second and fourth switching elements connecting in series.

With the 18th aspect of the present invention, by turning on the 1st and 2nd switching elements, a CMIS sense amplifier having a high drive ability is constructed, which is a combination of the PMIS cross-coupled circuit and the NMIS cross-coupled circuit which is activated or will be activated. Thereby the above-described effect of the 17th aspect can be increased.

In the 19th aspect of the present invention, there is provided a sense amplifier circuit as defined in the 18th aspect, wherein the second electrode of the first switching element is connected to the second electrode of the third switching element and the second electrode of the second switching element is connected to the second electrode of the fourth switching element.

With the 19th aspect of the present invention, it is possible to activate the PMIS cross-coupled circuit before turning on the 1st and 2nd switching elements.

In the 20th aspect of the present invention, there is provided a sense amplifier circuit as defined in the 19th aspect, further comprising a buffer memory cell connected between the second electrode of the first switching element and the second electrode of the second switching element.

In the 21st aspect of the present invention, there is provided a sense amplifier circuit as defined in the 18th aspect, wherein the second electrode of the first switching element is connected to the first electrode of the third switching element and the second electrode of the second switching element is connected to the first electrode of the fourth switching element.

With the 21st aspect of the present invention, because of the symmetry of the construction, it is possible to amplify either the potential difference between the 1st electrodes of the 1st and 2nd switching elements or the potential difference between the 1st electrodes of the 3rd and 4th switching elements.

In the 22nd aspect of the present invention, there is provided a sense amplifier circuit as defined in the 21st aspect, further comprising a buffer memory cell connected between the second electrode of the third switching element and the second electrode of the fourth switching element.

In the 23rd aspect of the present invention, there is provided a sense amplifier circuit as defined in the 18th aspect, wherein the first electrode of the first switching element is connected to the first electrode of the third switching element and the first electrode of the second switching element is connected to the first electrode of the fourth switching element.

With the 21st aspect of the present invention, since two-step direct sensing is carried out with the 1st through 4th switching elements being off, the amplification ratio thereof can be greater than that of one-step direct sensing.

In the 24th aspect of the present invention, there is provided a sense amplifier circuit as defined in the 23rd aspect, further comprising a buffer memory cell connected between the first electrode of the first switching element and the first electrode of the second switching element.

In the 25th aspect of the present invention, there is provided A memory device comprising: a sense amplifier circuit comprises: a first switching element having first and second electrodes for conducting a current between them; a second switching element having first and second electrodes for conducting a current between them, the second switching element being on-off controlled together with the first switching element; a first PMIS transistor, the gate and drain of which are connected to the first electrode of the first switching element and the second electrode of the second switching element, respectively; and a second PMIS transistor, the gate and drain of which are connected to the first electrode of the second switching element and the second electrode of the first switching element, respectively, the source of which is connected to the source of the first PMIS transistor, and the source of which is applied with a higher power source potential; a memory cell array having a memory cell connected to each of first and second bit lines, the first and second bit lines being coupled to the first electrode of the first switching element and the first electrode of the second switching element, respectively; a control circuit for setting the first and second switching elements to off state for a direct sensing and causing the first and second switching elements to turn on for voltage amplification.

In the 26th aspect of the present invention, there is provided a memory device as defined in the 24th aspect, further comprising a precharge circuit which precharges the first electrodes of the first and second switching elements to a lower source potential through the first and second bit lines.

In the 27th aspect of the present invention, there is provided A memory device comprising: a sense amplifier circuit includes: a first switching element having first and second electrodes for conducting a current between them; a second switching element having first and second electrodes for conducting a current between them, the second switching element being on-off controlled together with the first switching element; a first NMIS transistor, the gate and drain of which are connected to the first electrode of the first switching element and the second electrode of the second switching element, respectively; and a second NMIS transistor, the gate and drain of which are connected to the first electrode of the second switching element and the second electrode of the first switching element, respectively, the source of which is connected to the source of the first NMIS transistor and the source of which is applied with a lower source potential; a memory cell array having a memory cell connected to each of first and second bit lines, the first and second bit lines being coupled to the first electrode of the first switching element and the first electrode of the second switching element, respectively; a control circuit for setting the first and second switching elements to off state for a direct sensing and causing the first and second switching elements to turn on for voltage amplification.

In the 28th aspect of the present invention, there is provided a memory device as defined in the 27th aspect, further comprising a precharge circuit which precharges the first electrodes of the first and second switching elements to a higher source potential through the first and second bit lines.

In the 29th aspect of the present invention, there is provided a memory device as defined in the 25th aspect, further comprising: an equalizer switching element connected between the first electrodes of the first and second switching elements; a first transfer gate connected between the first bit line and the sense amplifier circuit; and a second transfer gate connected between the second bit line and the sense amplifier circuit.

In the 30th aspect of the present invention, there is provided a memory device as defined in the 27th aspect, further comprising: an equalizer switching element connected between the first electrodes of the first and second switching elements; a first transfer gate connected between the first bit line and the sense amplifier circuit; and a second transfer gate connected between the second bit line and the sense amplifier circuit.

In the 31st aspect of the present invention, there is provided a semiconductor device comprising a sense amplifier circuit which comprises: a first switching element having first and second electrodes for conducting a current between them; a second switching element having first and second electrodes for conducting a current between them, the second switching element being on-off controlled together with the first switching element; a first FET, the gate and drain of which are connected to the first electrode of the first switching element and the second electrode of the second switching element, respectively; and a second FET, the gate and drain of which are connected to the first electrode of the second switching element and the second electrode of the first switching element, respectively, and the source of which is connected to the source of the first FET.

Other aspects, objects, and the advantages of the present invention will become apparent from the following detailed description taken in connection with the accompanying drawings.

DESCRIPTION OF THE PREFERRED EMBODIMENTS

Figure 1:
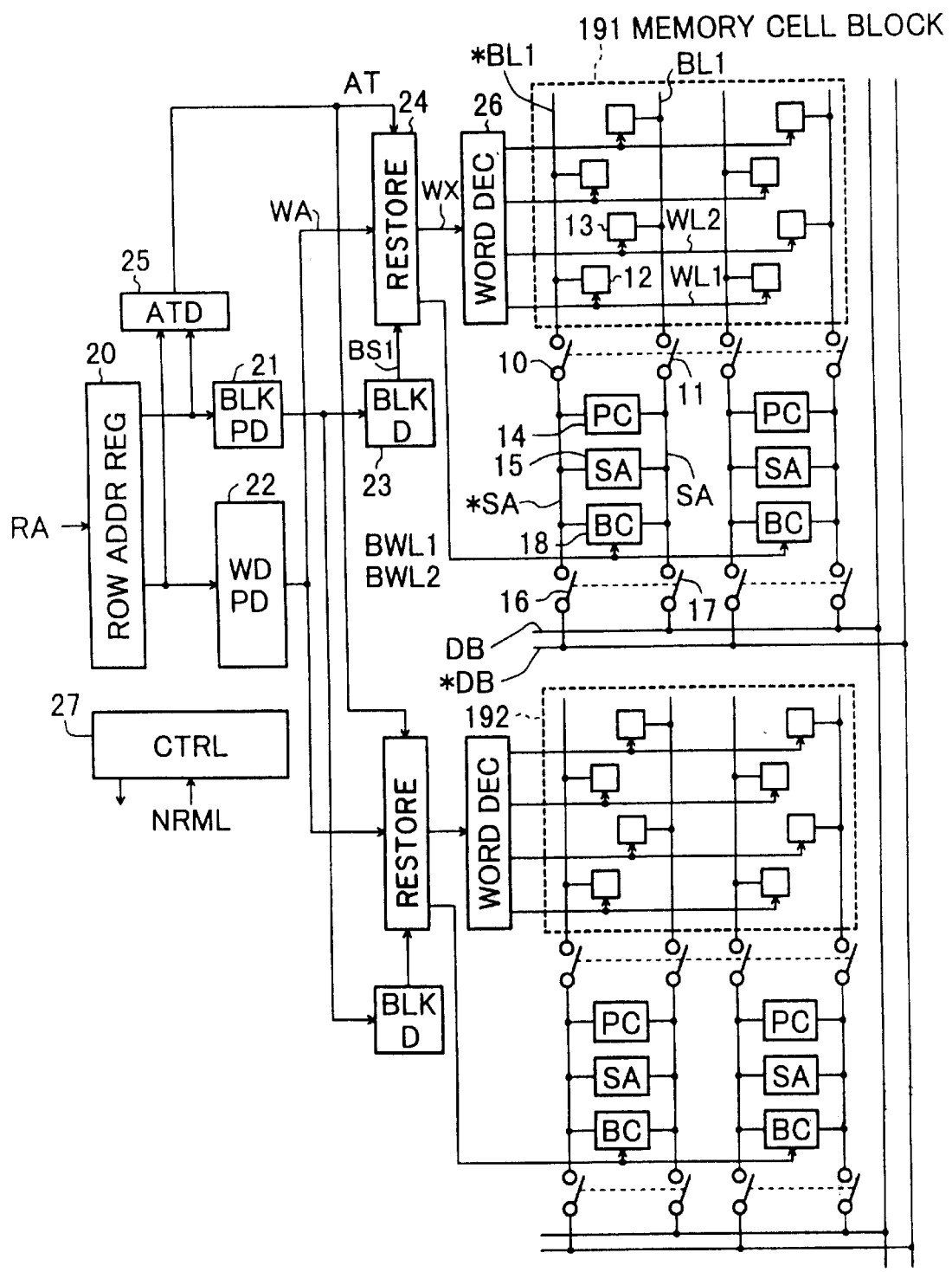
FIG. 1 is a block diagram showing a row address related circuit of a DRAM according to the first embodiment of the present invention.

Referring now to the drawings, wherein like reference characters designate like or corresponding parts throughout several views, preferred embodiments of the present invention are described below.

First Embodiment

Figure 7:
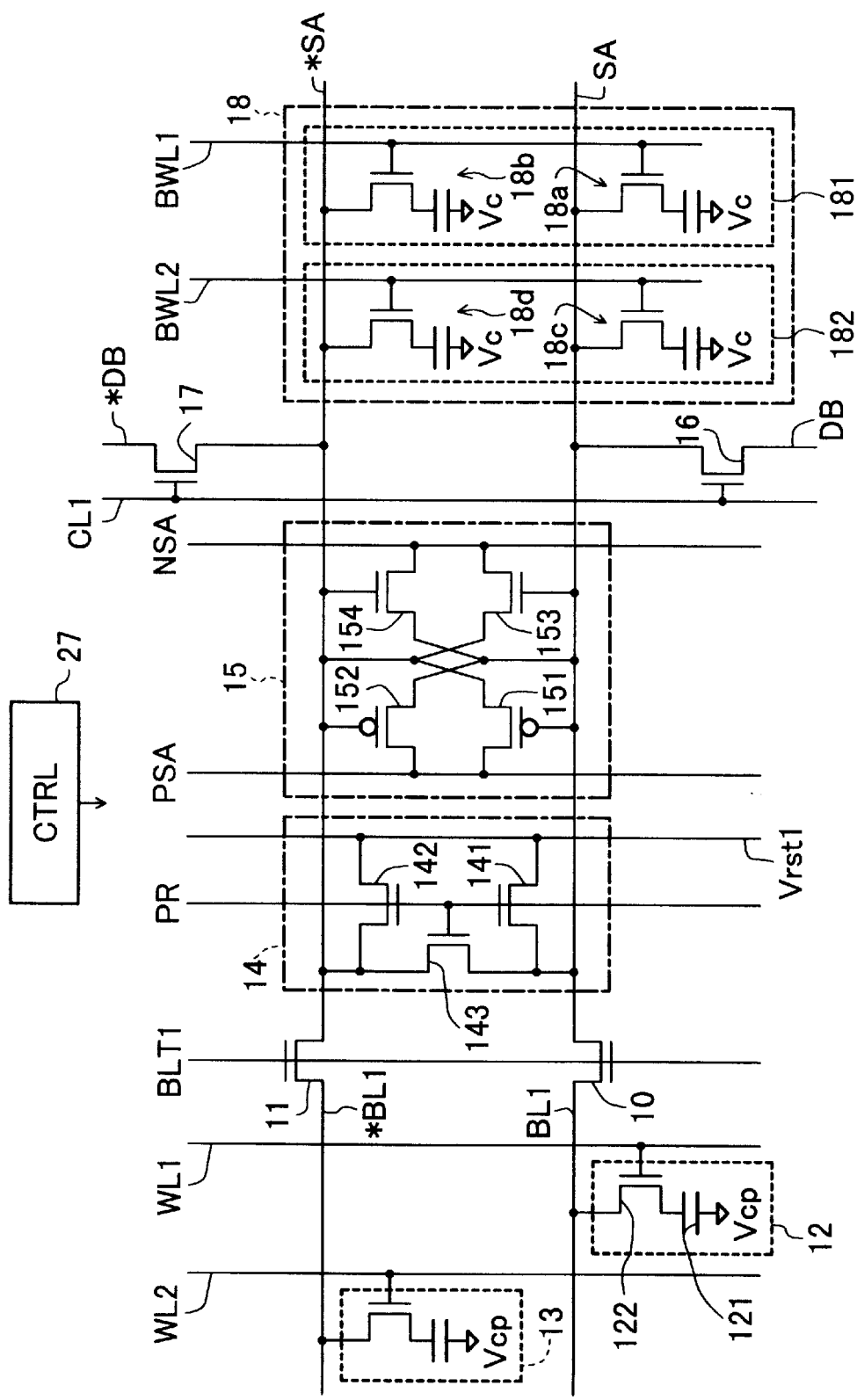
FIG. 7 is a diagram showing an embodiment of a circuit connected to a bit line pair in FIG. 1.
Figure 33:
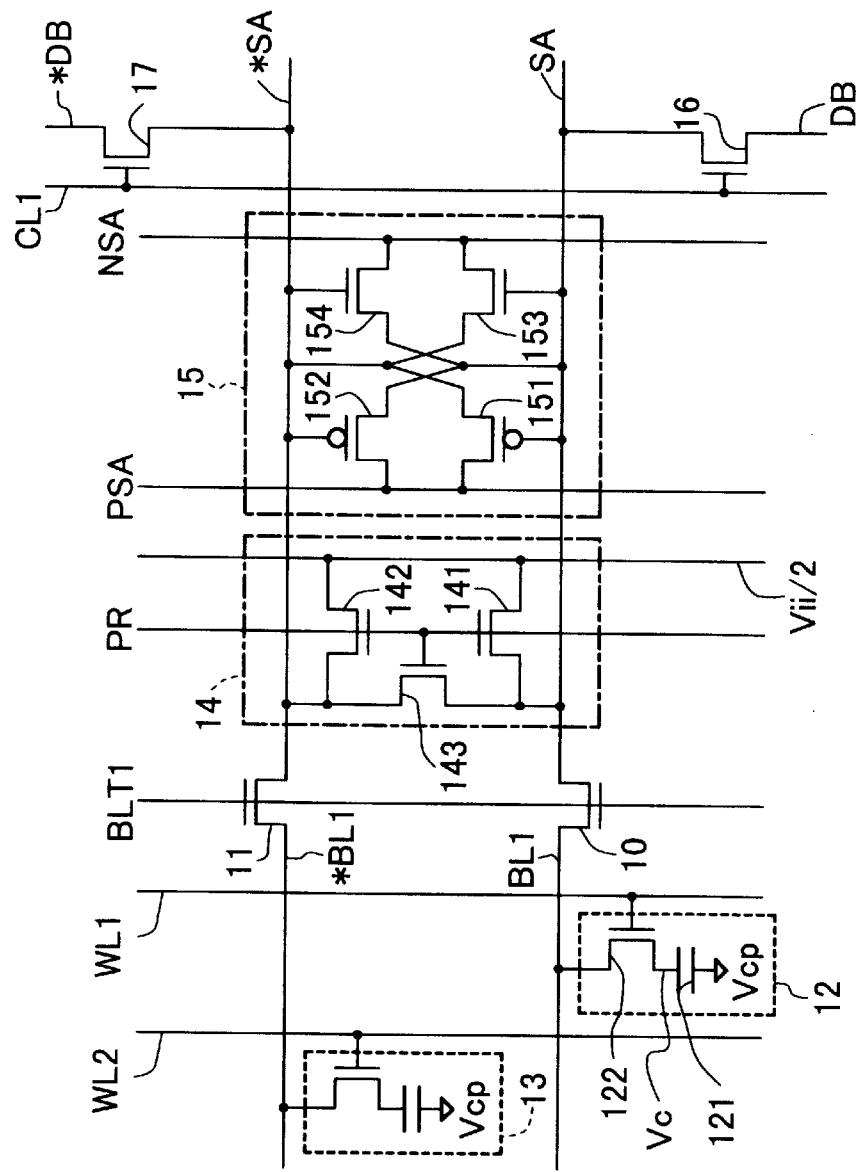
FIG. 33 is a diagram showing a prior art circuit connected to a bit line pair in a DRAM.
Figure 34:
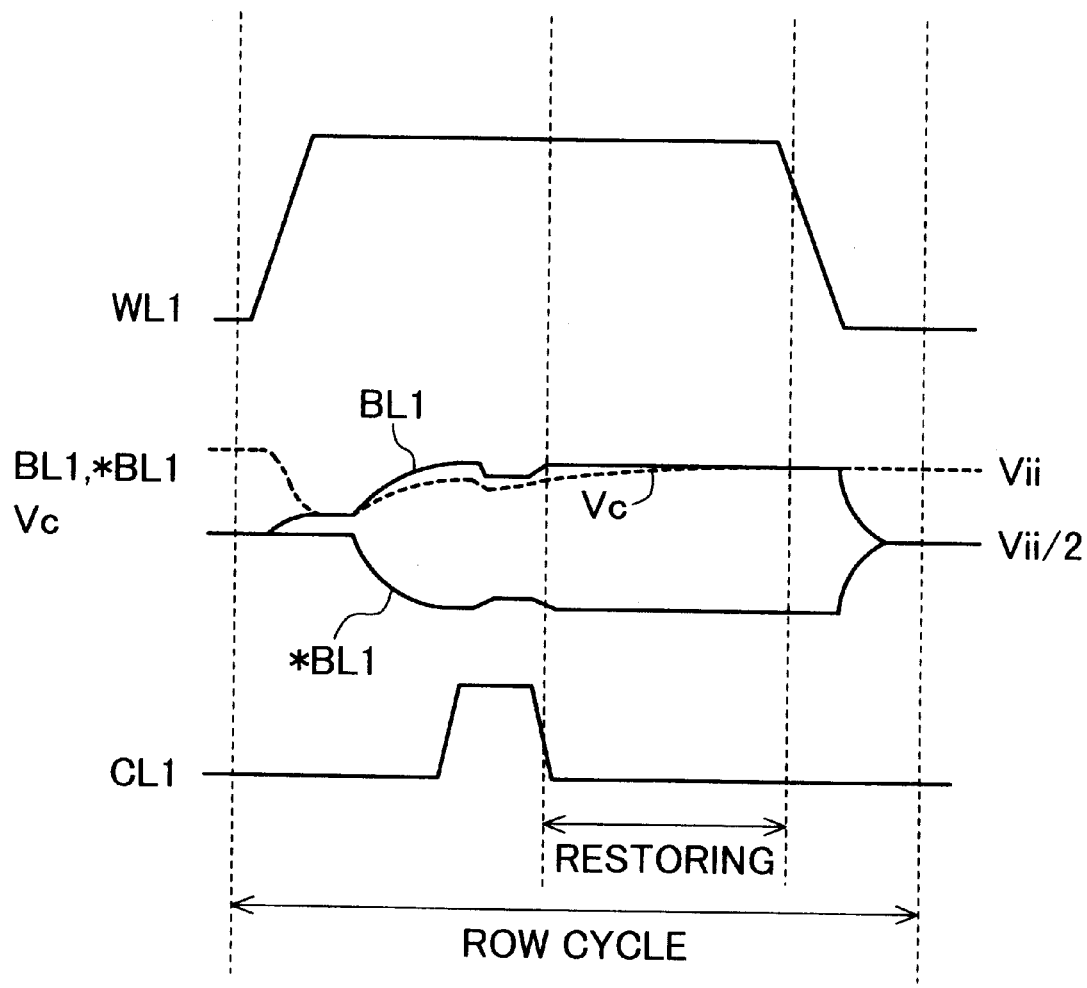
FIG. 34 is a timing chart showing a read operation of the circuit in FIG. 33.

FIG. 7 shows a circuit of the first embodiment according to the present invention, which corresponds to FIG. 33.

The circuit is different from the circuit of FIG. 33 in that a buffer memory cell circuit 18 is connected between the wirings SA and *SA. The circuit 18 is provided with buffer memory cell circuits 181 and 182, each of which is of the same construction. The buffer memory cell circuit 181 is a complementary type in order to comparatively increase a read potential difference, wherein memory cells 18a and 18b of the same construction as that of the memory cell 12 are, respectively, connected to the wirings SA and *SA, and the gate electrodes of the respective transfer gate electrodes of the memory cells 18a and 18b are connected to the word line BWL1. As regards the buffer memory cell circuit 182, the memory cells 18c and 18d are, respectively, connected to the wirings SA and *SA, and the gate electrodes of the respective transfer gate electrodes of the memory cells 18c and 18d are connected to the word line BWL2.

When accessing data for a memory cell, data amplified by a CMOS sense amplifier 15 is temporarily stored in the buffer memory cell circuit 181 or 182 in the vicinity thereof, and the data access is completed without restoring the data into the memory cell for which the destructive read is carried out, whereby the row cycle time is shortened. Then the data stored in the buffer memory cell circuit 18 is restored in a memory cell in free time, for example, in a period during which the memory cell block, bank or chip is not selected, or in a refresh time. The control for the circuit of FIG. 7 is carried out by a control circuit 27.

Next, a description will be given of operations of the circuit in a case where the bit line reset potential Vrst1 is at Vii/2.

(1) Read Operation

Figure 8:
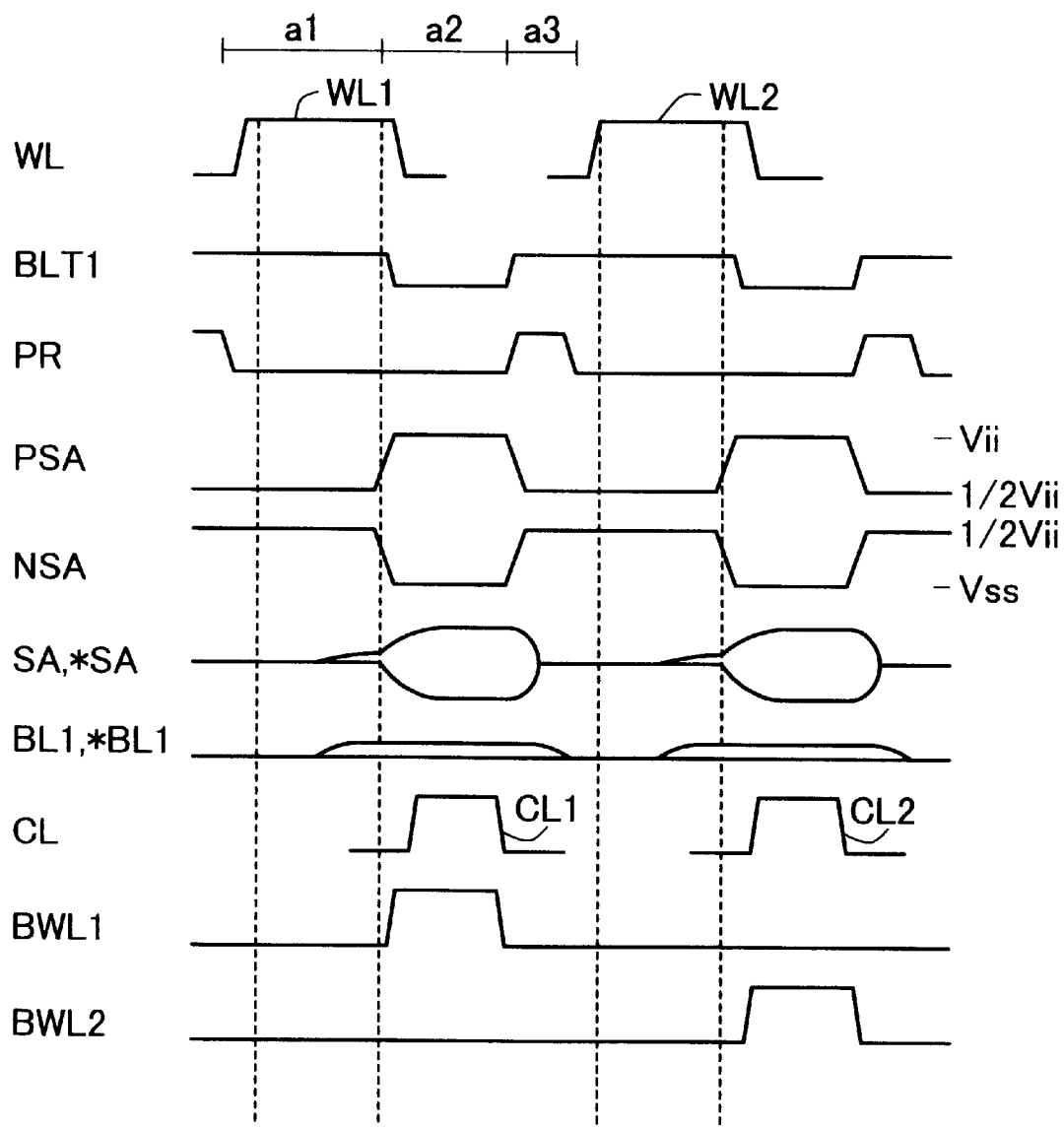
FIG. 8 is a timing chart showing read operations of a circuit in FIG. 7.

FIG. 8 shows operations of successively reading data from the memory cells 12 and 13 in the circuit of FIG. 7.

Initially, it is assumed that the stored content of the buffer memory cells 181 and 182 is null (empty).

In the initial state, a gate control signal BLT1 is high, whereby transfer gates 10 and 11 are on, and all of the wirings BL1, SA, *BL1 and *SA are precharged at the potential Vii/2, and the drive signals PSA and NSA of a CMOS sense amplifier 15 are at the potential Vii/2.

(a1) In this state, the precharge signal PR is made low, whereby NMOS transistors 141 through 143 are turned off. A row address is changed to cause the potential of word line WL1 to rise, whereby the transfer gate 122 of the memory cell 12 is turned on, and a small potential difference about 200 mV arises between the bit lines BL1 and *BL1 due to movement of the electric charge between a capacitor 121 and the bit line B11.

(a2) The potential of the drive signal PSA is made to Vii, and that of the drive signal NSA is made to Vss to activate the CMOS sense amplifier 15. Thereby, the small potential difference between the wirings SA and *SA is amplified.

Since no restoring operation is carried out in the read cycle, the gate control signal BLT1 and word line WL1 are made low, whereby the transfer gates 10, 11 and 122 are turned off. Therefore, the bit lines BL1 and *BL1 are separated from the wirings SA and *SA, and the output load of the CMOS sense amplifier 15 becomes small, whereby its amplification operation becomes fast.

The word line BWL1 is made high to begin storing in the memory cells 18a and 18b.

The column selection signal CL1 is made high to turn on column gates 16 and 17, whereby data are read out on the data bus lines DB and *DB.

(a3) The word line BWL1 is made low to hold the data stored in the memory cells 18a and 18b. Further, the column selection signal CL1 is made low to turn off the column gates 16 and 17.

A reset operation is carried out for the bit line potential. That is, the potentials of the drive signals PSA and NSA each are made to Vii/2 to inactivate the CMOS sense amplifier 15, and the precharge signal PR and gate control signal BLT1 are made high to precharge the wirings BL1, SA, *BL1 and *SA at the potential Vii/2.

Since the bit lines BL1 and *BL1 are precharged from the vicinity of the potential Vii/2, its time is shortened.

For example, the row cycle which was 40 ns in the prior art can be shortened to 20 ns by such operations.

(2) Write Operation

Figure 9:
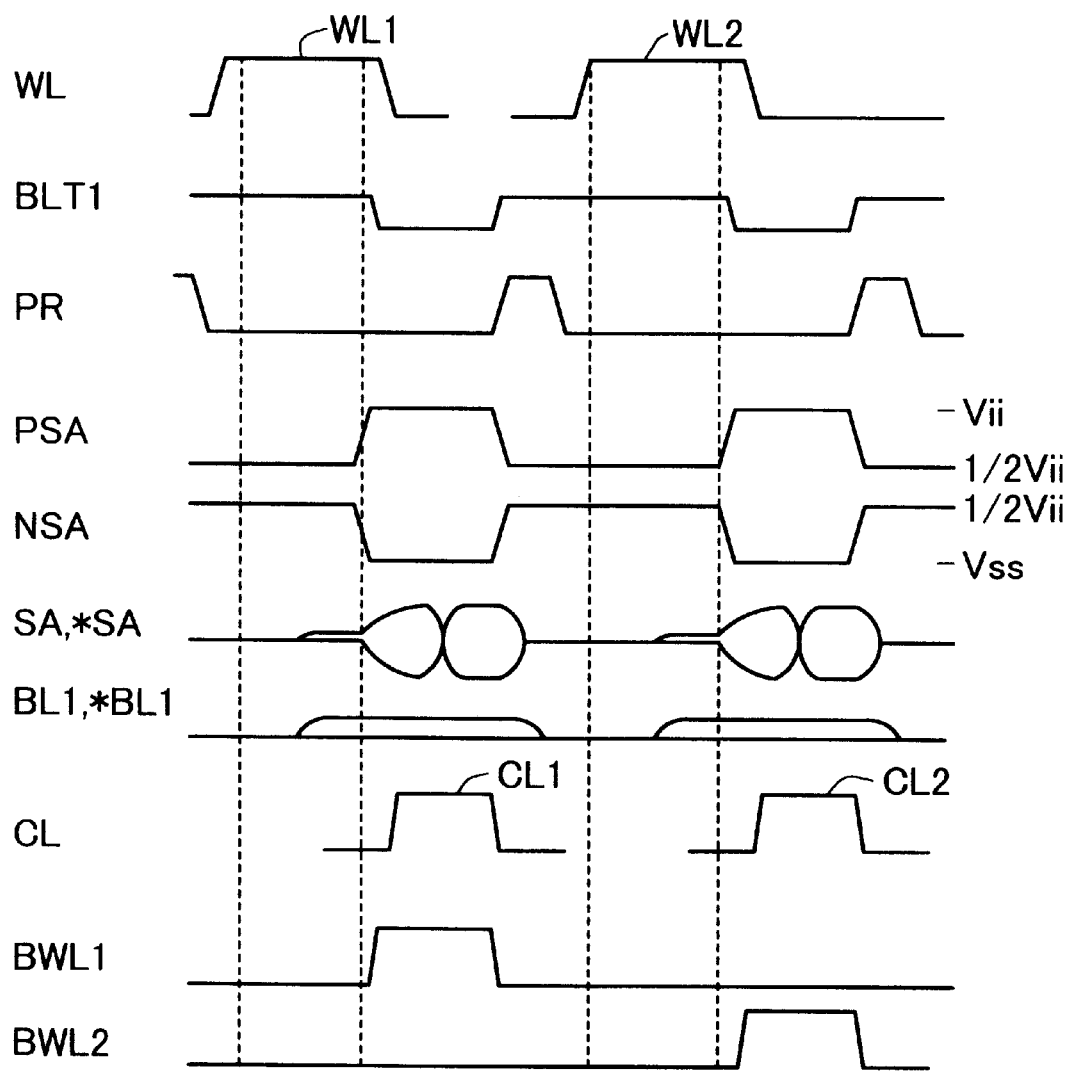
FIG. 9 is a timing chart showing write operations of a circuit in FIG. 7.

FIG. 9 shows an operation of successively storing into the memory cells 12 and 13 of the circuit of FIG. 7, and the control for the circuit is the same as that of above read, excepting that part of the operation timings differs. In a case where the content of buffer memory cells 181 and 182 are null, the data on the wirings SA and *SA and in the buffer memory cell circuit 181 are overwritten by the data on the data buss lines DB and *DB after the column selection signal CL1 is made high.

(3) Restore Operation

Figure 10:
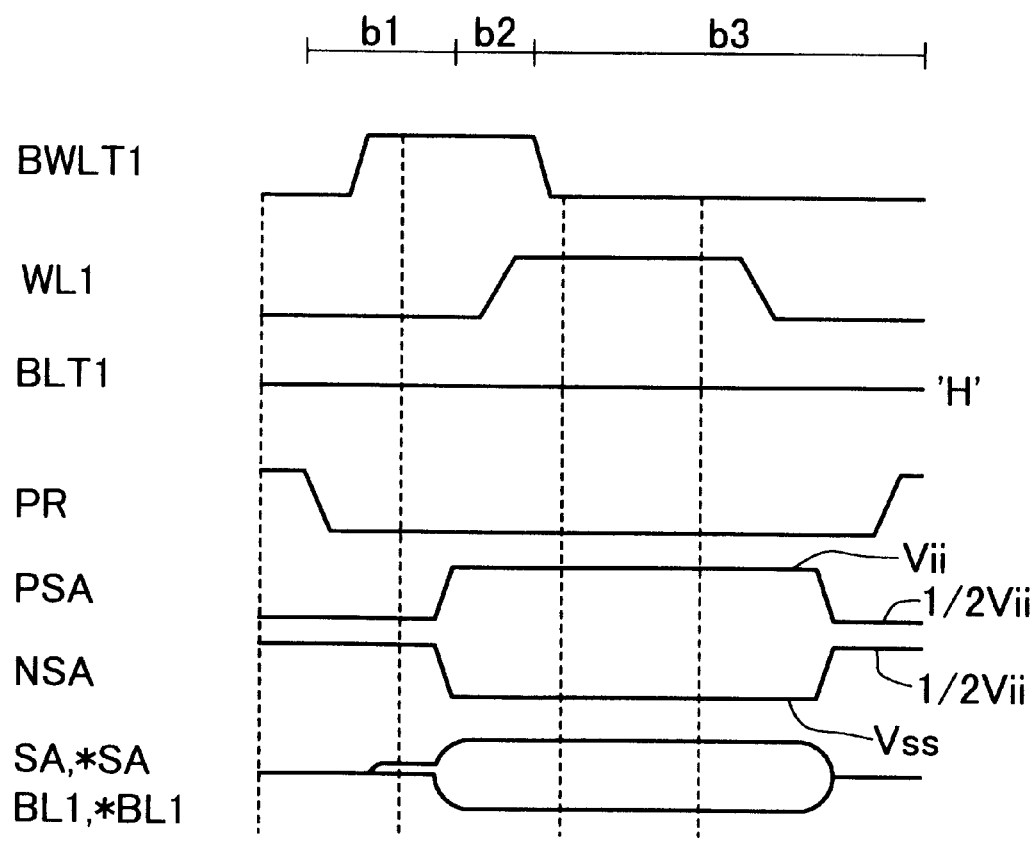
FIG. 10 is a timing chart showing a restoring operation of a circuit in FIG. 7.

FIG. 10 shows a restoring operation of the circuit of FIG. 7. Next, a description will be given of a case where the content of the buffer memory cell circuit 181 is restored in the memory cell 12.

The restoring operation is started from the same state as the initial state of the above read operation.

(b1) The precharge signal PR is made low and the word line BWL1 is made high to read the data in the memory cells 18a and 18b out onto the wirings SA and *SA, whereby a small potential difference about 200 mV arises between the bit lines BL1 and *BL1.

(b2) The potential of the drive signal PSA is made to Vii and that of the drive signal NSA is made to Vss to activate the CMOS sense amplifier 15, whereby a small potential difference between the bit lines BL1 and *BL1 is amplified.

The row address is changed to rise the potential of the word line WL1, whereby the transfer gate 122 of the memory cell 12 is turned on, and restoring into the memory cell 12 is started. The word line BWL1 is made row.

(b3) The word line WL1 is made low to hold the data restored in the memory cell 12.

The operation which is the same as the resetting operation of the bit line potential in the above-described (a3) is carried out.

FIG. 1 shows a schematic construction of the circuit concerning row address of a DRAM including the circuit of FIG. 7. In this circuit, the above restoring operation is carried out while the memory cell block is not selected. FIG. 1 shows only two memory cell blocks 191 and 192 each having only 4×2 cell array for simplification.

In the row address RA held in the row address register 20, for example, the five higher-order bits are divided into two groups consisting of 2 bits and 3 bits and are respectively decoded by a block predecoder 21 having an output of (4+8) bits and the output are provided into a block decoder 23 equipped with respect to each of the memory cell blocks 191 and 192. For example, the eight lower-order bits are divided into three groups consisting of 2 bits, 3 bits and 3 bits and are decoded, respectively, by a word predecoder 22 having an output WA of (8+8+4) bits and the output WA is provided to a restoring circuit 24 equipped with respect to each of the memory cell blocks 191 and 192.

The block decoder 23 consists of, for example, AND gates, and provide the restoring circuit 24 with a block selection signal BS1 which is '1' when the memory cell block 191 is selected.

All the bits of the output of the row address register 20 are provided to an address transition detecting circuit 25 which generates a pulse whenever the row address transits and provides the restoring circuit 24 with it as a signal AT.

The restoring circuit 24 stores a signal WA in response to a pulse of the signal AT when the memory cell block 191 is selected, that is, the block selection signal BS1 is '1', and at the same time provides it to the word decoder 26 as a signal WX. Thereby, for example, the word line WL1 is selected and the data of the memory cell 12 is read as described above. In a case of read, a pulse is provided on the word line BWL1 to store the read data into the buffer memory cell circuit 18. The column address is decoded by a column decoder (not illustrated), and the column gates 16 and 17 are turned on, whereby in a case of read, the data on the wirings SA and *SA is transmitted onto the data bus lines DB and *DB, and in a case of write, the data on the data bus lines DB and *DB is transmitted onto the wirings SA and *SA, and is stored into the buffer memory cell circuit 18. Thus, an access to the memory cell 12 is completed without executing a restoring operation into the memory cell 12.

The restoring circuit 24 causes the above-described restoring operation to be executed in parallel to the access to a selected memory cell block, in response to a pulse of the signal AT when the memory cell block 191 is not selected, that is, when the block selection signal BS1 is '0'. Namely, for example, a pulse is provided onto the word line BWL1, the data held in the buffer memory cell circuit 18 are read onto the wirings SA and *SA, the row address stored in the restoring circuit 24 is provided to the word decoder 26 as the signal WX, and the word line WL1 is selected, and a restoring for the memory cell 12 is carried out.

Figure 2:
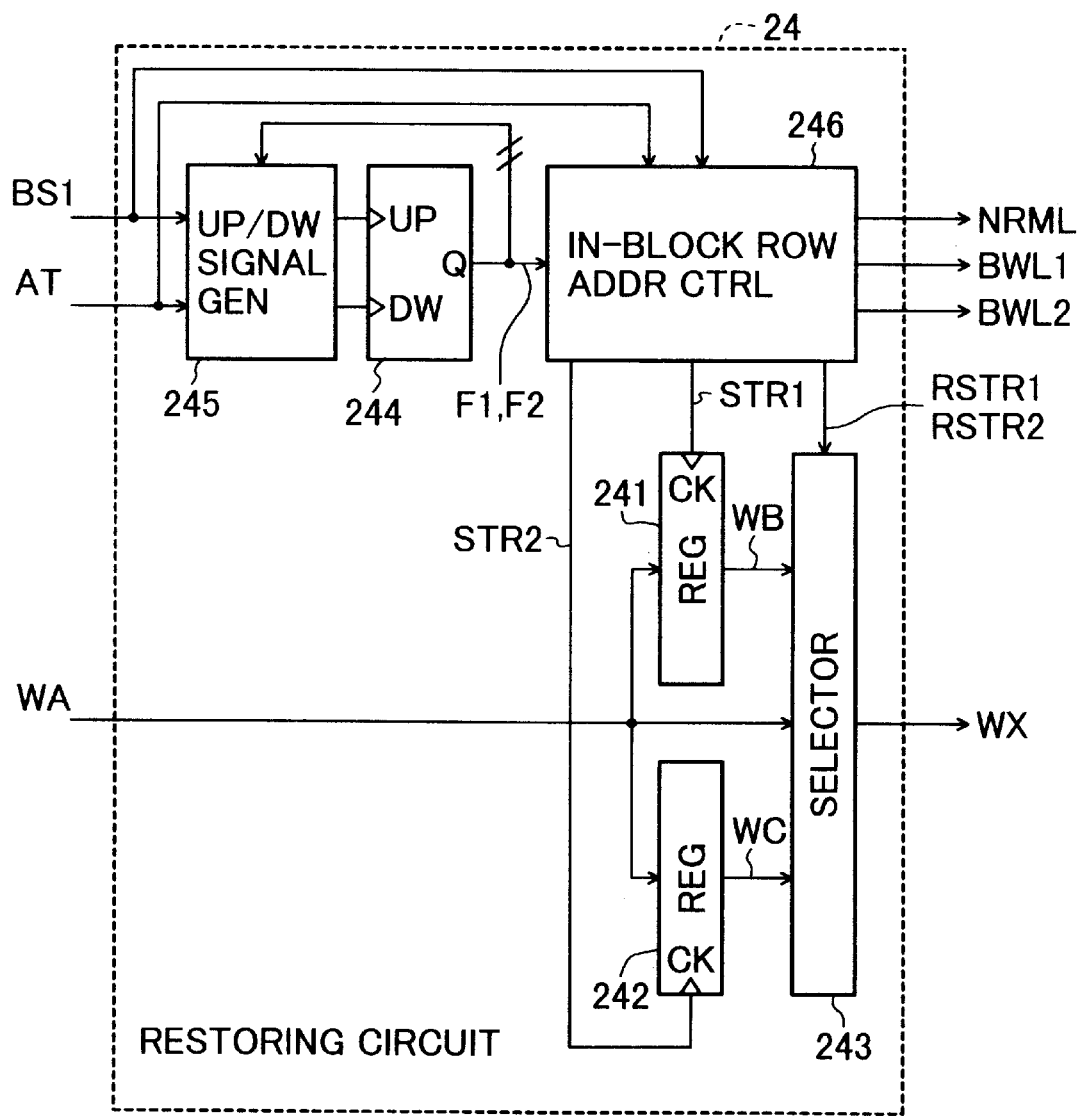
FIG. 2 is a block diagram showing an embodiment of a restoring circuit in FIG. 1.

FIG. 2 shows an embodiment of the restoring circuit 24 in FIG. 1.

The signals WA are provided into registers 241, 242 and a selector 243, and the outputs WB and WC of the registers 241 and 242 are provided into a selector 243. A latch state of the registers 241 and 242 corresponds to a count of a counter 244.

That is, count 0 denotes that the contents of the registers 241 and 242 are null (empty) and that the register 241 is able to hold a signal WA. In this state, when the signal WA is held in the register 241, the count becomes 1 and it denotes that the content of the register 241 is effective and able to be read, and the content of the register 242 is null and a signal WA is able to be held in the register 242. In this state, when the signal WA is held in the register 242, the count becomes 2 and it denotes that the contents of the registers 241 and 242 are effective, firstly data can be read from the register 242, and restoring can not be omitted when accessing the memory device. In this state, the count becomes 1 when WC is selected by the selector 243 as the signal WX, and in this state the count becomes 0 when WB is selected by the selector 243 as the signal WX.

A counter 244 counts up UP-pulses coming from the UP/DW signal generating circuit 245 and counts down DW-pulses therefrom. The UP/DW signal generating circuit 245 generates an UP pulse or a DOWN pulse based on the count of the counter 244, the block selection signal BS1 and the row address transition detecting signal AT. That is, an UP pulse is generated in response to a pulse of the signal AT unless the count is 2 when the block selection signal BS1 is '1', and a DOWN pulse is generated in response to a pulse of the signal AT unless the count is '0' when the block selection signal BS1 is '0'.

Figure 3:
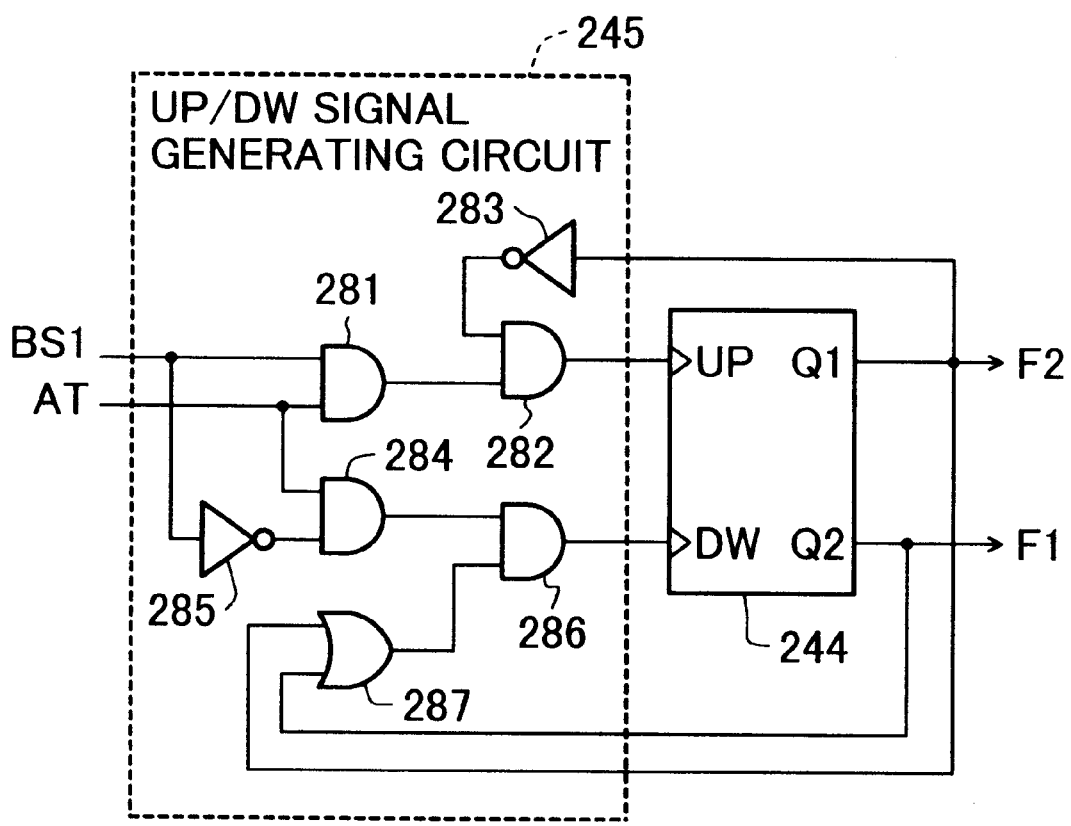
FIG. 3 is a diagram showing an embodiment of an UP/DW signal generating circuit in FIG. 2 together with a counter.

FIG. 3 shows an embodiment of the UP/DW signal generating circuit 245 in FIG. 2 together with the counter 244.

The block selection signal BS1 and row address transition detecting signal AT are provided to an AND gate 281, and the output thereof is provided to one input of an AND gate 282. To the other input of the AND gate 282 via an inverter 283 the higher-order bit output Q1 of the counter 244 is provided as F2. Thereby, an UP pulse is provided to the counter 244 in response to a pulse of the signal AT unless the count is '2' when the block selection signal BS1 is '1'.

To an AND gate 284 the block selection signal BS1 through an inverter 285 and the signal AT are provided, and the output thereof is provided to one input of an AND gate 286. To the other input of the AND gate 286 the output of an OR gate 287, which receives F2 and F1 from the outputs Q1 and Q0 of the counter 244, is provided. Thereby, a DOWN pulse is provided from the AND gate 286 to the counter 244 in response to a pulse of the signal AT unless the count is '0' when the block selection signal BS1 is '0'.

Now, referring back to FIG. 2, a in-block row address control circuit 246 controls latching of the registers 241 and 242 based on the count of the counter 244, the block selection signal BS1 and signal AT, controls the selection of the sector 243, and generates a signal NRML and word selection signals BWL1 and BWL2 for buffer cells. The latching and selection control are carried out as below.

That is, when the block selection signal BS1 is '1', in response to a pulse of the signal AT, the in-block row address control circuit 246 causes the selector 243 to select the signal WA without depending on the count. If BS1 is '1' and the count is '0', in response to a pulse of the signal AT the in-block row address control circuit 246 provides a store signal STR1 to the clock input CK of the register 241 to hold the signal WA in the register 241. If BS1 is '1' and the count is '1', in response to a pulse of the signal AT the in-block row address control circuit 246 provides a store signal STR2 to the clock input CK of the register 242 to hold the signal WA in the register 242. If BS1 is '1' and the count is '2', in response to a pulse of the signal AT, the in-block row address control circuit 246 make the signal NRML active. The control circuit 27 in FIG. 1 carries out an access control which makes a restoring operation as in prior art in a memory access cycle for a selected memory cell block in response to the activated signal NRML without selecting buffer memory cell circuits. When the block selection signal BS1 is '0', in response to a pulse of the signal AT, the in-block row address control circuit 246 causes the selector 243 to select WB with providing a pulse of a restoring signal RSTR1 if the count is '1', and to select WC with providing a pulse of a restoring signal RSTR2 if the count is '2'. If BS1 is '1' and the count is '0', the in-block row address control circuit 246 does nothing.

Figure 4:
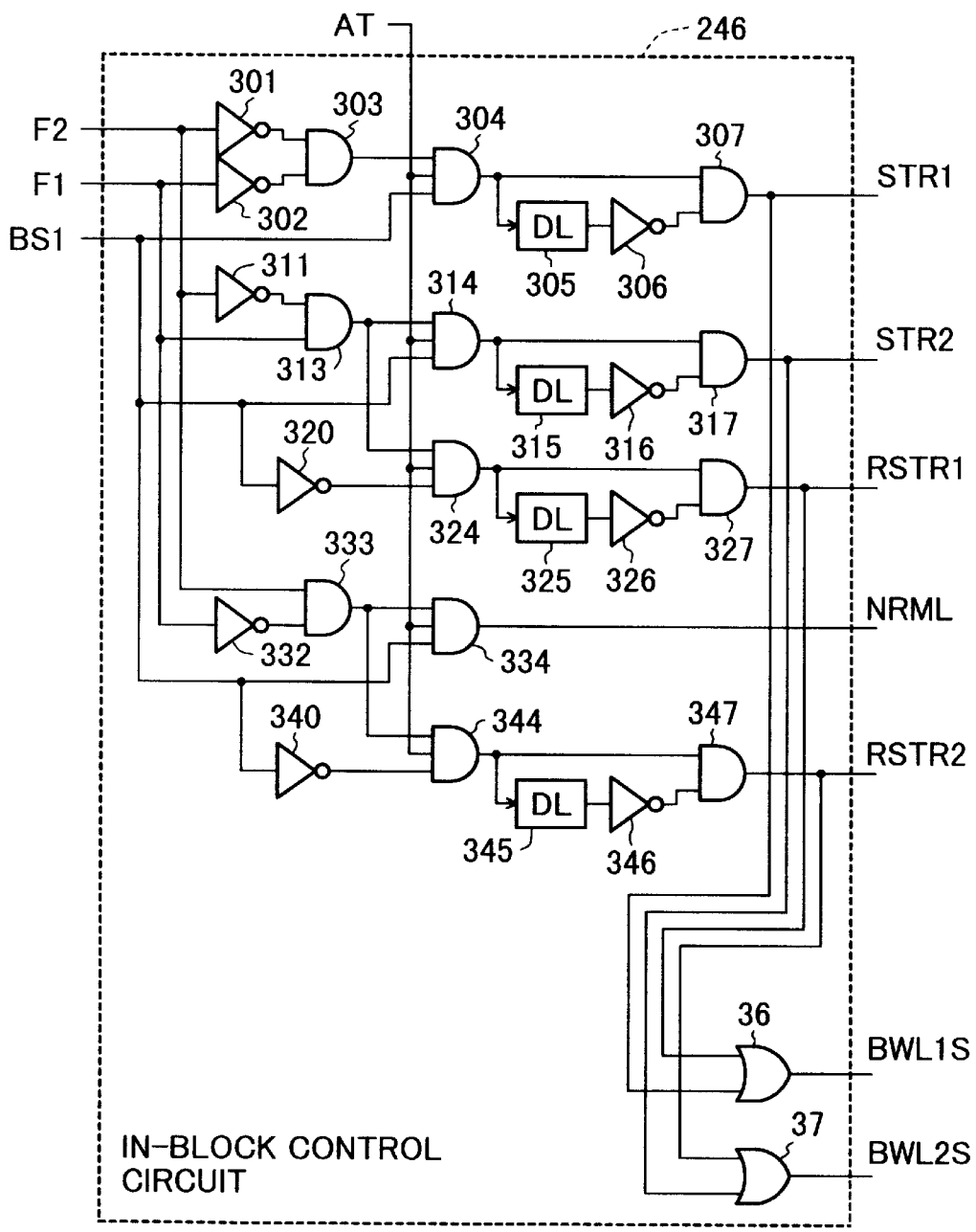
FIG. 4 is a diagram showing an embodiment of an in-block row address control circuit in FIG. 2.

FIG. 4 shows an embodiment of an in-block row address control circuit 246 in FIG. 2.

Signals F2 and F1 are provided through inverters 301 and 302 to an AND gate 303. The output of the AND gate 303, the block selection signal BS1 and the row address transition detecting signal AT are provided to an AND gate 304. The output of the AND gate 304 is provided to an AND gate 307 directly and via a delay circuit 305 and an inverter 306. Thereby, when a memory cell block 191 is selected (BS1= '1') and the count is '0' (F1=F2='0'), in response to a pulse of the signal AT a pulse having a width equal to the delay time of the delay circuit 305 is outputted from the AND gate 307 as the store signal STR1.

Signals F2 and F1 are provided through inverters 311 and directly, respectively, to an AND gate 313. The output of the AND gate 313, the block selection signal BS1 and the row address transition detecting signal AT are provided to an AND gate 314. The output of the AND gate 314 is provided to an AND gate 317 directly and via a delay circuit 315 and an inverter 316. Thereby, when a memory cell block 191 is selected (BS1='1') and the count is '1' (F1='1' and F2='0'), in response to a pulse of the signal AT a pulse having a width equal to the delay time of the delay circuit 315 is outputted from the AND gate 317 as the store signal STR2.

The output of the AND gate 313, the block selection signal BS1 and the signal AT are provided to an AND gate 324 directly, through an inverter 320 and directly, respectively. The output of the AND gate 324 is provided to an AND gate 327 directly and via a delay circuit 325 and an inverter 326. Thereby, when a memory cell block 191 is not selected (BS1='0') and the count is '1' (F1='1' and F2='0'), in response to a pulse of the signal AT a pulse having a width equal to the delay time of the delay circuit 325 is outputted from the AND gate 327 as the restoring signal RSTR1.

The signal F1 and F2 are provided to an AND gate 333 via an inverter 322 and directly, respectively. The output of the AND gate 333, the block selection signal BS1 and the signal AT are provided to an AND gate 334. Thereby, a pulse of the signal AT is outputted as the signal NRMAL from an AND gate 334 when the memory cell block 191 is selected and the count is '2' (F1='0' and F2='1').

The output of the AND gate 333, the block selection signal BS1 and signal AT are provided to an AND gate 344 directly, via an inverter 340 and directly, respectively. The output of the AND gate 344 is provided to an AND gate 347 directly and via a delay circuit 345 and an inverter 346. Thereby, a pulse having a width equal to the delay time of the delay circuit 345 is outputted from the AND gate 347 as the restoring signal RSTR2 in response to a pulse of the signal AT when the memory cell block 191 is not selected and the count is '2'.

The store signal STR1 and restoring signal RSTR1 are provided to an OR gate 36, and when at least one of these signals is '1', a signal BWLLS for generating the signal to select the buffer word line BWL1, which is the output of the OR gate 36, becomes '1'. The store signal STR2 and restoring signal RSTR2 are provided to an OR gate 37, and when at least one of these signals is '1', a signal BWL2S for generating the signal to select the buffer word line BWL2, which is an output of the OR gate 37, becomes '1'. The signals to select the buffer word lines BWL1 and BWL2 are generated, relating to the operations shown in FIG. 8 through FIG. 10, by a circuit (not illustrated) using the signals BWL1S and BWL2S and delay circuits.

Figure 5:
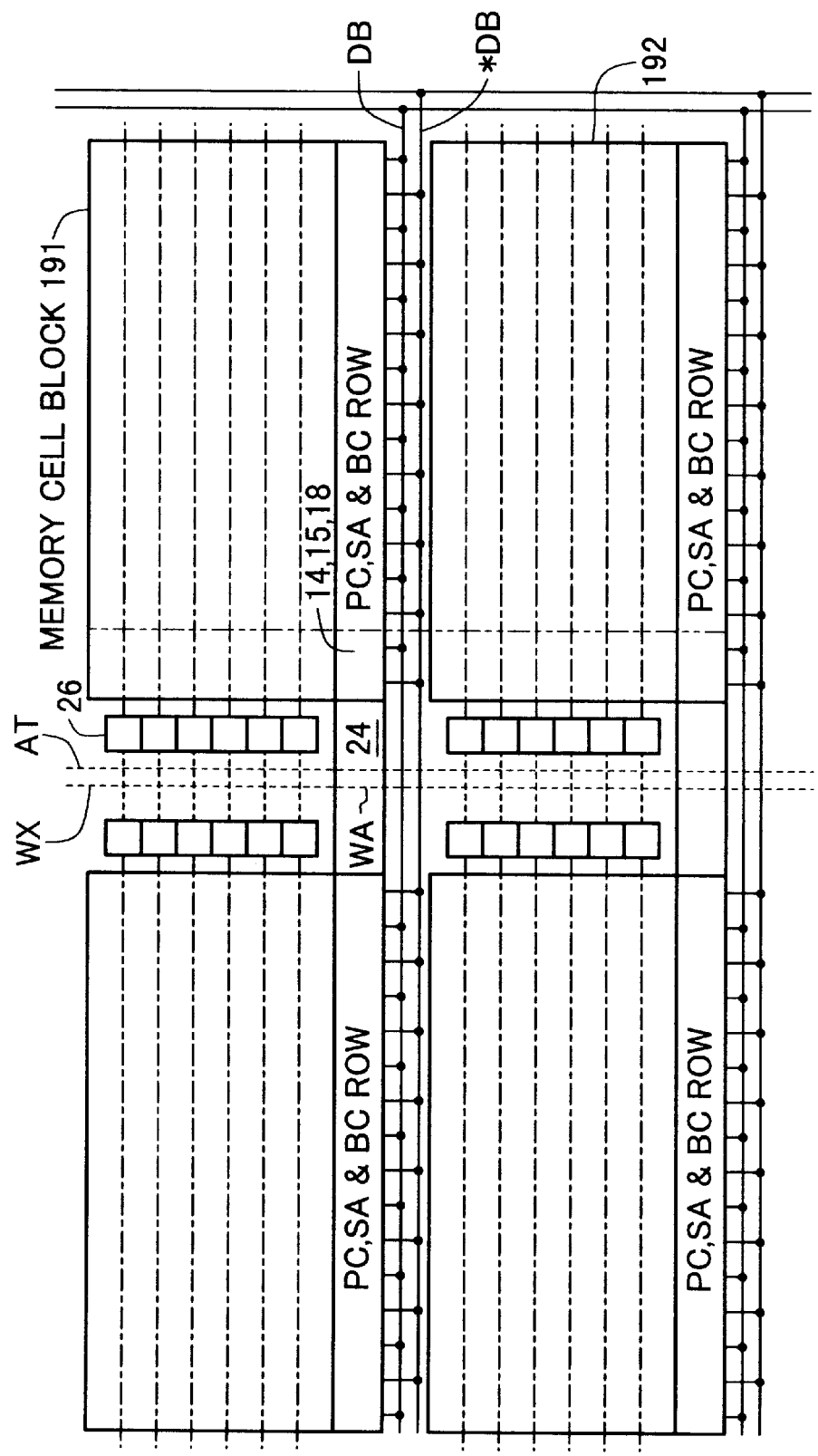
FIG. 5 is a layout view of a memory cell array and its peripheral circuits in the DRAM.

FIG. 5 is a layout view of a memory cell array and its peripheral circuits. In FIG. 5, the same reference characters corresponding to the same components in FIG. 1 are used. A word decoder 26 and signal lines of WX and AT are disposed in an area between the adjacent memory cell blocks. The restoring circuit 24 is disposed between the adjacent blocks of a precharge circuit 14 with an equalizer, CMOS sense amplifier 15 and buffer memory cell 18, which correspond to the memory cell block.

Figure 6:
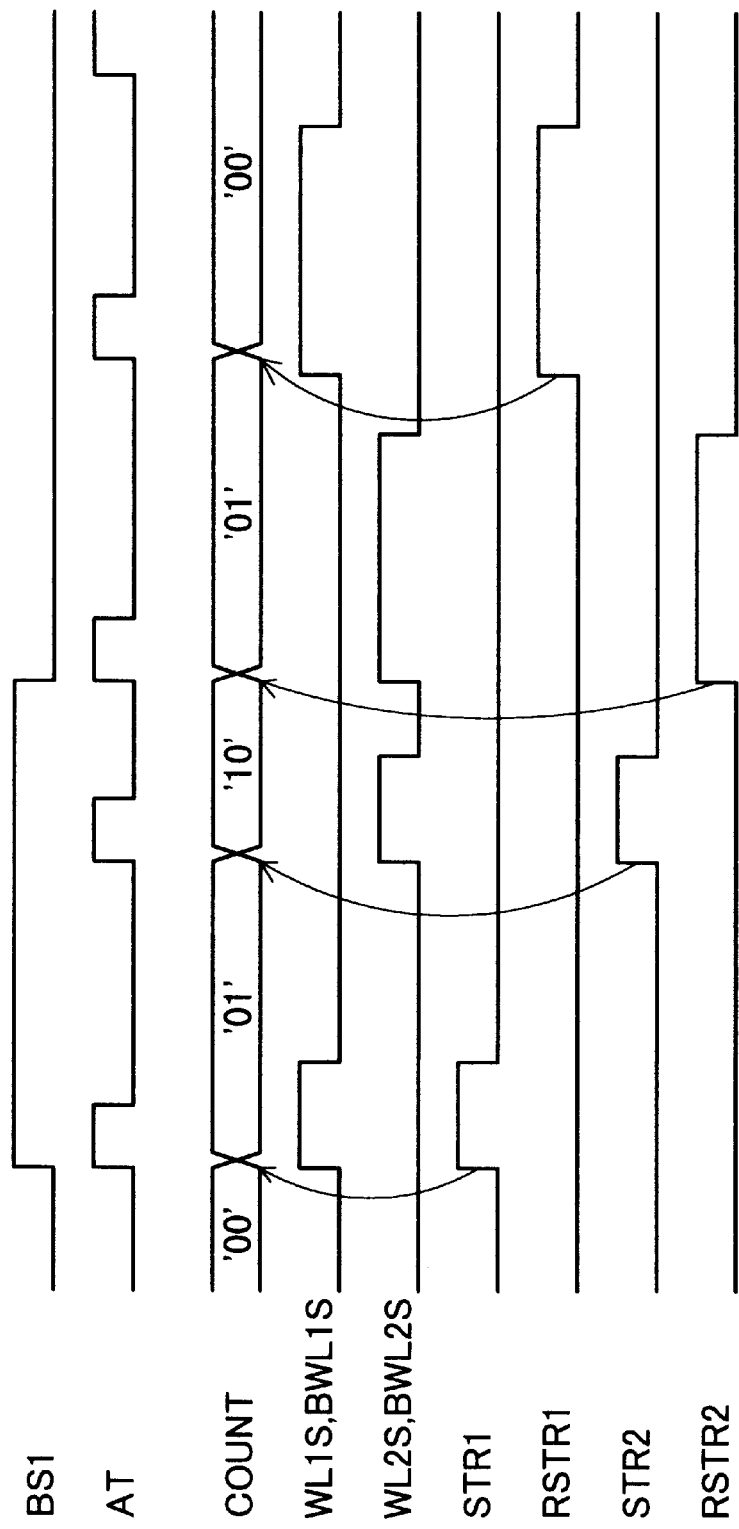
FIG. 6 is a schematic timing chart showing operations regarding one memory cell block.

Next, referring to a schematic timing chart of FIG. 6, a description will be given of operations relating to the memory cell block 191 in a case where access is successively made to memory cells 12 and 13 of the memory cell block 191 in FIG. 1 and access is successively made to the memory cell block 192. Signals WL1S, BWL1S, WL2S and BWL2S in FIG. 6 are ones before adjusting the timing and for selecting word lines WL1, BWL1, WL2, and BWL2, respectively.

Initially, it is assumed that the count of the counter 244 is a binary number '00'.

When a row address RA transits (BS1 is changed high) in order to make an access to the memory cell 12 in FIG. 7, a pulse of the signal AT is generated. Thereby, an UP pulse is generated at the UP/DW signal generating circuit 245 to cause the count of the counter 244 to become '01'. Simultaneously, the signal WA is held in the register 241 in response to a pulse of the signal STR1, and the signal WA is selected by the selector 243. Next, the potential of the word line WL1 is caused to rise, and a small potential difference between the wirings SA and *SA is amplified by the CMOS sense amplifier 15. Then, the potential of the word line BWL1 is caused to rise, and data are stored in the buffer memory cell circuit 181. The bit lines BL1 and *BL1 are precharged (reset) at the potential Vii/2 without performing restoring to the memory cell 12.

Next, a row address RA transits (BS1 maintains high) in order to make an access to a memory cell 13 in FIG. 7, thereby as in the above, the count becomes '10' in response to a pulse of the signal AT, the signal WA is held in the register 242 in response to a pulse of the signal STR2, the content of the memory cell 13 is stored in the buffer memory cell circuit 182, and the bit line resetting operation is carried out without restoring to the memory cell 13.

Next, a row address RA transits (BS1 is changed low) in order to make an access to the memory cell block 192, whereby a pulse of the signal AT is generated. A down pulse is generated by the UP/DW signal generating circuit 245, and the count of the counter 244 becomes '01'. Simultaneously, WC is selected by the selector 243 in response to a pulse of the signal RSTR2. The potential of the word line BWL2 is caused to rise, and a small potential difference between the wirings SA and *SA is amplified by the CMOS sense amplifier 15. Then, the potential of the word line WL2 is caused to rise, and the data of the buffer memory cell circuit 182 is restored in the memory cell 13. Next, the bit line resetting operation is performed.

Next, the row address RA transits (BS1 maintains row) in order to make an access to the memory cell block 192, as in the above, the count becomes '00' in response to a pulse of the signal AT, WB is selected by the selector 243 in response to a pulse of the signal RSTR1 and the data of the buffer memory cell circuit 181 is restored in the memory cell 12. Next, the bit line resetting operation is carried out.

According to the first embodiment, since restoring operations are carried out in the non-selected memory cell block while other memory cell block is selected with making an access thereto, the time until the omitted restoring is carried out after the restoring has been omitted becomes shorter than in a case where the restoring is carried out while a bank or a chip is not selected as described later, and the efficiency of utilization of the buffer memory cell can be improved.

Further, since the registers 241, 242 and selector 243 of FIG. 2 are equipped at the preceding stage of the word decoder 26 of FIG. 1, it is not necessary to lay a long restoring address line along the access address line in order to carry out restoring in the non-selected memory cell block while other memory cell block is selected. Therefore, the construction is simplified.

Furthermore, since the storage and selection control of row addresses are carried out referring to the count of the UP/DWN counter 244, the construction thereof is simplified.

Modified Embodiment

Figure 11A:
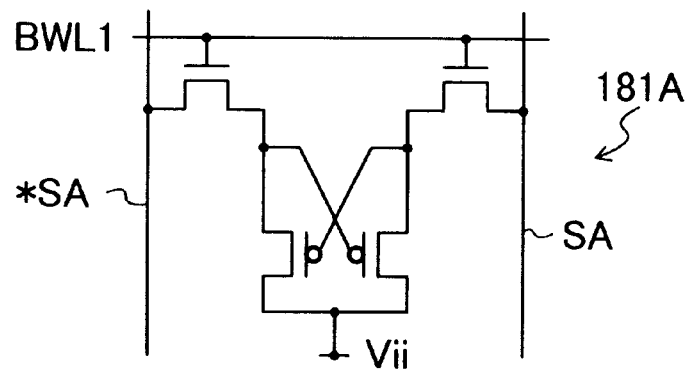
FIGS. 11(A) through 11(C) are circuit diagrams showing other buffer memory cells as modifications.
Figure 11B:
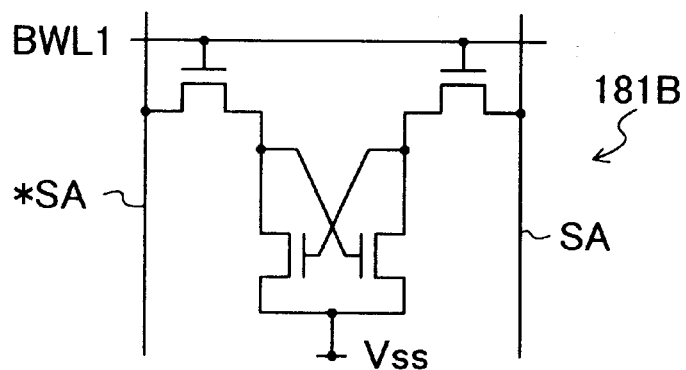
Figure 11C:
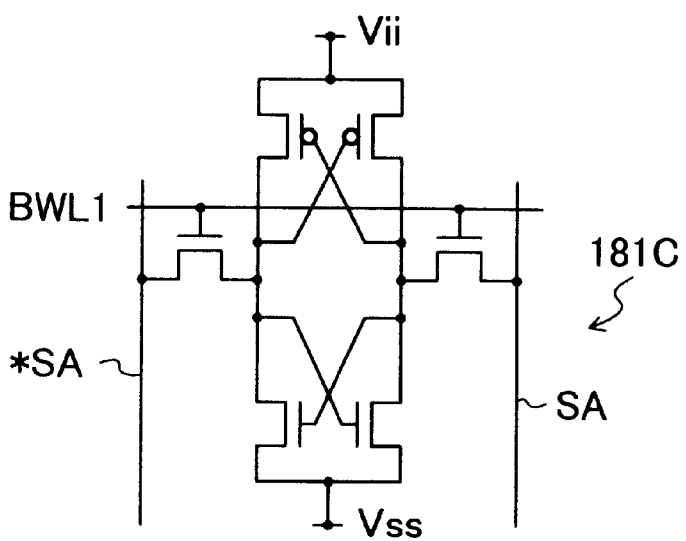

The buffer memory cell in FIG. 7 may utilize various kinds of memory cells, wherein only one of the cells 18a and 18b may be used as the buffer memory cell circuit 181. Furthermore, any one of buffer memory cells 181A through 18C of FIG. 11(A) through FIG. 11(C) may be used. The buffer memory cells 181A through 18C are such that a transfer gate is connected to a PMOS flip-flop, an NMOS flip-flop and a CMOS flip-flop each of which has been already well known as a memory cell.

Figure 12A:
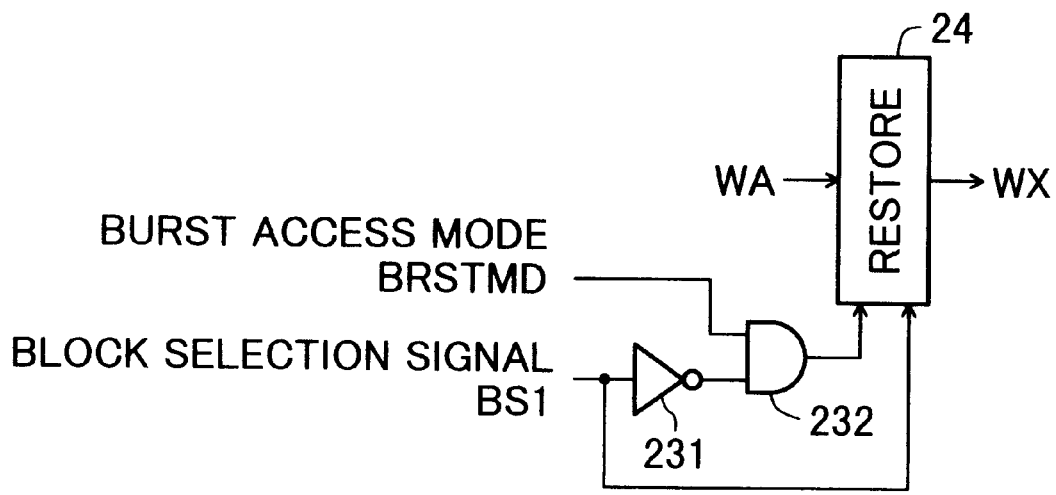
FIGS. 12(A) and 12(B) are diagrams showing a circuit corresponding to a part of FIG. 1 as modified first embodiment.

FIG. 12(A) shows another modified embodiment, which corresponds to a part in FIG. 1.

In a case where the restoring cycle time is longer than that of the read cycle or write cycle, a wait time is required when the same memory cell is accessed soon after the restoring cycle. Therefore, in this case, the signal made by inverting the block selection signal BS1 with an inverter 231 and a burst access mode signal BRSTMD are provided to the restoring circuit 24 via an AND gate 232 and the output of the AND gate 232 is used instead of the signal obtained by inverting the block selection signal BS1 in FIG. 3 and FIG. 4, whereby the restoring operation is carried out while a memory cell block is not selected and it is in the burst access mode.

Figure 12B:
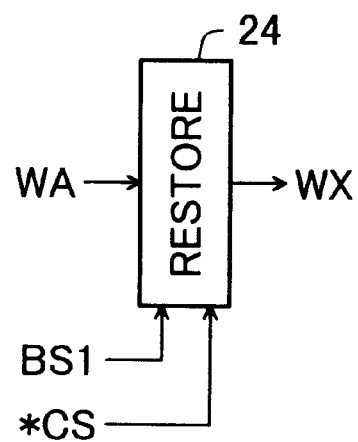

FIG. 12(B) shows still another modified embodiment of the first embodiment, which shows the circuit corresponding to a part of FIG. 1.

In this circuit, a chip selection signal *CS is provided to the restoring circuit 24 and this signal is used instead of the signal obtained by inverting the block selection signal BS1 in FIG. 3 and FIG. 4, wherein a restoring operation is carried out during the memory access is not carried out. In this case, there may be only one memory cell block in a DRAM.

Second Embodiment

Figure 13:
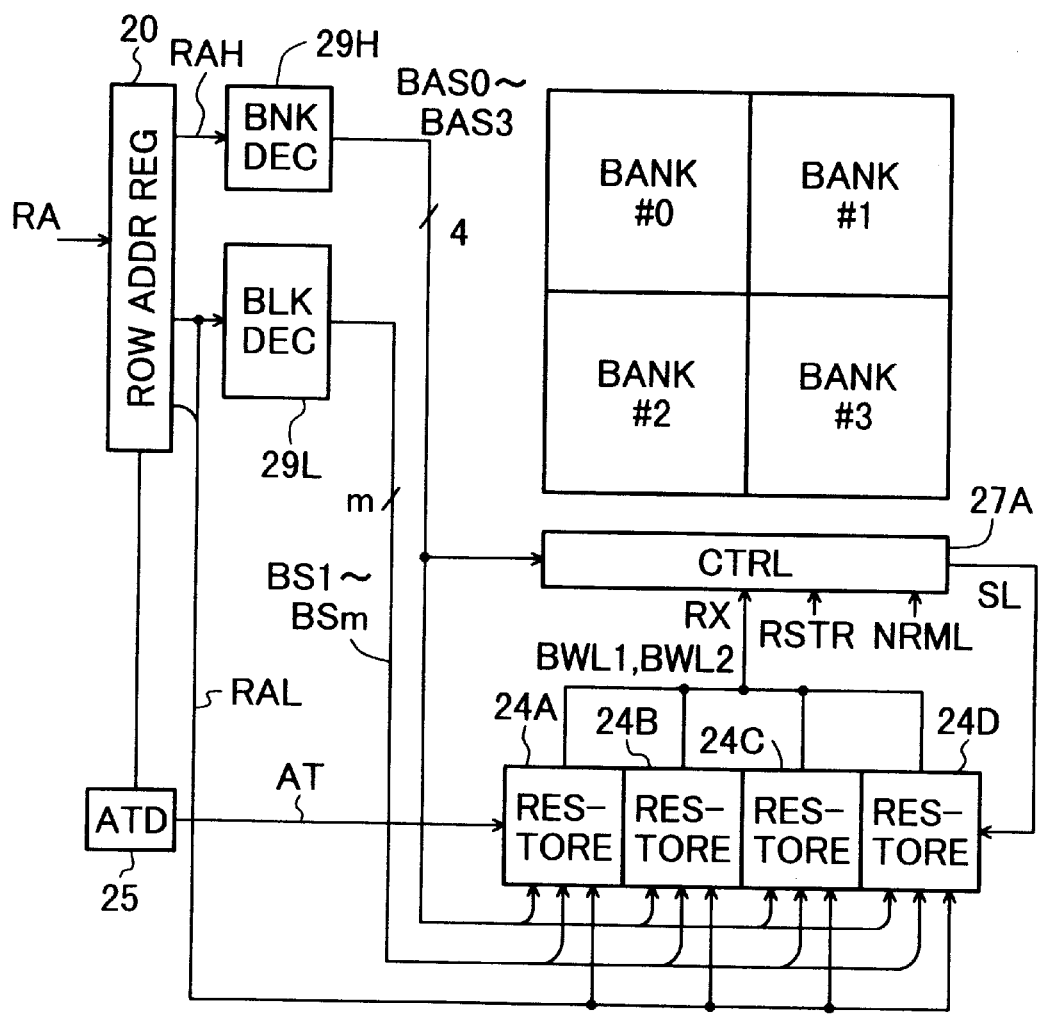
FIG. 13 is a block diagram showing a row address related circuit of a multi-bank type DRAM according to the second embodiment of the present invention.

Although in the first embodiment the restoring circuit 24 is disposed in the vicinity of the word decoder 26 with respect to the respective memory cell blocks, it is possible to collect and dispose the restoring circuits around the memory cell arrays. FIG. 13 shows a schematic construction of a row address related circuit of a multi-bank type DRAM in which the above is achieved.

The DRAM is provided with banks #0 through #3, and a non-selected bank carry out the restoring operation. A control circuit 27A provides a row address to one selected bank for accessing and at the same time a row address RX to a non-selected bank for restoring. The respective banks are provided with 'm' memory cell blocks, and each of the memory cell blocks is provided with two rows of buffer memory cells, wherein the first and second rows thereof can be, respectively, selected by word lines BWL1 and BWL2.

The DRAM is provided with restoring circuits 24A through 24D of the same construction with respect to banks #0 through #3 of the same construction.

Briefly explaining, for example, when accessing the bank #0, a word address RAL is stored in the restoring circuit 24A as a restoring address (an address to designate a memory cell block and a restoring row therein), and simultaneously a restoring circuit 24B is selected by a selection control signal SL from the control circuit 27A according to the priority order among the restoring circuits 24B through 24D corresponding to the non-selected banks, with the outputs of the restoring circuits 24A, 24C and 24D being turned to a high impedance state. Simultaneously, one of the restoring addresses stored in the restoring circuit 24B is selected and outputted as a restoring address RX. The control circuit 27A causes the memory cell row, which is selected by the restoring address RX having also the memory cell block address in the bank #1, to perform a restoring operation.

The two higher-order bits RAH of the row address RA held in the row address register 20 are decoded by a bank decoder 29H to generate bank selection signals BAS0 through BAS3 which are provided to each of the control circuit 27A and restoring circuits 24A through 24D. For each of j=0 through 3, bank #j is selected when BASj is '1'.

In the outputs of the row address register 20, the higher-order bit portion for selecting the memory cell block of the word addresses RAL, excluding RAH, is decoded by a block decoder 29L to generate block selection signals BS1 through BSm. The block selection signals BS1 through BSm and word address RAL are provided to each of the restoring circuits 24A through 24D. For each of i=1 through m, the i-th memory block in the selected bank is selected when the block selection signal BSi is '1'.

The address transition detecting circuit 25 outputs a pulse whenever the output of the row address register 20 transits, and the pulse is provided to the restoring circuits 24A through 24D as the signal AT.

Figure 14:
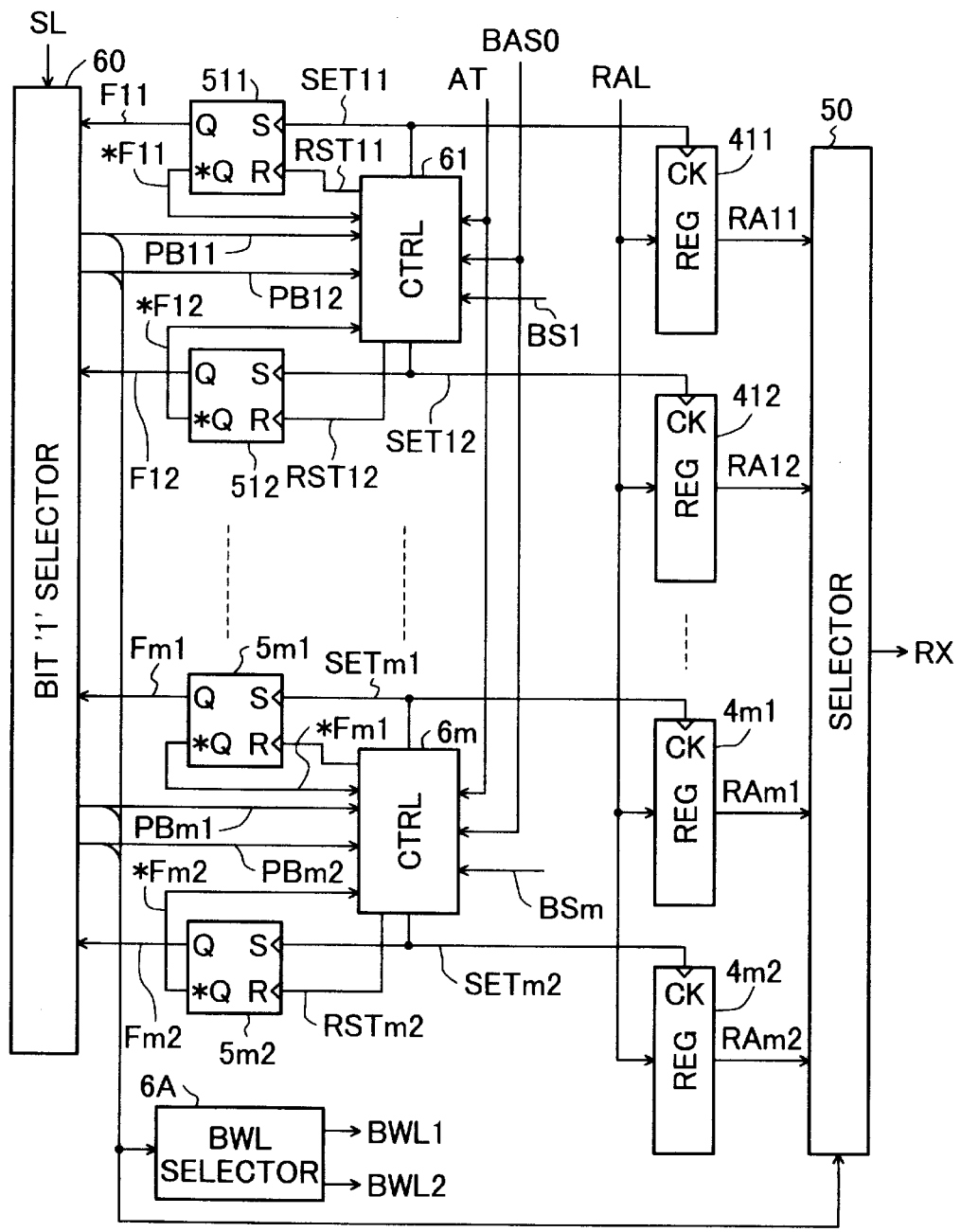
FIG. 14 is a diagram showing an embodiment of the restoring circuit in FIG. 13.

FIG. 14 shows an embodiment of the restoring circuit in FIG. 13.

Registers 411, 412, RS flip-flops 511, 512 and control circuit 61 correspond to the first memory cell block, and those of the same construction are equipped for each of the memory cell blocks. The registers 411, 412 and control circuit 61 correspond to the register 241, 242 and in-block row address control circuit 246 of FIG. 2, respectively. RS flip-flops 511 and 512 correspond to the lower-order bit and the higher-order bit of the counter 244 of FIG. 2, respectively.

That is, the restoring circuit 24A is provided with, for each of i=1 through m, registers 4i1 and 4i2 for temporarily storing the row address RAL, RS flip-flops 5i1 and 5i2 indicating whether the content of the registers 4i1 and 4i2 is effective or null, and a control circuit 6i which controls latching of the registers 4i1 and 4i2 and controls the state of the RS flip-flops 5i1 and 5i2.

Outputs RAi1 and RAi2 of the registers 4i1 and 4i2 are provided to a selector 50.

Effective flags Fi1 and Fi2 coming from non-inverted outputs Q of the RS flip-flops 5i1 and 5i2 are provided to a priority bit '1' selector 60. The selector 60 outputs priority bit selection signals PBi1 and PBi2 corresponding to the effective flaps Fi1 and Fi2, respectively, and provides them to the control circuit 6i. The priority bit '1' selector 60 selects one of '1' ('EFFECTIVE') bits of the input of 2 m bits according to the predetermined priority order, and sets only one output bit corresponding thereto to '1' (selected 'EFFECTIVE' flag) and all the other output bits to '0'. However, unless the priority bit '1' selector 60 is selected by the above-described selection control signal SL, all the output bits of the priority bit '1' selector 60 are made to '0'.

For example, in a case where m=2, denoting the input and output of the priority bit '1' selector as bit strings 'F11 F12 F21 F22' and 'PB11 PB12 PB21 PB22', respectively, the outputs for the inputs of the priority bit '1' selector 60 are as follows:

Input '1111'→Output '0100'

Input '1011'→Output '0001'

Input '1010'→Output '1000'

Input '0010'→Output '0010'

A selector 50 selects corresponding one of the outputs RA11 through RAm2 from the registers 411 through 4m2 in response to the output of the priority bit '1' selector 60, and outputs it as a restoring address RX. That is, when PBi1='1', the row address RAi1 is selected, and when PBi2='1', the row address RAi2 is selected.

The output of the priority bit '1' selector 60 is also provided to a BWL selection circuit 6A. By the circuit 6A, the word line BWL1 is made to '1' when PBi1='1', and the word line BWL2 is made to '1' when PBi2='1'.

The control circuit 6i receives ineffective flags *Fi1 and *Fi2 from the inverted outputs *Q of the RS flip-flops 5i1 and 5i2, the priority bit selection signals PBi1 and PBi2 from the priority bit '1' selector 60, the bank selection signal BAS0, the row address transition detection signal AT and the block selection signal BSi.

Figure 15:
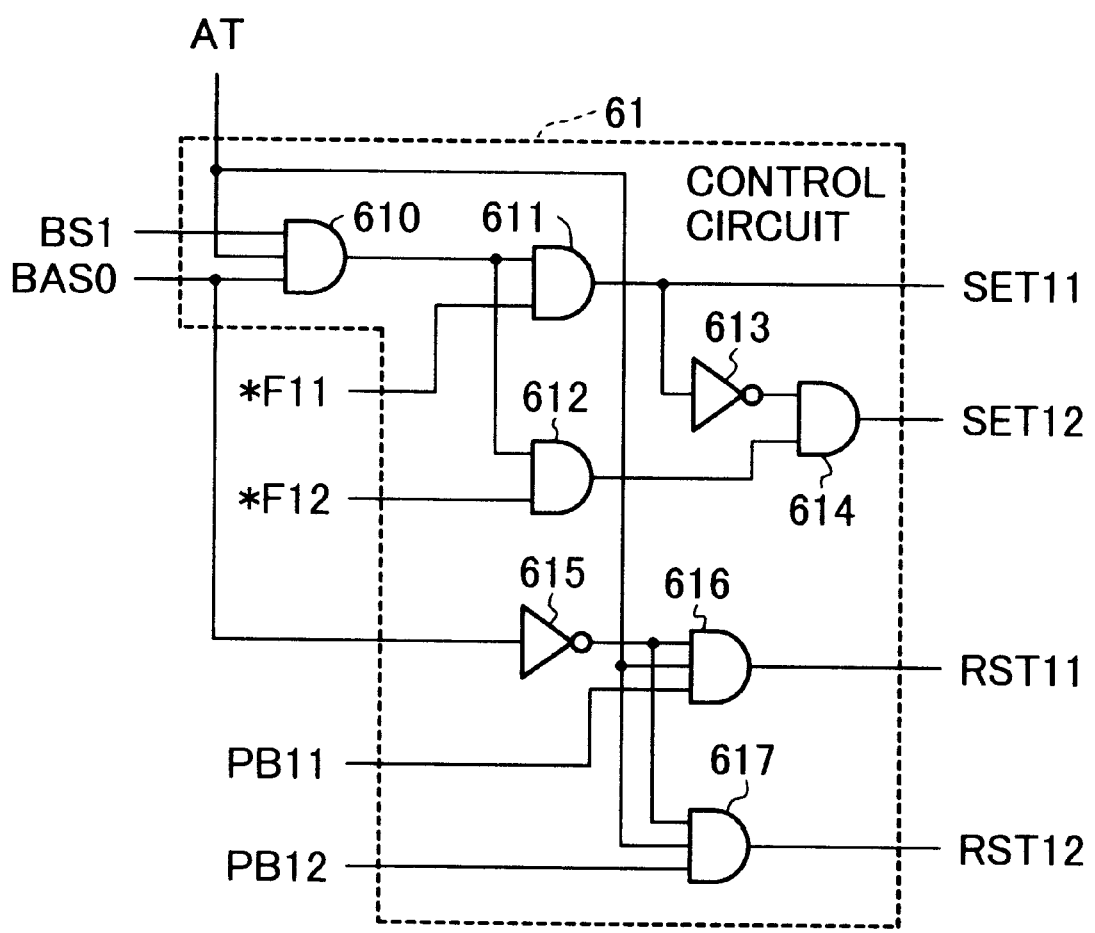
FIG. 15 is a diagram showing an embodiment of the control circuit in FIG. 2.

FIG. 15 shows an embodiment of the control circuit 61.

The signals AT, BAS0 and BS1 are provided to an AND gate 610, and the output thereof and null flag *F11 are provided to an AND gate 611, therefrom a set signal SET11 is outputted. When the bank selection signal BAS0, block selection signal BS1 and null flag *F11 each are '1', that is, when the first memory cell block in the bank #0 is selected and the content of the register 411 is null (empty), a pulse of the signal AT is outputted from the AND gate 611 as the set signal SET11, whereby in FIG. 14 the row address RAL is held in the register 411 and the RS flip-flop 511 is set.

The output of the AND gate 610 and the null flag *F12 are provided to an AND gate 612. The output thereof and the signal made by inverting the output of the AND gate 611 with an inverter 613 are provided to an AND gate 614, and therefrom a set signal SET12 is outputted. When the set signal SET11 is '1', the set signal SET12 is made to '0'. When the set signal SET11 is '0', and the bank selection signal BAS0, block selection signal BS1 and null flag *F12 each are '1', that is, when the first memory cell block in the bank #0 is selected, the content of the register 411 is effective, and the content of the register 412 is null, a pulse of the signal AT is outputted from the AND gate 614 as the set signal SET12, whereby in FIG. 14 the row address RAL is held in the register 412 and the RS flip-flop 512 is set.

The signal made by inverting the selection signal BAS0 with an inverter 615, the signals AT and PB11 are provided to an AND gate 616, and therefrom a reset signal RST11 is outputted. When the bank selection signal BAS0 is '0' and the priority bit selection signal PB11 is '1', that is, when the bank #0 is not selected and the output F11='1' of the RS flip-flop 511 is selected with priority, a pulse of the signal AT is outputted from the AND gate 616 as the reset signal RST11, whereby in FIG. 14 the content of the register 411 is selected as the restoring address RX, the word line BWL1 is made to '1' and the RS flip-flop 511 is reset.

The signal made by inverting the selection signal BAS0 with the inverter 615, the signals AT and PB12 are provided to an AND gate 617, and therefrom a reset signal RST12 is outputted. When the bank selection signal BAS0 is '0' and the priority bit selection signal PB12 is '1', that is, when the bank #0 is not selected and the output F12='1' of the RS flip-flop 512 is selected with priority, a pulse of the signal AT is outputted from the AND gate 617 as the reset signal RST12, whereby in FIG. 14 the content of the register 412 is selected as the restoring address RX, the word line BWL2 is made to '1' and the RS flip-flop 512 is reset.

Modified Embodiment

Figure 16:
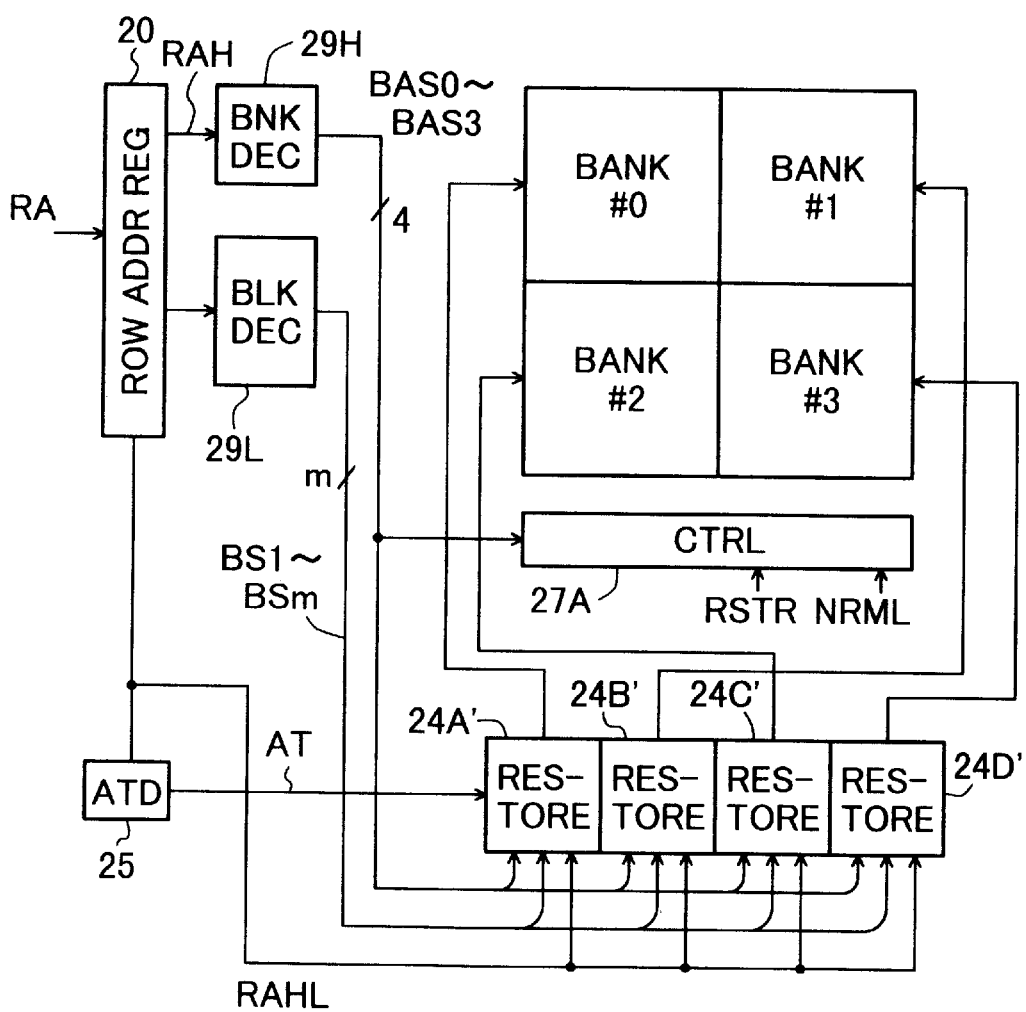
FIG. 16 is a block diagram showing a modified second embodiment of the present invention, which corresponds to FIG. 13.

FIG. 16 is a block diagram, showing a modified embodiment of the second embodiment, which is similar to FIG. 13.

In this circuit, all the bits RAHL of the output of the row address register 20 are provided to each of restoring circuits 24A' through 24D' of the same construction. Row addresses outputted from the restoring circuits 24A' through 24D' are provided to the banks #0 through #3, respectively. The restoring circuit 24A' is similar to that of FIG. 14 excepting that the row address RAHL is provided to the selector 50 of FIG. 14 and the row address RAHL is selected and provided to the bank #0 as RX when the bank #0 is selected. The case where the bank #0 is not selected is the same as described in regard to FIG. 14. All the other restoring circuits 24B' through 24D' are the same as the circuit 24A'.

According to this modified embodiment, as regards all the banks not selected, restoring operations can be carried out in parallel.

Third Embodiment

Figure 17:
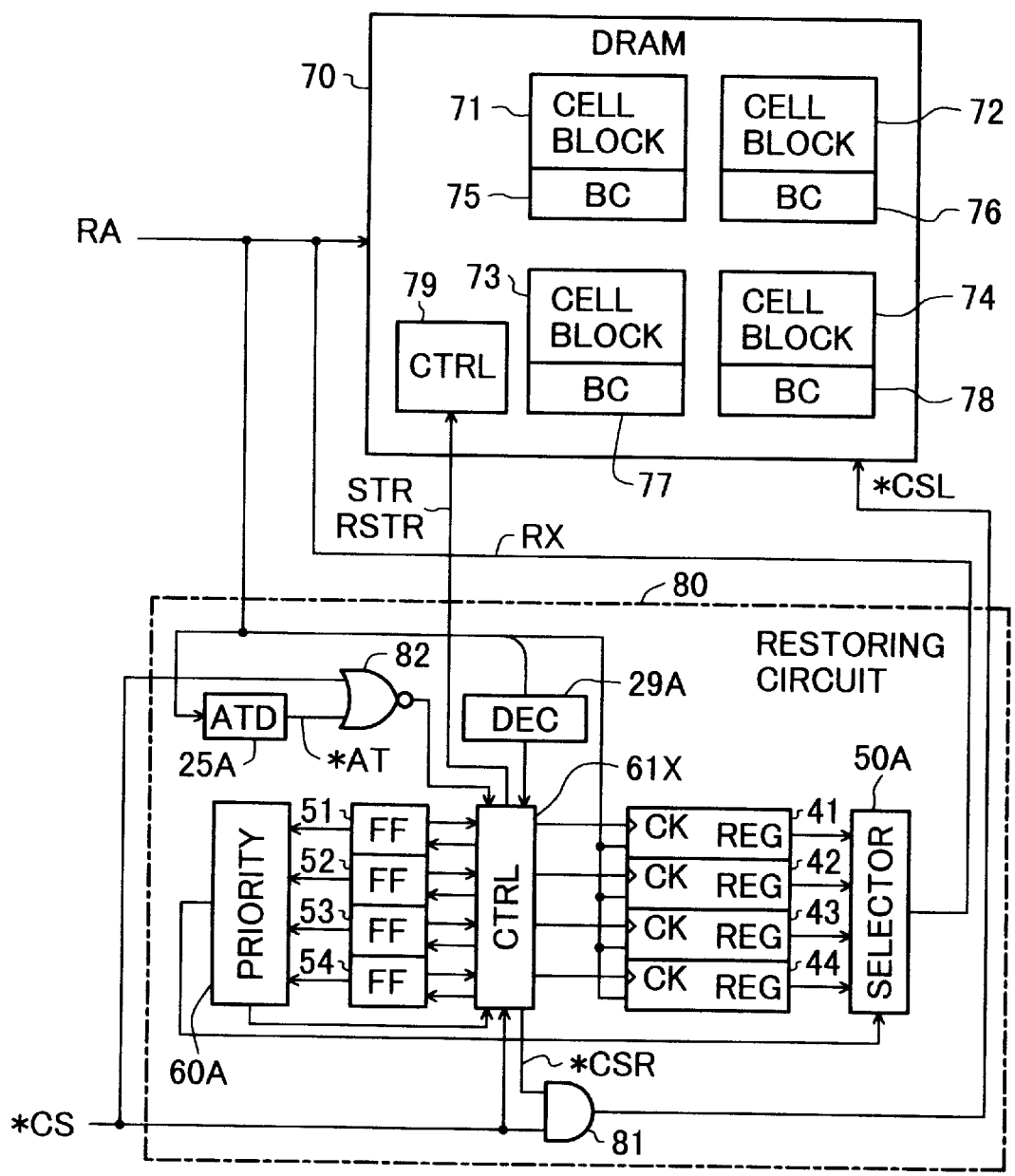
FIG. 17 is a block diagram showing a combination of a DRAM and a restoring circuit according to the third embodiment of the present invention.

FIG. 17 shows a schematic construction of a combination of a DRAM 70 and restoring circuit 80 equipped outside of the DRAM 70.

For simplification, FIG. 17 shows a case where the DRAM 70 is provided with only four memory cell blocks 71 through 74 and respective one buffer memory cell rows 75 through 78. Since each of the buffer memory cell rows 75 through 78 is one row, a buffer memory cell row is determined if the corresponding memory cell block is selected.

Row addresses RA and column address are provided to the DRAM 70 with time-sharing. A store signal STR and a restoring signal RSTR from the restoring circuit 80 is provided to a control circuit 79 in the DRAM 70.

The DRAM 70 operates as below if a chip selection signal *CS is active, namely '0'.

(1) When the store signal STR is '1', the control circuit 79 controls a memory cell block so that a memory access without restoring is carried out, and causes the corresponding memory cell row to hold the accessed data.

(2) When the restoring signal RSTR is '1', the control circuit 79 causes the held data to restoring into the accessed memory cell row.

(3) When both store signal STR and restoring signal RSTR are '0', the control circuit 79 controls so that a normal memory access including restoring is carried out.

In the restoring circuit 80, registers 41 through 44 correspond to the registers 411 through 4m1 of FIG. 14, flip-flops 51 through 54 correspond to the RS flip-flops 511 through 5m1 of FIG. 14, a block decoder 29A, address transition detecting circuit 25A, selector 50A and priority bit '1' selector 60A corresponds to the block decoder 29L, address transition detecting circuit 25, selector 50 and priority bit '1' selector 60 of FIG. 14, and a control circuit 61X corresponds to the control circuits 61 through 6m of FIG. 14.

The row address RA is provided to the registers 41 through 44 and the address transition detecting circuit 25A of the restoring circuit 80. Further, higher-order bits of the row address RA for selecting a memory cell block is provided to the block decoder 29A, and the output thereof is provided to the control circuit 61X. The output of the selector 50A is connected to the address input of the DRAM 70.

An output signal *AT of the address transition detecting circuit 25A and an ordinary chip selection signal *CS for the DRAM 70 are provided to a NOR gate 82, and the output thereof and the chip selection signal *CS are provided to the control circuit 61X. The signal *CS and a chip selection signal *CSR from the control 61X are provided to an AND gate 81, therefrom a chip selection signal *CSL is outputted and provided to a chip selection input of the DRAM 70.

Next, a description will be given of an operation of the third embodiment constructed as above, with respect to a case where an access is made to the memory cell block 71 of the DRAM 70 and then the DRAM 70 is not selected.

In the initial state, all the flip-flops 51 through 54 are reset, the restoring signal RSTR is '0' and the chip selection signal *CSR is '1'. In this state, *CS is changed to '0', thereby *CLS is changed to '0' and the DRAM 70 is selected. A pulse is provided from the NOR gate 82 to the control circuit 61X in response to the transition of the row address RA. The pulse is provided to the clock input CK of the register 41 and the set input of the flip-flop 51 according to the output of the block decoder 29A, whereby the row address RA is held in the register 41 and the flip-flop 51 is set. On the other hand, the store signal STR is made to '1', whereby the control circuit 79 controls the memory cell block 71 to execute a memory access without restore. Thereafter, the store signal STR is made to '0'.

Next, the chip selection signal *CS becomes '1', thereby the control circuit 61X make the chip selection signal *CSR to '0' and the restoring signal RSTR to '1', whereby the chip selection signal *CSL becomes '0' and the DRAM 70 is selected. Further, the output of the register 41 is selected corresponding to the output '1000' of the priority bit '1' selector 60A, and this output is provided to the DRAM 70 as an address RX for restore. Since the restoring signal RSTR is '1', the control circuit 79 selects the buffer memory cell row 75 for restoring data according to the higher-order address bits for the memory cell block selection part, selects a memory cell row in the memory cell block 71 according to the address RX for restore, and causes the content of the buffer cell row 75 to restoring into the selected memory cell row. On the other hand, the flip-flop 51 is reset by the control circuit 61X. After these operations for restoring, the restoring signal RSTR is made to '0'.

Modified Embodiment

Figure 18:
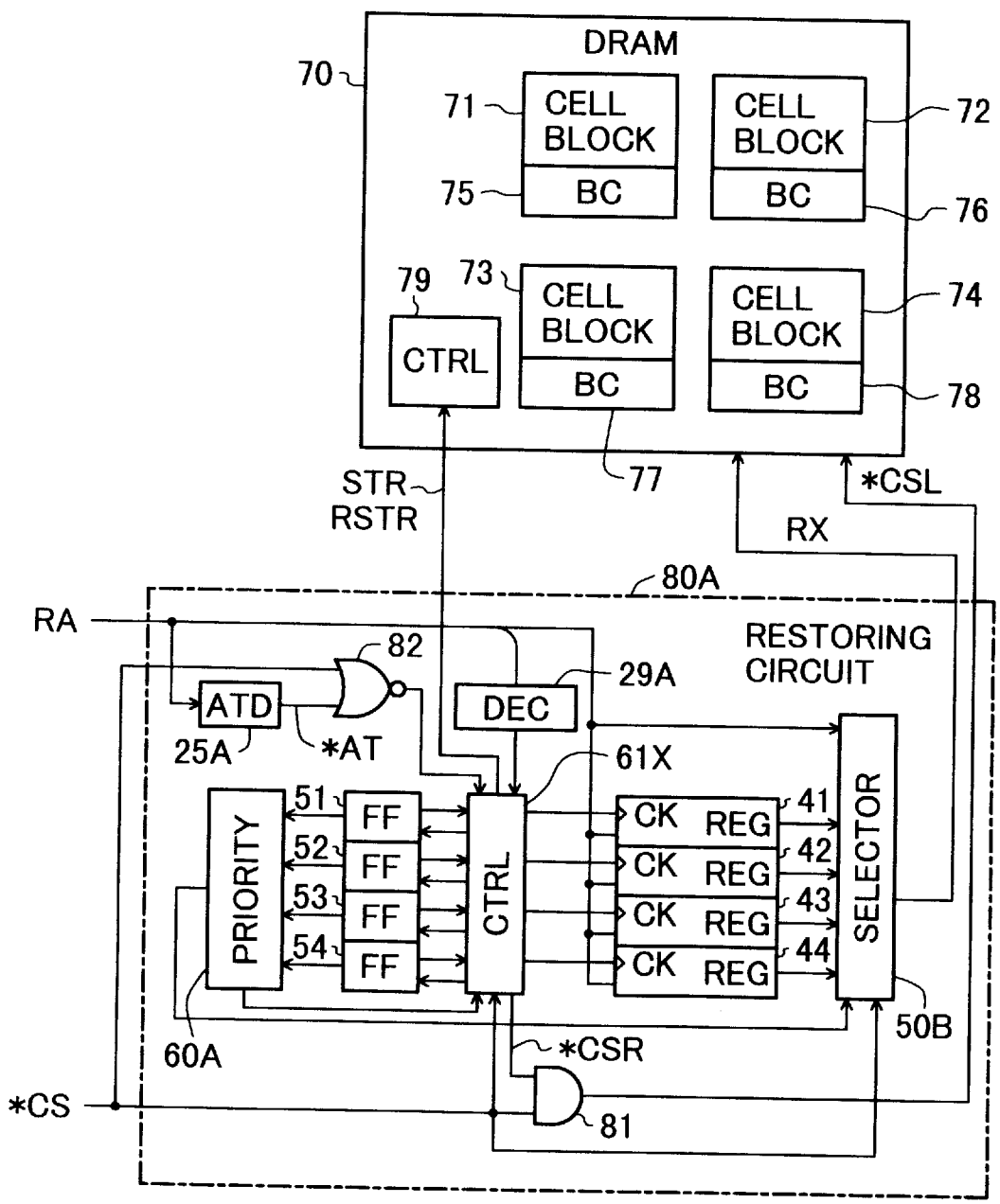
FIG. 18 is a block diagram showing a modified third embodiment of the present invention, which corresponds to FIG. 17.

FIG. 18 is a bloc diagram showing the modified embodiment of the third embodiment, which is similar to FIG. 17.

In the circuit, the row address RA and chip selection signal *CS are provided to a selector 50B, and when the chip selection signal *CS is '0', the row address RA is selected by the selector 50B and is provided to the DRAM 70 as RX. In the case where chip selection signal *CS is '1', the same operation as the above third embodiment is performed.

Note that by including a chip address in the restoring address, such a structure that only one circuit like 80A for restoring is employed for a plurality of DRAMs.

Fourth Embodiment

Figure 19:
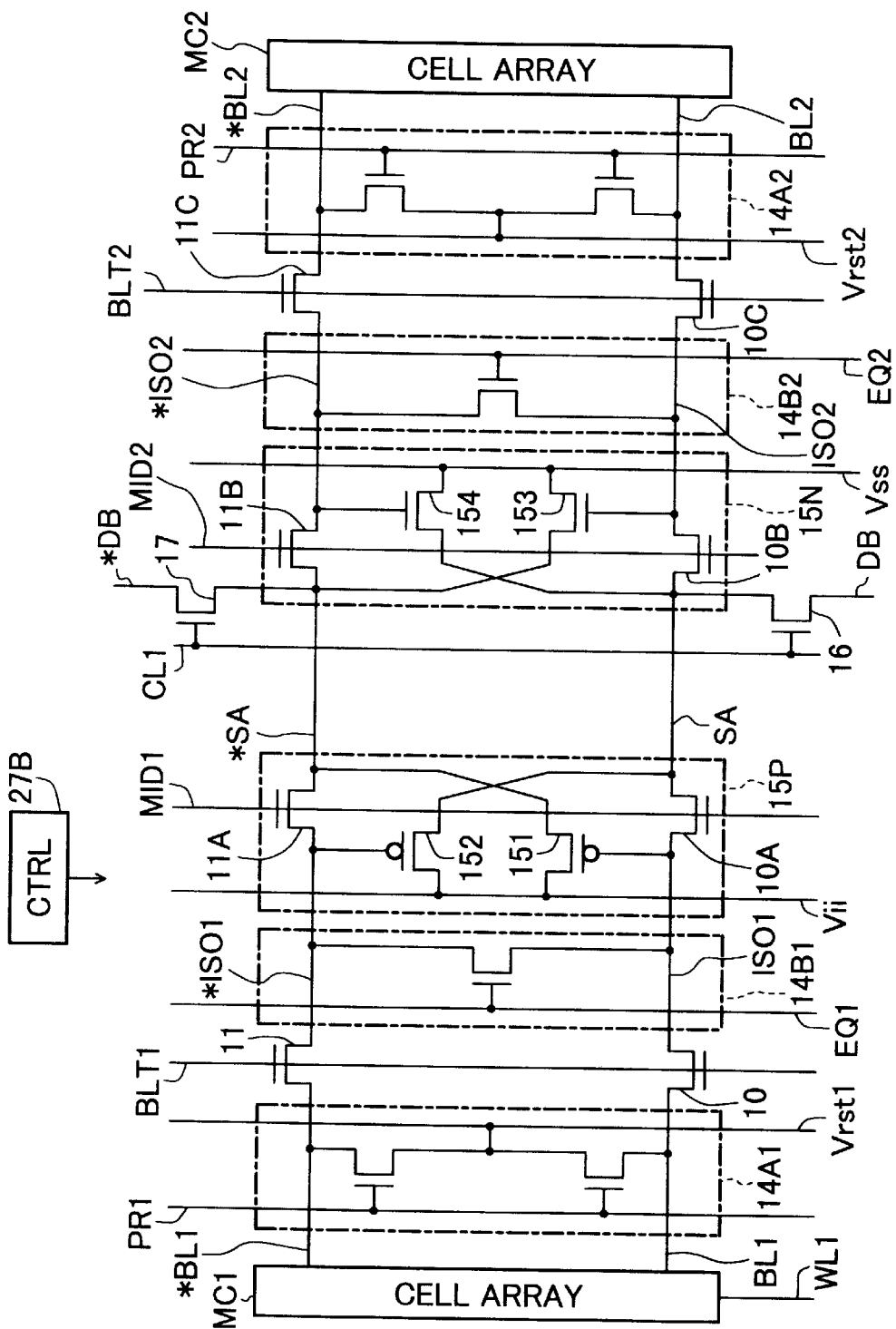
FIG. 19 is a diagram showing a circuit connected to a bit line pair in a DRAM according to the fourth embodiment of the present invention.

FIG. 19 shows a circuit connected to a bit line pair in a DRAM according to the fourth embodiment of the present invention.

In order to use a sense amplifier commonly among memory cell arrays MC1 and MC2, the circuit is substantially symmetrical between the left and right portions in FIG. 19.

A PMOS cross-coupled circuit 15P and an NMOS cross-coupled circuit 15N which constitute a CMOS sense amplifier are featured in that transfer gates are incorporated in each of them.

That is, a transfer gate 10A is connected between the gate of a PMOS transistor 151 and the drain of a PMOS transistor 152, a transfer gate 11A is connected between the gate electrode of the PMOS transistor 152 and the drain of the PMOS transistor 151, whereby the drain side wirings SA and *SA are conducted to or insulated from the gate side wirings ISO1 and *ISO1, respectively. A gate control signal MID1 is provided to the gate electrodes of the transfer gates 10A and 11A. By setting the gate control signal MID1 low and turning off the transfer gates 10A and 11A, a direct sensing is established, whereby the sources of the PMOS transistors 151 and 152 can be fixed at the potential Vii and column gates 16 and 17 can be quickly turned on.

Similarly, in the NMOS cross-coupled circuit 15N, a transfer gate 10B is connected between the gate of an NMOS transistor 153 and the drain of the NMOS transistor 154 while a transfer gate 11B is connected between the gate electrode of the NMOS transistor 154 and the drain of the NMOS transistor 153, whereby the drain side wirings SA and *SA are conducted to or insulated from the gate side wirings ISO1 and *ISO2. A gate control signal MID2 is provided to the gate electrodes of the transfer gates 10B and 11B.

The source of the PMOS cross-coupled circuit 15P is fixed at the potential Vii and the source of the NMOS cross-coupled circuit 15N is fixed at the potential Vss.

Further, a precharge circuit 14 with an equalizer of FIG. 33 is divided to a precharge circuit 14A1 and an equalizer 14B1, the precharge circuit 14A1 is connected between the memory cell side wirings BL1 and *BL1 with respect to the transfer gates 10 and 11, and the equalizer 14B1 is connected between the wirings ISO1 and *ISO1 opposite thereto.

A memory cell MC2 side precharge circuit 14A2, transfer gates 10C and 11C, an equalizer 14B2, a precharge signal PR2, a gate control signal BLT2, a signal EQ2, bit wirings BL2 and *BL2, wirings ISO2 and *ISO2, respectively, correspond to the memory cell MC1 side precharge circuit 14A1, transfer gates 10 and 11, equalizer 14B1, precharge signal PR1, gate control signal BLT1, signal EQ1, bit wirings BL1 and *BL1, wirings ISO1 and *ISO1.

The control for the circuit above are carried out by a control circuit 27B.

In FIG. 19, only one WL1 of a plurality of word lines connected to the memory cell array MC1 is drawn for simplification.

All the other points are of the same as in FIG. 33.

Figure 20:
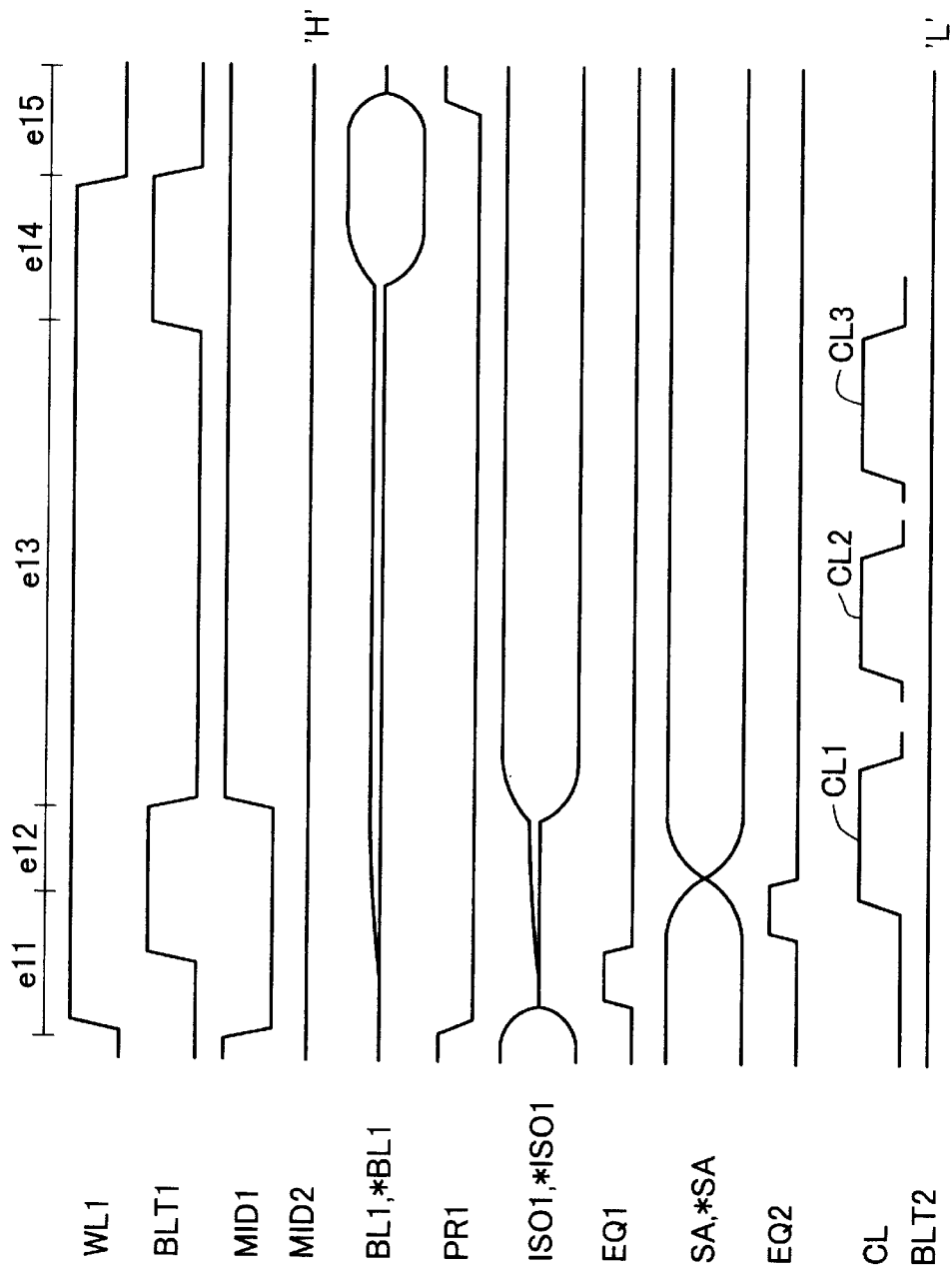
FIG. 20 is a timing chart showing read operations of the circuit in FIG. 19.

Next, a description will be given of a read operation of the circuit in a case where the bit line reset potential Vrst1 is Vii/2. FIG. 20 shows a read operation in a case where the column addresses of the memory cell array are successively changed.

During accessing the memory cell array MC1, the gate control signal BLT2 is low, thereby the transfer gates 10C and 11C are off, and the gate control signal MID2 is high, thereby the transfer gate 10B and 11B are on.

In the initial state, the gate control signal BLT1 is low and thereby the transfer gates 10 and 11 are off, and the memory cell array MC1 side is reset and the previous data is held on the sense amplifier side. That is, on the memory cell array MC1 side, the word line WL1 is made low, and the precharge signal PR1 is high, whereby the bit lines BL1 and *BL1 are precharged at the potential Vii/2. On the sense amplifier side, the equalizing signals EQ1 and EQ2 are row, and the gate control signal MID1 is high, whereby a CMOS sense amplifier, in which the PMOS cross-coupled circuit 15P and the NMOS cross-coupled circuit 15N are combined, operates to hold the previous data.

(e11) In this state, the post-processing for the previous data and data read starting operation from a cell of the memory cell array MC1 are carried out in parallel.

That is, as the first step of the post-processing, the gate control signal MID1 is changed low, thereby the transfer gates 10A and 11A are turned off, the equalizing signal EQ1 is changed high, thereby the wirings ISO1 and *ISO1 are short-circuited to equalize the both potentials. As a read starting operation, the precharge signal PR1 is changed low, and the potential of the word line WL1 is caused to rise, whereby a potential difference arises between the bit lines BL1 and *BL1 due to the movement of electric charge of the cell capacitor. Further, the equalizing signal EQ1 is changed low, thereby the wirings ISO1 and *ISO1 are insulated from each other, and the gate control signal BLT1 is changed high to cause the bit line BL1 and wiring ISO1 to conduct and the bit line *BL1 and wiring *ISO1 to conduct to each other. As the second step of the post-processing, the equalizing signal EQ2 is changed high, thereby the wirings ISO2, *ISO2, SA and *SA are short-circuited to equalize the potentials thereof.

(e12) Next, the first step of amplification is carried out by the direct sensing.

That is, the equalizing signal EQ2 is changed low, thereby the wirings ISO2 and *ISO2 are insulated from each other, the column selection signal CL1 is changed high to turn on the column gates 16 and 17. Thus, even though the column gates 16 and 17 are turned on at an early stage, since the transfer gates 10A and 11A are off, no erroneous amplifying operation of the PMOS cross-coupled circuit 15P arises by the potential of the data bus lines DB and *DB.

Since the source of the PMOS transistors 151 and 152 is fixed at the potential Vii and the transfer gates 10A and 11A are off, currents flow from the wiring of the potential Vii to the wirings *SA and SA via the PMOS transistors 151 and 152 in response to the gate potential of the PMOS transistors 151 and 152, whereby a potential difference arises between the wirings SA and *SA.

In order to avoid an erroneous operation by decreasing the variations of circuit characteristics resulting from the dispersion of production processes, the size of the PMOS transistors 151 and 152 is made greater by several times than that of the transfer gate 10, etc., and the load is comparatively great. Therefore, the amplification operation would be made slow if the source potential of the PMOS transistors 151 and 152 was caused to rise from the potential Vii/2 to the potential Vii. However, since the rise is not required, the response is quick.

(e13) Next, the second step of amplification is carried out by a CMOS sense amplifier.

That is, with the gate transfer signal MID1 made high, the CMOS sense amplifier in which the PMOS cross-coupled circuit 15P and NMOS cross-coupled circuit 15N are combined, is operated, since by the above-described amplification there is a potential difference between the wirings SA and *SA to such a degree that no erroneous operation arises even though the amplification is carried out by the CMOS sense amplifier having a high drive ability.

At the same time, by making the gate control signal BLT1 low and turning off the transfer gates 10 and 11, the load of the CMOS sense amplifier is decreased to cause the amplification speed to be increased.

Further, the column address changes, and data of the same memory cell row are transferred from different columns (not illustrated and column address selection signals CL2 and CL3 in FIG. 19 are for these columns) to the data bus lines DB and *DB one after another by pulses of the column address selection signals CL1 through CL3.

(e14) Next, a restoring operation is carried out.

That is, the gate control signal BLT1 is changed high and the transfer gates 10 and 11 are turned on, whereby the state of the CMOS sense amplifier is transmitted to the bit line BL1 and *BL1.

Next, the potential of the word line WL1 is caused to fall down to complete the restoring operation.

(e15) Next, a reset operation is carried out.

That is, the gate control signal BLT1 is changed low, thereby the transfer gates 10 and 11 are turned off, and the precharge signal PR1 is changed high, whereby the bit lines BL1 and *BL1 are precharged to the potential Vii/2.

With a high speed operation of the sense amplifier as described above, the row cycle can be shortened by, for example, 10 ns.

In FIG. 19, by the above described symmetry of the circuit, the read operation from the memory cell array MC2 becomes symmetrical to the above-described operation from the memory cell array MC1, therefore the explanation thereof is omitted.

Note that, in FIG. 19, the bit line reset potentials Vrst1 and Vrst 2 are not limited to Vii/2, but they may be the potential Vii or Vss. Especially, if the reset potential Vrst1 provided to the precharge circuit 14A1 on the PMOS cross-coupled circuit 15P side is set at the potential Vss, the amplification ratio of the PMOS transistors 151 and 152 is made greater than in a case of Vrst1=Vii/2. Similarly, if the reset potential Vrst2 provided to the precharge circuit 14A2 on the NMOS cross-coupled circuit 15N side is set at the potential Vii, the amplification ratio of the NMOS transistors 153 and 154 is made greater than that in a case of Vrst2 =Vii/2 and it is preferable in view of shortening the access time.

Figure 21:
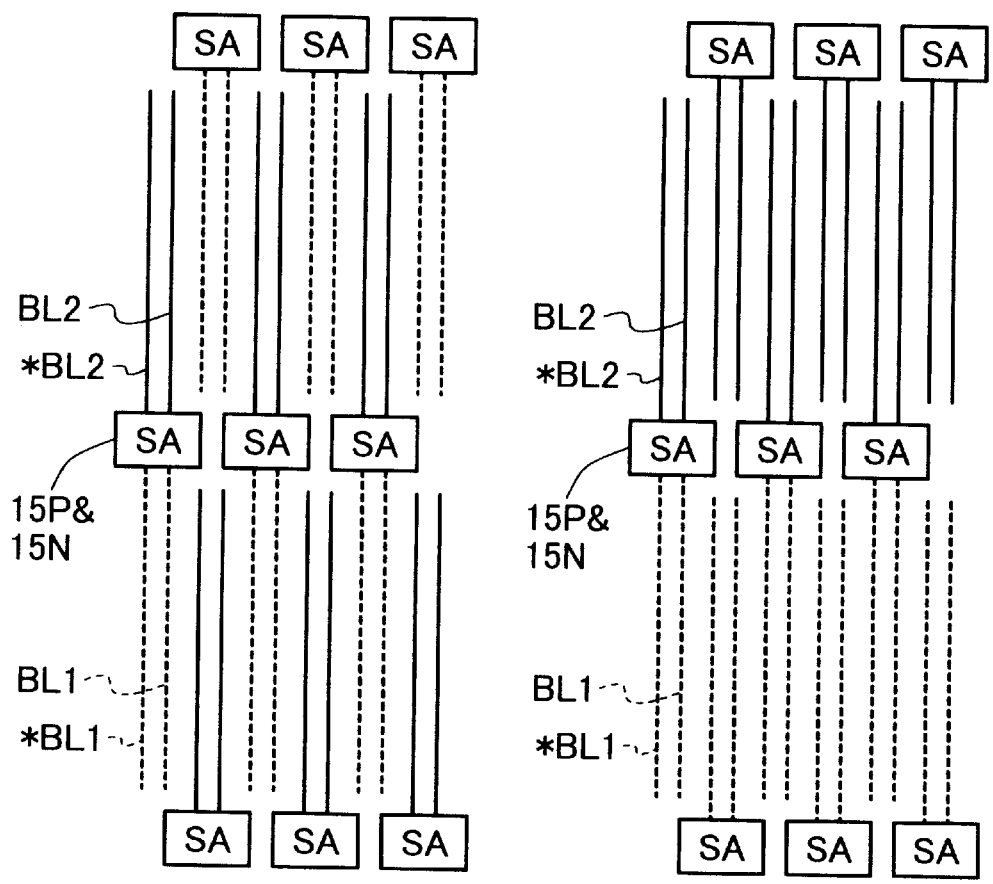
FIGS. 21(A) and 21(B) are diagrams showing the relationship between an array of bit line pairs in the DRAM and reset potentials thereof.

Each of FIG. 21(A) and FIG. 21(B) shows an array of the bit line pairs in a DRAM in a case where the reset potential Vrst is determined as described above, wherein the solid line designates that the reset potential Vrst is Vii and the dashed line designates that the reset potential Vrst is Vss. As shown in FIG. 21(A) and FIG. 21(B), it is possible that bit line pairs of the reset potentials Vii and Vss are alternately disposed along a row of sense amplifiers or that pairs of Vii or Vss are disposed along the row of sense amplifiers.

Fifth Embodiment

Figure 22:
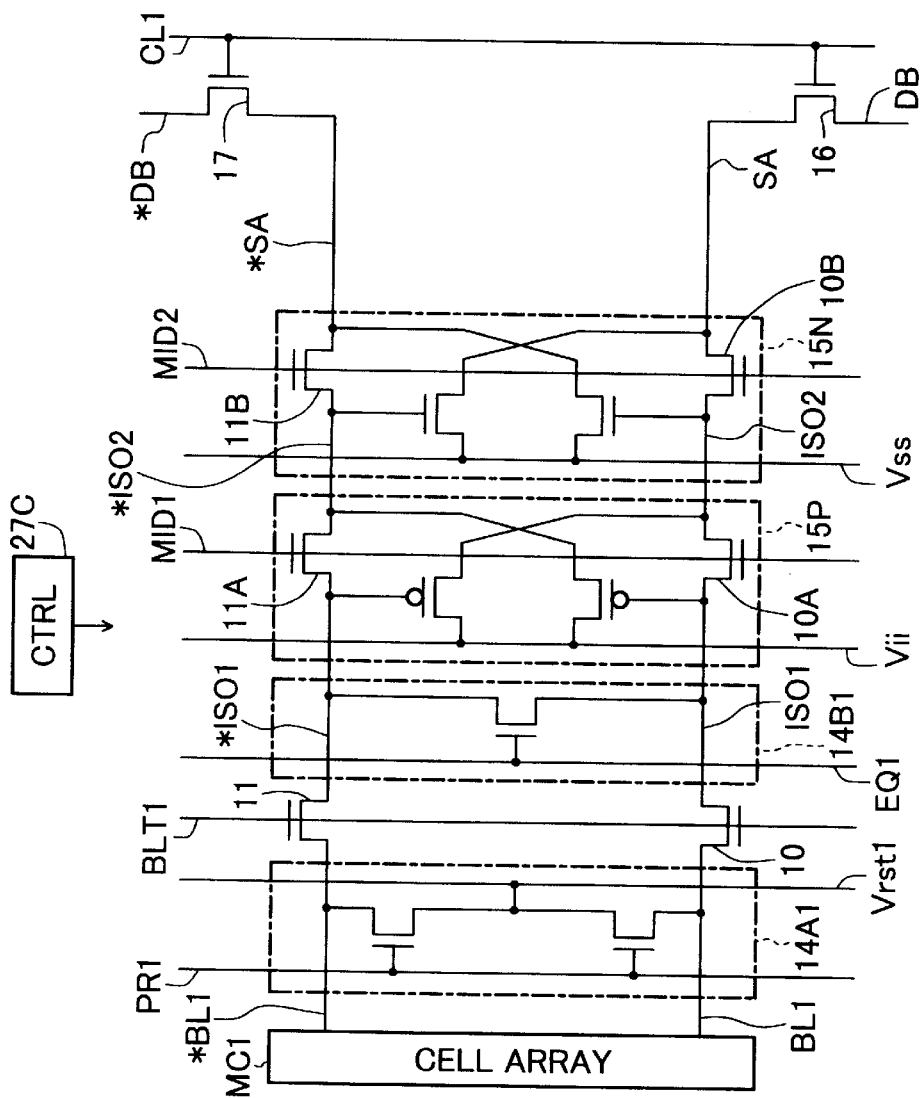
FIG. 22 is a diagram showing a circuit connected to a bit line pair in a DRAM according to the fifth embodiment of the present invention.

FIG. 22 shows a circuit connected to a bit line pair in a DRAM according to the fifth embodiment of the present invention.

This circuit is such that, in FIG. 19, the connection destination of both sides of the NMOS cross-coupled circuit 15N are changed to each other, and further the memory cell array MC2 side circuit is omitted. The source of the PMOS cross-coupled circuit 15P is fixed at the potential Vii, and the source of the NMOS cross-coupled circuit 15N is fixed at Vss. The controls for the circuit between the bit line pair are carried out by the control circuit 27C.

Figure 23:
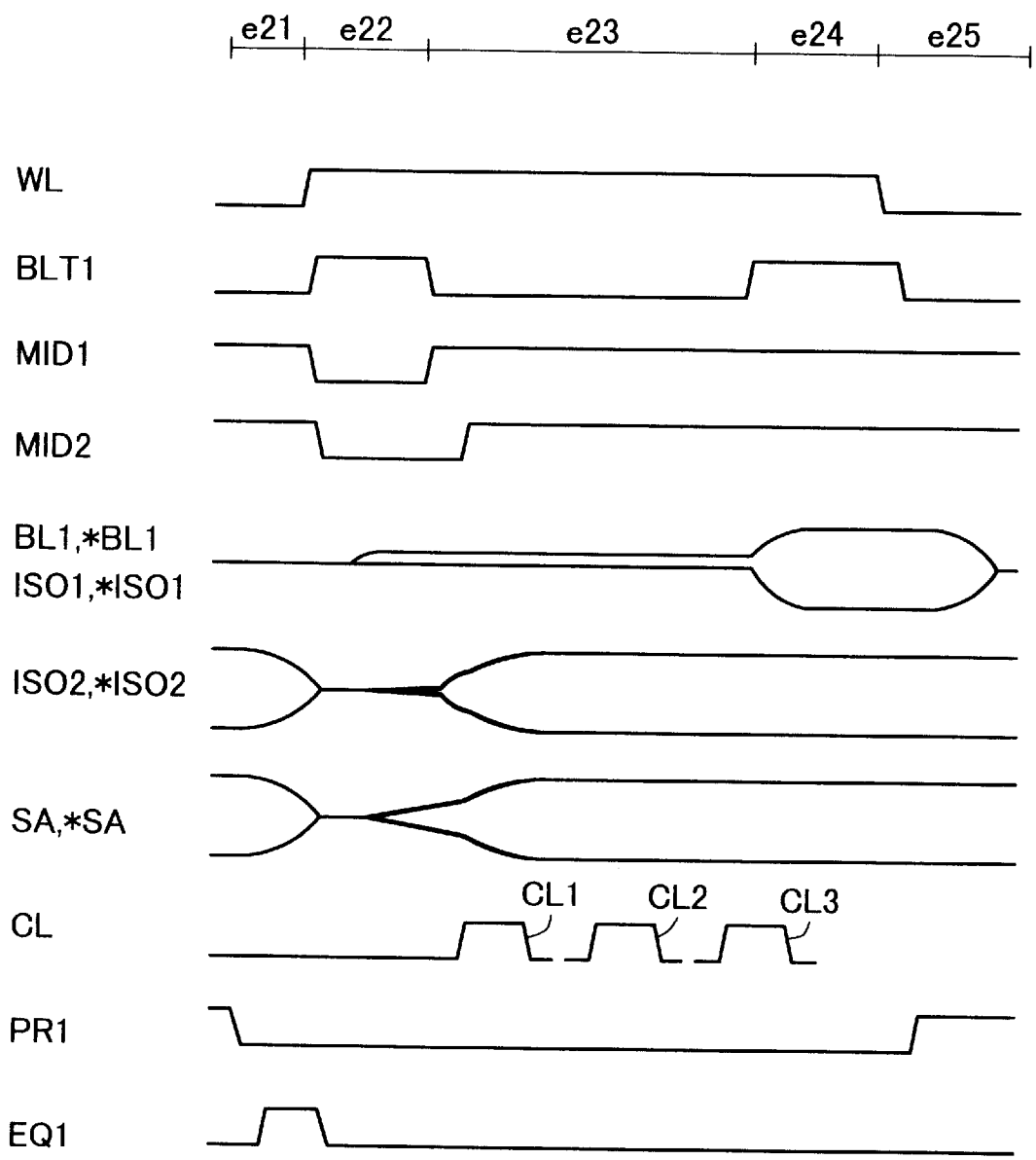
FIG. 23 is a timing chart showing read operations of the circuit in FIG. 22.

Next, a description will be given of a read operation of the circuit in a case where the bit line reset potential Vrst1 is Vii/2. FIG. 23 shows a read operation in a case where column addresses of the memory cell array are successively changed.

In the initial state, the gate control signal BLT1 is low, thereby the transfer gates 10 and 11 are off. The precharge circuit 14A1 is on, whereby the memory cell array MC1 side is reset. The gate control signals MID1 and MID2 are high, and the signal EQ1 is low, thereby the previous data is held on the CMOS sense amplifier side.

(e21) The post-processing is carried out for the previous data.

That is, the precharge circuit 14A1 is turned off. Next, the equalizer 14B1 is turned on, whereby the wirings ISO2, *ISO2, SA and *SA are made to the same potential.

(e22) The next data is read out from a cell of the memory cell array MC1, and the first amplification step of the small potential difference is performed.

That is, on the one hand, the potential of the selected word line is caused to rise, and a potential difference arises between BL1 and *BL1 due to movement of the electric charge of the cell capacitor, on the other hand, the transfer gates 10 and 11 are turned on, and the transfer gates 10A, 11A, 10B and 11B are turned off. Thereby, the direct sensing of two stages by the PMOS cross-coupled circuit 15P and NMOS cross-coupled circuit 15N is carried out. The drive ability of this case is greater than in a case of the first step direct sensing in FIG. 19.

(e23) Next, the second amplification step is performed by a CMOS sense amplifier.

That is, firstly, the transfer gates 10 and 11 are turned off. After a potential difference between the wirings ISO2 and *ISO2 has become such a degree that no erroneous operation arises even though the amplification is carried out by the PMOS cross-coupled circuit 15P, the transfer gates 10A and 11A are turned on to perform the amplification by the PMOS cross-coupled circuit 15P. Next, the transfer gates 10B and 11B are turned on, whereby the CMOS sense amplification having high drive ability, in which the NMOS cross-coupled circuit 15P and NMOS cross-coupled circuit 15N are combined, is operated.

Hereinafter, data transfer to the data bus lines DB and *DB, restoring (e24) and precharge (e25) are carried out as in the case of FIG. 20.

Sixth Embodiment

Figure 24:
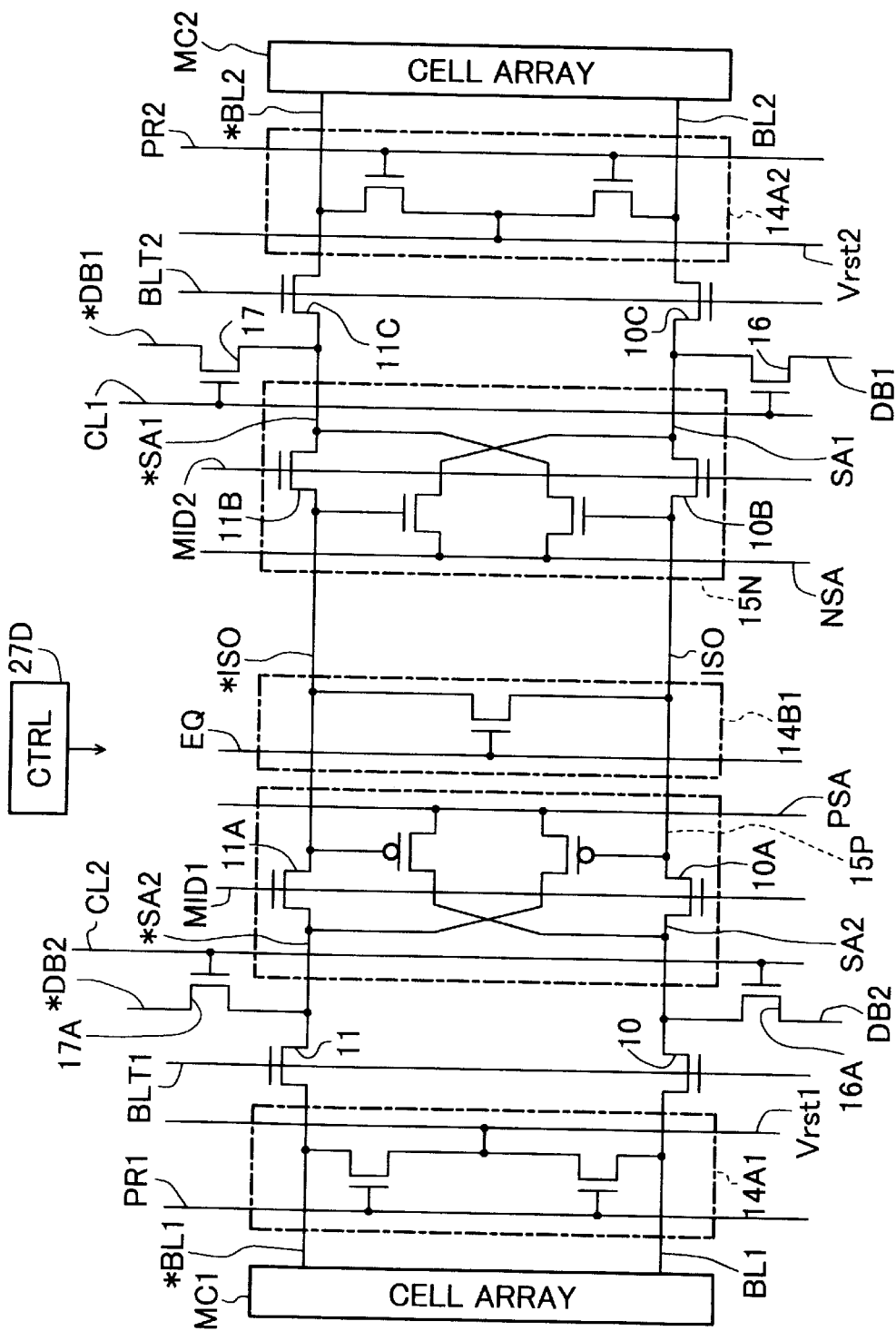
FIG. 24 is a diagram showing a circuit connected to a bit line pair in a DRAM according to the sixth embodiment of the present invention.

FIG. 24 shows a circuit connected to a bit line pair in a DRAM according to the sixth embodiment of the present invention.

This circuit is such that, in FIG. 19, the connection destination of both sides of the combination of the NMOS cross-coupled circuit 15N and equalizer 14B1 are changed to each other, the connection destination of both sides of the combination of the PMOS cross-coupled circuit 15P and are changed to each other, and further one of the equalizers 14B1 and 14B2 is omitted. The column gates 16 and 17 on the NMOS cross-coupled circuit 15N side are used for the memory cell array MC1, and column gates 16A and 17A on the PMOS cross-coupled circuit 15P side are used for the memory cell array MC2. The controls for this circuit are carried out by a control circuit 27D.

The gate control signal BLT2 and column selection signal CL2 are made low while accessing the memory cell array MC1, and the gate control signal BLT1 and column selection signal CL1 are made low while accessing the memory cell array MC2.

Figure 25:
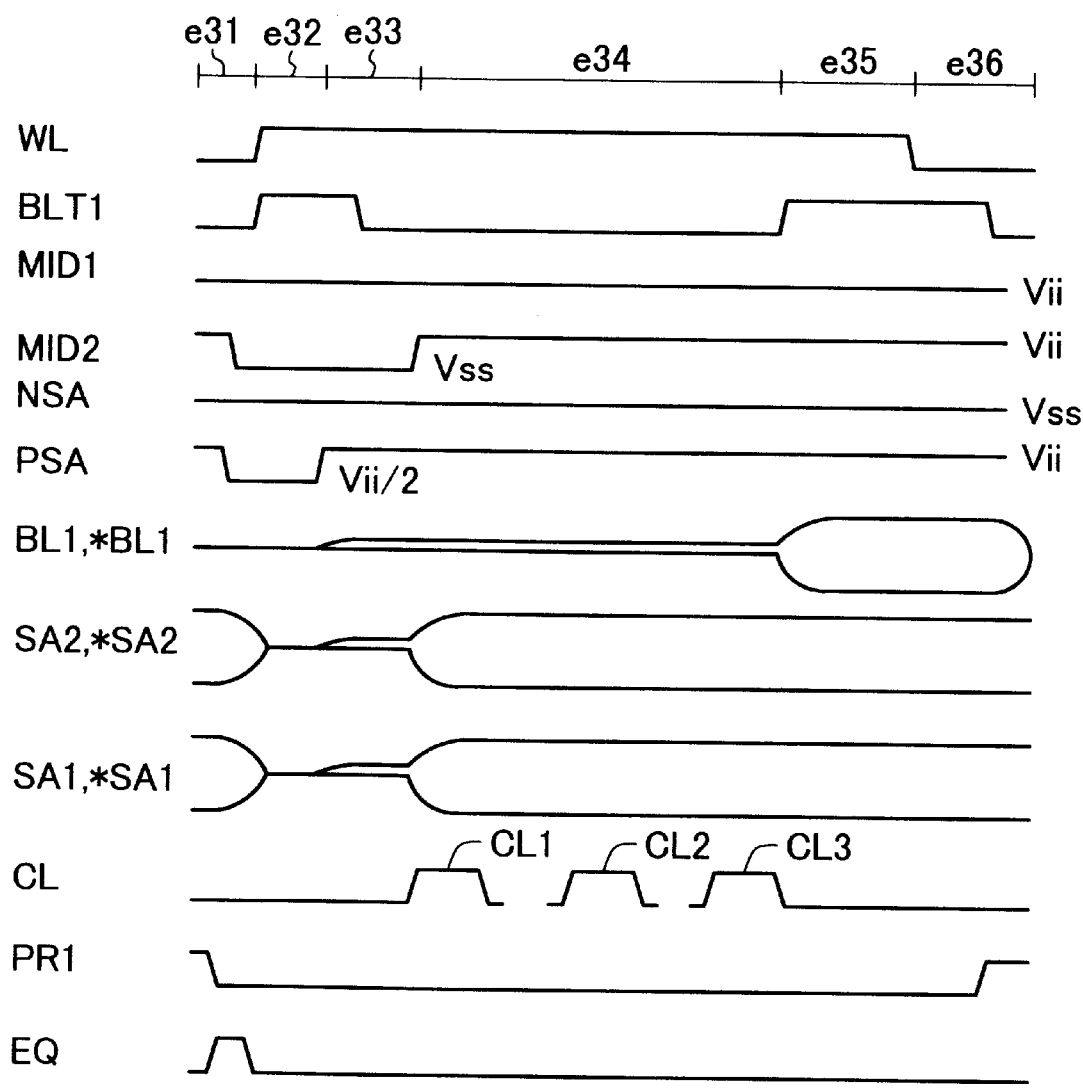
FIG. 25 is a timing chart showing read operations of the circuit in FIG. 24.

Next, a description will be given of a read operation of the circuit in a case where the bit line reset potential Vrst1 is Vii/2. FIG. 25 shows a read operation in a case where column addresses of the memory cell array are successively changed.

In the initial state, the gate control signal BLT1 is low, whereby the transfer gates 10 and 11 are off, and the circuit is reset on the memory cell array side. On the CMOS sense amplifier side, the gate control signals MID1 and MID2 are high and the equalizing signal EQ1 is low, whereby the previous data is held in the CMOS sense amplifier.

(e31) In this state, the post-processing is carried out for the previous data.

That is, the precharge signal PR1 is changed low on the memory cell array MC1 side. On the sense amplifier side, the gate control signal MID2 is changed low and the drive signal PSA is made from the potential Vii to the potential Vii/2, whereby the PMOS cross-coupled circuit 15P is made inactive. Further, the wirings ISO1 and *ISO1 are short-circuited by the equalizer 14B1, whereby the potential of the both wirings are made equal.

(e32) The next data read starting operation from a cell of the memory cell array MC1 is carried out.

That is, the gate control signal BLT1 is changed high, whereby the transfer gates 10 and 11 are turned on, and the potential of the selected word line is caused to rise, whereby a small potential difference arises between BL1 and *BL1 by movement of electric charge of a cell capacitor.

(e33) Next, the first amplification step is performed.

That is, the drive signal PSA is caused to rise to the potential Vii, thereby the PMOS cross-coupled circuit 15P is activated. The amplification of a difference of the currents flowing through the wirings SA1 and *SA1 by the direct sensing of NMOS cross-coupled circuit 15N is increased by the amplification of the potential difference between the wirings ISO and *ISO with the PMOS cross-coupled circuit 15P activating.

The gate control signal BLT1 is changed low and the transfer gates 10 and 11 are turned off, whereby the load of the sense amplifier is decreased.

(e34) Next, the second amplification step is carried out by a CMOS sense amplifier.

That is, after a potential difference between the wirings ISO and *ISO has become such a degree that no erroneous operation arises even though the amplification is carried out by the NMOS cross-coupled circuit 15N with the transfer gates 10B and 11B being on, these transfer gates 10B and 11B are turned on, whereby the CMOS sense amplification having high drive ability, in which the NMOS cross-coupled circuit 15P and NMOS cross-coupled circuit 15N are combined, is operated.

Hereinafter, as in the case in FIG. 20, data transfer to the data bus lines DB and *DB, restoring (e35) and precharge (e36) are performed.

Seventh Embodiment

Figure 26:
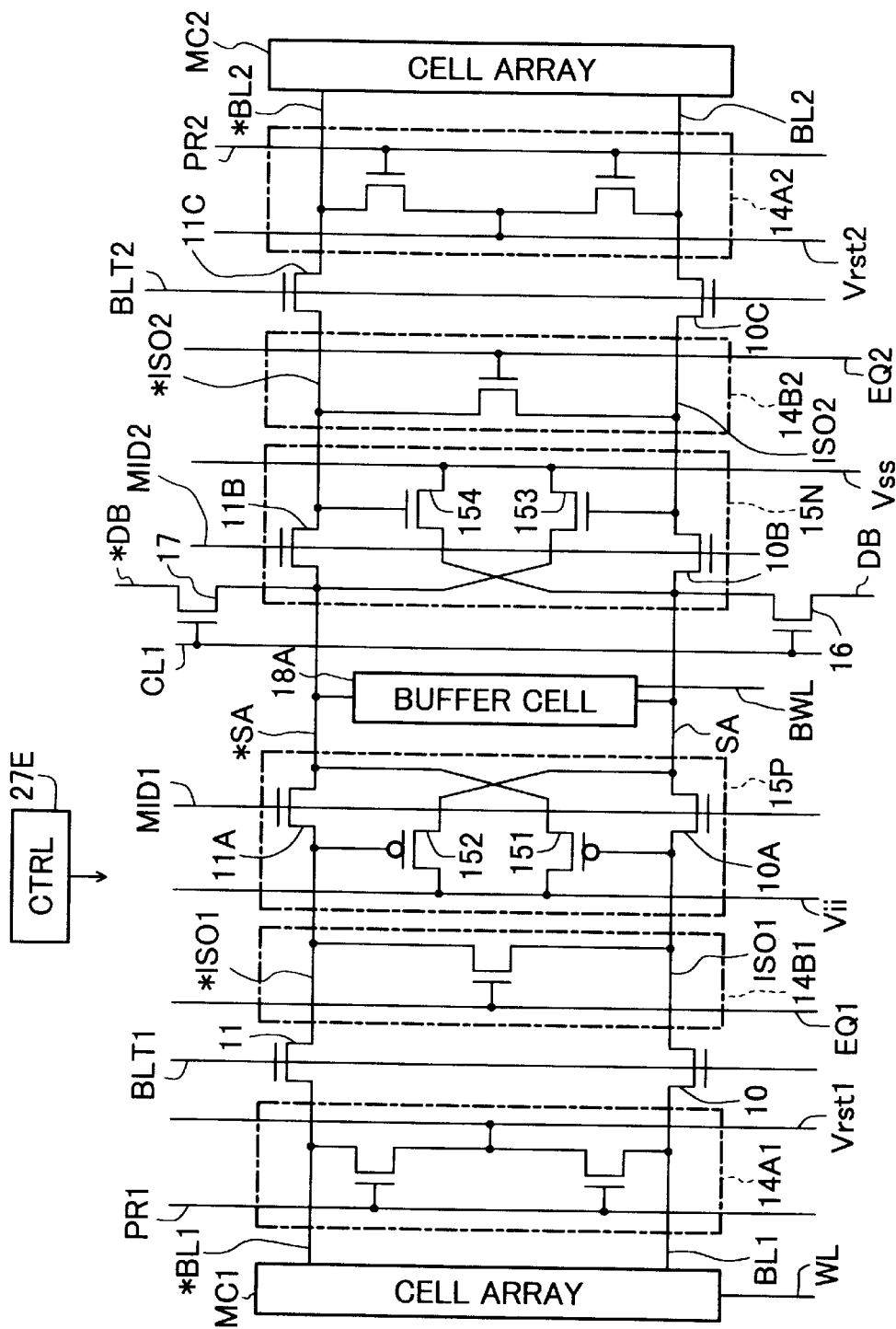
FIG. 26 is a diagram showing a circuit connected to a bit line pair in a DRAM according to the seventh embodiment of the present invention, which corresponds to FIG. 19.

FIG. 26 shows a circuit connected to a bit line pair of a DRAM according to the seventh embodiment of the present invention, corresponding to FIG. 19.

The circuit is identical to that in FIG. 19, excepting that a buffer memory cell circuit 18A is connected between the wirings SA and *SA. The controls for the circuit are carried out by a control circuit 27E.

The buffer memory cell circuit 18A is provided with, for example, two memory cells for each of the memory cell arrays MC1 and MC2.

Figure 27:
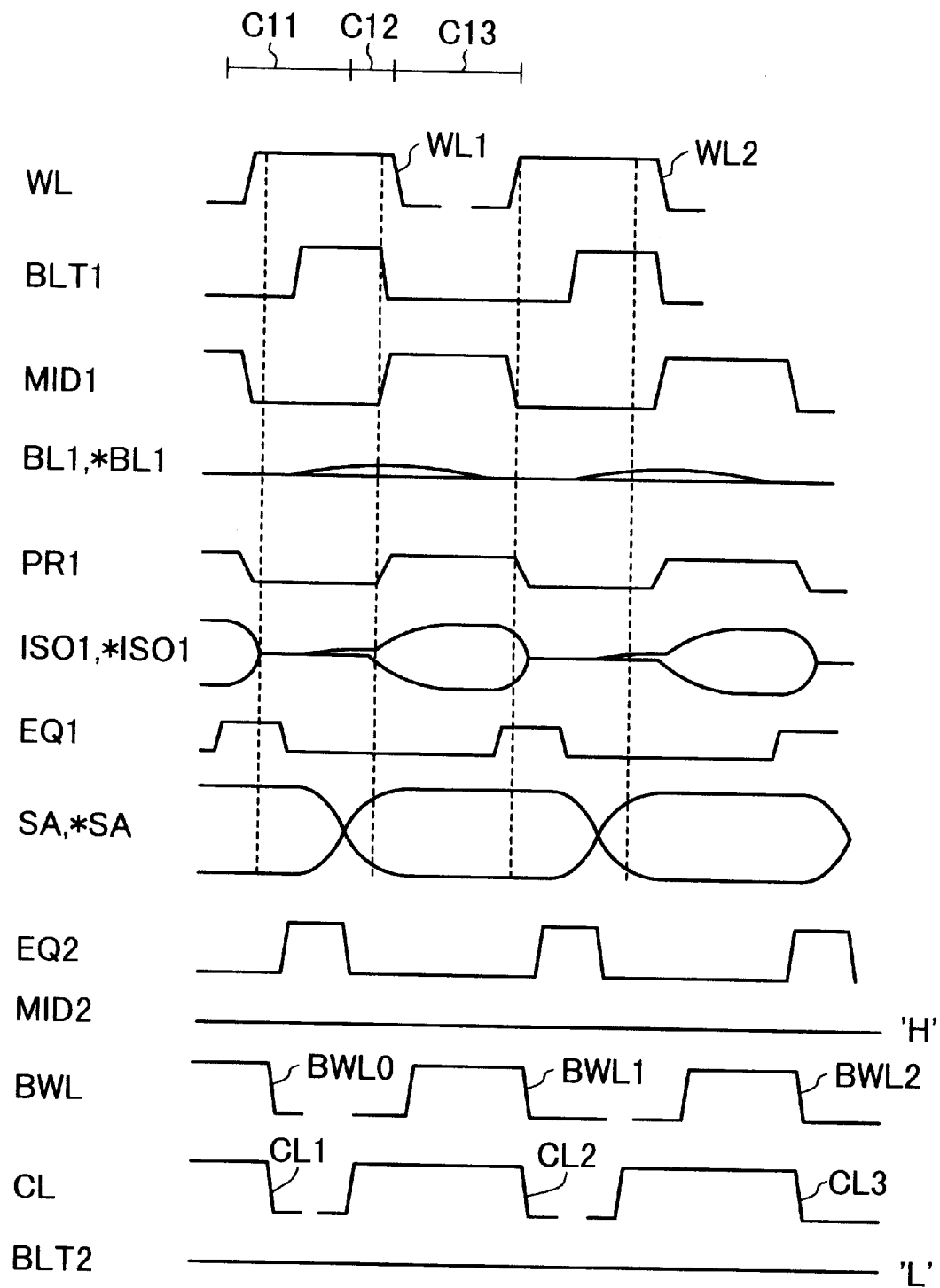
FIG. 27 is a timing chart showing read operations of the circuit in FIG. 26.
Figure 28:
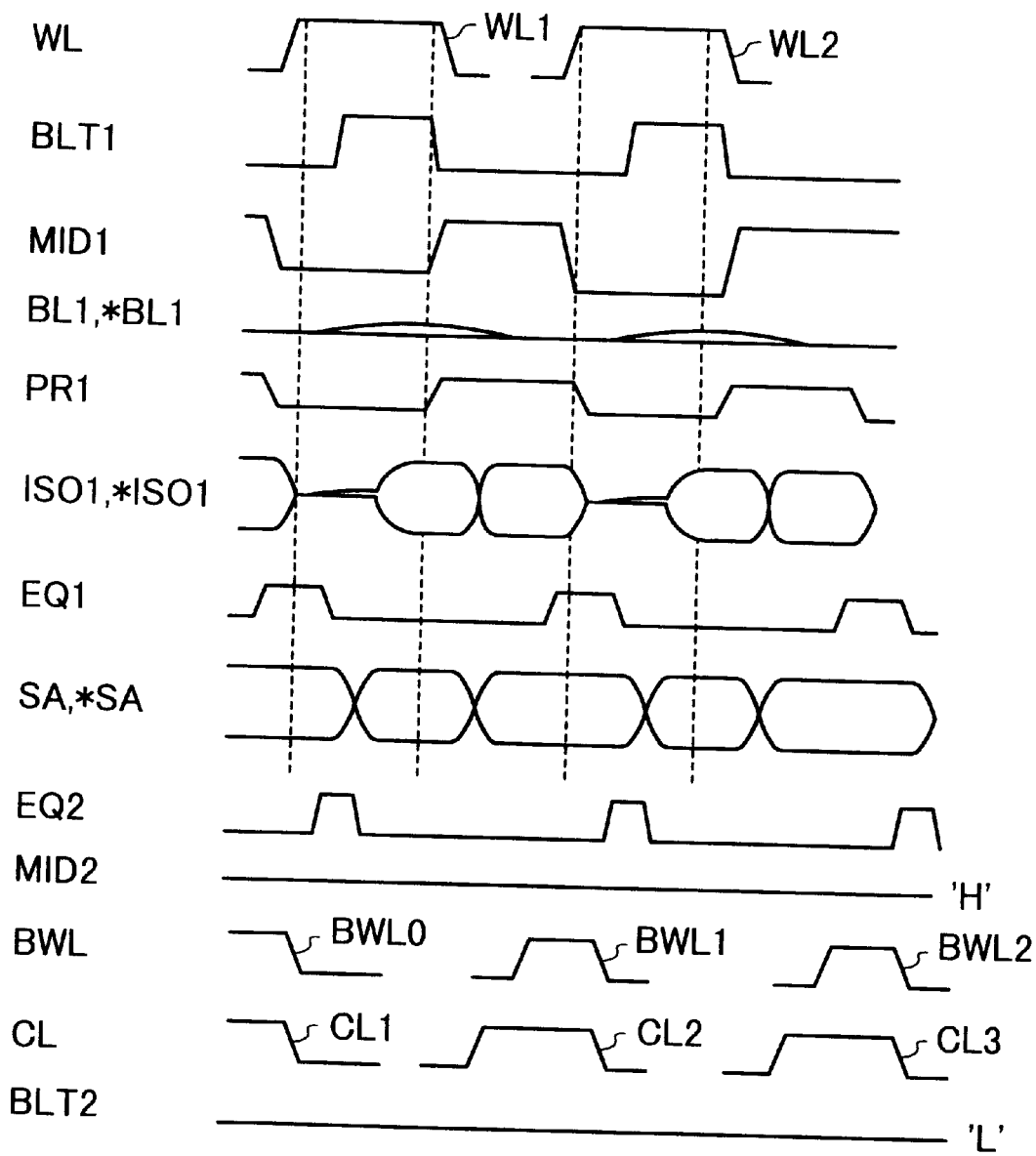
FIG. 28 is a timing chart showing write operations of the circuit in FIG. 26.

In FIG. 26, WL represents a plurality of word lines connected to the memory cell array MC1, and BWL represents a plurality of word lines connected to the buffer memory cell circuit 18A. In FIG. 27 and FIG. 28, the word lines WL1 and WL2 are included in the word line WL, and the word lines BWL0 through BWL2 are included in BWL.

Next, a description will be given of the circuit in a case where the bit line reset potential Vrst1 is Vii/2.

(1) read operation

FIG. 27 shows a read operation in a case where row addresses of the memory cell array are successively changed.

It is assumed that the stored content of the buffer memory cell circuit 18A is null (empty) at the beginning.

The operations of the circuit are identical to those in FIG. 19, excepting that the operation is not in the burst mode, the restoring operation is omitted, the buffer memory cell circuit 18A is selected, and storing is carried out in the buffer memory cell circuit 18A.

In the initial state, the potential of the word line BWL1 is high, whereby the previous data is being stored in the buffer memory cell circuit 18A, and the data is being transferred to the data buss lines DB and *DB.

(c11) In this state, a post-processing for the previous data and data read starting operation from the memory cell array MC1 are carried out in parallel.

That is, as the first step of the post-processing, the gate control signal MID1 is changed low, whereby the transfer gates 10A and 11A are turned off, and the equalizing signal EQ1 is changed high, whereby the wirings ISO1 and *ISO1 are short-circuited to be made to the same potential. As a read starting operation, the precharge signal PR1 is changed low, the potential of the word line WL1 is caused to rise, thereby a potential difference arises between the bit lines BL1 and *BL1 by movement of electric charge of the cell capacitor. As the second step of the post-processing, the potential of the word line BWL0 is caused to fall, thereby the data of the sense amplifier 15N is held in the buffer memory cell circuit 18A, and the column selection signal CL1 is changed low, whereby the column gates 16 and 17 are turned off. The equalizing signal EQ2 is changed high, thereby the wirings ISO2, *ISO2, SA and *SA are short-circuited to be made to the same potential. Further, the equalizing signal EQ1 is changed low, whereby the wirings ISO1 and *ISO1 are insulated from each other, and the gate control signal BLT1 is changed high, whereby the bit lines BL1 and the wiring ISO1 are conducted and the bit lines *BL1 and *ISO1 are conducted to each other.

(c12) Next, the first amplification step is carried out by a direct sensing.

That is, the equalizing signal EQ2 is changed low, whereby the wirings ISO2 and *ISO2 are insulated from each other, the column selection signal CL1 is changed high, whereby the column gates 16 and 17 are turned on.

Since the sources of the PMOS transistors 151 and 152 is fixed at the potential Vii and the transfer gates 10A and 11A are off, currents flow to the wirings *SA and SA via the PMOS transistors 151 and 152 from the wiring of the potential Vii in response to the gate potential of the PMOS transistors 151 and 152, thereby a potential difference arises between the wirings SA and *SA.

(c13) Next, the second amplification step by a CMOS sense amplifier and a precharge of the bit line pair are performed in parallel.

That is, the gate control signal MID1 is made high to operate the CMOS sense amplifier. Since a restoring operation is not carried out, on one hand, the gate control signal BLT1 is made low to turn on the transfer gates 10 and 11, whereby the amplification speed is increased with lowering the load of the CMOS sense amplifier. On the other hand, the precharge signal PR1 is made high and the potential of the word line WL1 is made low, whereby the bit lines BL1 and *BL1 are precharged to the potential Vii/2 and the transfer gate electrode of the memory cell is closed.

Next, the same operation as the above (c11) through (c13) are carried out for other memory cell row.

For example, the row cycle which was in the prior art 40 ns can be shortened by 20 ns by omitting the restore, and the row cycle is further shortened by 10 ns by speeding up the sense amplification operation as described above, resulting in that the row cycle becomes 10 ns.

In FIG. 26, since both sides of the buffer memory cell circuit 18A are symmetrical, the read operation from the memory cell array MC2 becomes symmetrical to the above-described operations from the memory cell array MC1, therefore the explanation thereof is omitted.

(2) write operation

FIG. 28 shows a write operation in a case where row addresses of the memory cell array are successively changed. The control of the circuit of FIG. 26 is identical to that of the above read, excepting that a part of the operation timings differs.

(3) restoring operation

Figure 29:
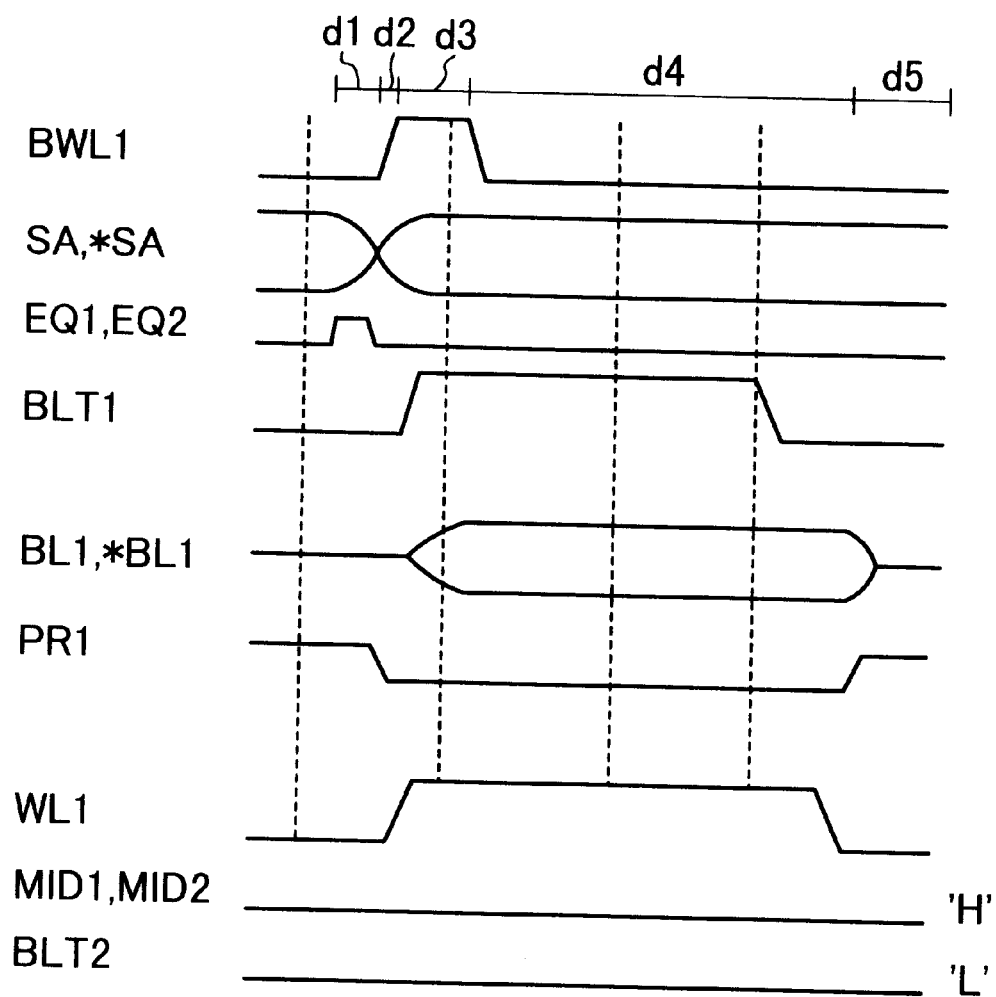
FIG. 29 is a timing chart showing a restoring operation of the circuit in FIG. 26.

FIG. 29 shows a restoring operation of the circuit of FIG. 26. Hereinafter, a description will be given of a case where the content of the buffer memory cell circuit 18A is restored into the memory cell array MC1.

The operation is started from the same state as the initial state of the above-described read operation.

(d1) The equalizing signals EQ1 and EQ2 are changed high, whereby the wirings ISO1, SA, ISO2, *ISO1, *SA and *ISO2 are made to the same potential.

(d2) The precharge signal PR1 is changed low, next the word line BWL1 is changed high, whereby the buffer cell data is read out onto the wirings SA and *SA, and a potential difference between the wirings SA and *SA is amplified by the PMOS cross-coupled circuit 15P and NMOS cross-coupled circuit 15N. Since the buffer memory cell circuit 18A exists in the vicinity of the PMOS cross-coupled circuit 15P and NMOS cross-coupled circuit 15N, and the load of the CMOS sense amplifier is small because of the transfer gates 10 and 11 being off, the amplification is carried out at a high speed.

(d3) The potential of the word line WL1 is caused to rise. Further, the gate transfer signal BLT1 is changed high, whereby the bit wirings BL1 and ISO1 are conducted to each other and the bit lines BL1 and wiring *ISO1 are conducted to each other, thereby a potential difference arises between the bit lines BL1 and *BL1 and the potential difference is amplified by the PMOS cross-coupled circuit 15P and NMOS cross-coupled circuit 15N.

(d4) The word line BWL1 is changed low.

The gate control signal BLT1 is changed low and the word line WL1 is changed low, whereby a restoring operation for the memory cell array MC1 is completed.

(d5) The state is made to the same as the above initial state of the read operation.

Eighth Embodiment

Figure 30:
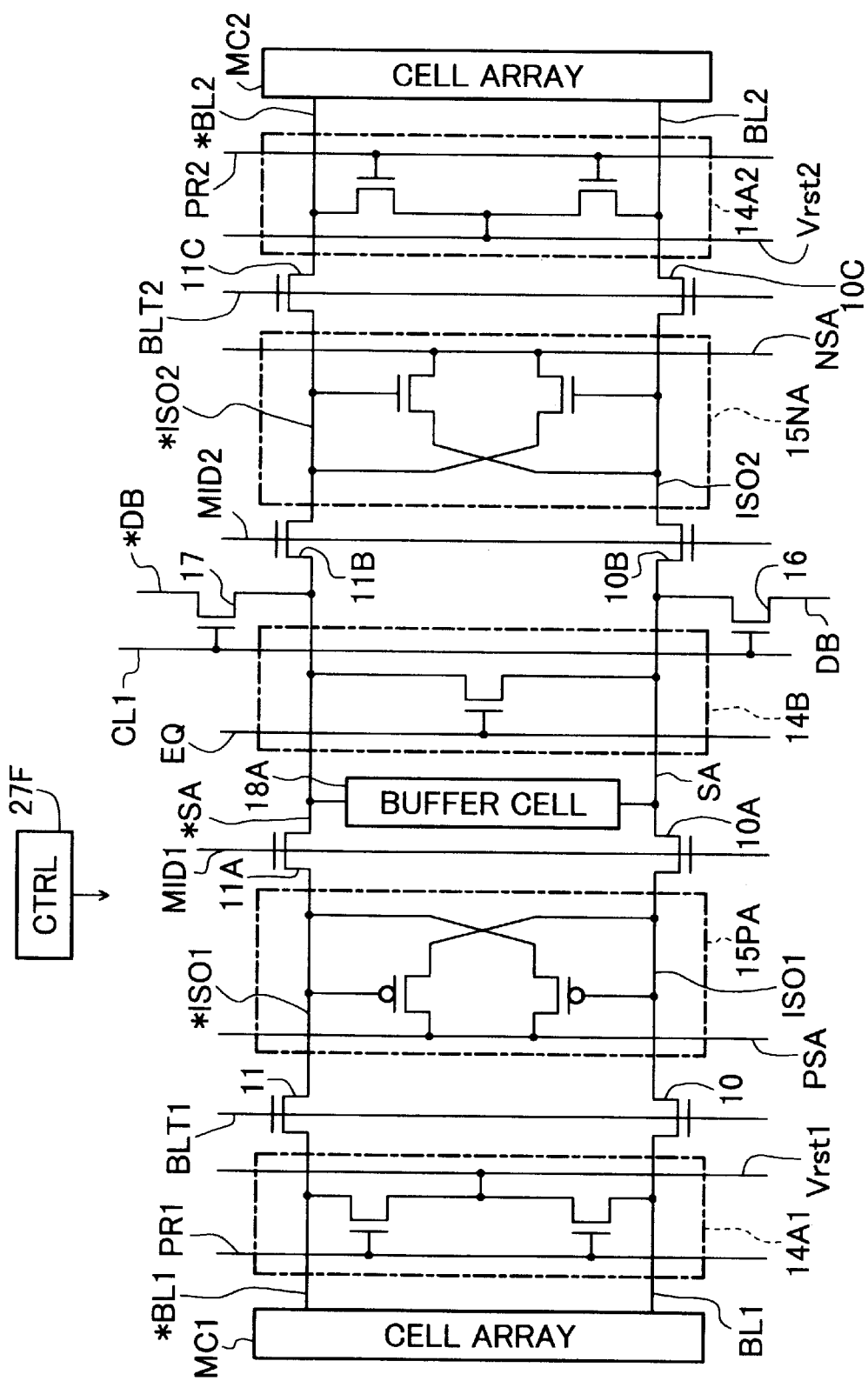
FIG. 30 is a diagram showing a circuit connected to a bit line pair in a DRAM according to the eighth embodiment of the present invention.

FIG. 30 shows a circuit connected to a bit line pair in a DRAM according to the eighth embodiment of the present invention.

In the circuit, the transfer gates 10A and 11A are connected between the PMOS cross-coupled circuit 15PA and buffer memory cell circuit 18A, the transfer gates 10B and 11B are connected between the NMOS cross-coupled circuit 15NA and buffer memory cell circuit 18A, and an equalizer 14B is connected between the wirings SA and *SA instead of the equalizers 14B1 and 14B2 of FIG. 26. The source potentials PSA and NSA of the cross-coupled circuit 15PA and 15NA can be variable. All the other points are of the same construction as in FIG. 26. The controls for the circuit between the bit line pair are carried out by the control circuit 27F.

While accessing the memory cell array MC1, the gate control signal BLT2 maintains a low, thereby the transfer gates 10C and 11C are off.

Next, a description will be given of a read operation of the circuit from the memory cell array MC1.

In the initial state, as the same as that of FIG. 26, the circuit is reset on the memory cell array MC1 side, and the previous data is held on the CMOS sense amplifier side. That is, the gate control signal BLT1 is low, whereby the transfer gates 10 and 11 are off with the precharge circuit 14A1 being on. Further, the gate control signals MID1 and MID2 are high, whereby the transfer gates 10A, 11A, 10B and 11B are on with the drive signals PSA and NSA being the potentials Vii and Vss, respectively, and the CMOS amplifier having the PMOS cross-coupled circuit 15PA and NMOS cross-coupled circuit 15NA is activated with the previous data being held at the CMOS amplifier.

(c21) In this state, the first post-processing step is carried out for the previous data.

That is, the gate control signal MID1 is changed low, whereby the transfer gates 10 and 11 are turned off, and the drive signal PSA is changed to the potential Vii/2, whereby the PMOS cross-coupled circuit 15PA becomes inactive.

(c22) The next data read starting operation from the memory cell array MC1 is carried out.

That is, the precharge circuit 14A1 is turned off, the potential of the selected word line is caused to rise, and the transfer gates 10 and 11 are turned on, whereby a small potential difference between the wirings ISO and *ISO arises between BL1 and *BL1 by movement of electric charge of a cell capacitor.

(c23) Next, the first amplification step is performed in parallel with the second post-processing step for the previous data.

That is, on one hand, the drive signal PSA is changed from the potential Vii/2 to the potential Vii, whereby the PMOS cross-coupled circuit 15PA is activated. Since the restoring operation is not performed, the gate control signal BLT1 is made low, thereby the transfer gates 10 and 11 are turned off with the potential difference between the bit lines BL1 and *BL1 not being amplified. Thereby the load of the PMOS cross-coupled circuit 15PA is decreased and the potential difference amplification speed between the wirings ISO1 and *ISO2 is increased. On the other hand, storing data in the buffer memory cell circuit 18A is completed, and the column gates 16 and 17 are turned off, thereafter the wirings SA and *SA are short-circuited by the equalizer 14B, the drive signal NSA is changed from the potential Vss to the potential Vii/2, and this short-circuit is cancelled after the wirings SA and *SA becoming the same potential.

(c24) Next, the second amplification step by the CMOS sense amplifier is carried out in parallel with the precharge of the bit line pair.

That is, on one hand, the gate control signal MID1 is changed high so that the CMOS sense amplifier having the PMOS cross-coupled circuit 15P and NMOS cross-coupled circuit 15N operates with the transfer gates 10A and 11A being on, since there is a potential difference between the wirings ISO1 and *ISO1 by the above-described amplification to such a degree that no erroneous operation arises even though the amplification is performed by the CMOS sense amplifier. On the other hand, the precharge signal PR1 is changed high, whereby the bit lines BL1 and *BL1 are precharged to the potential Vii/2 in a short time.

Next, the column gates 16 and 17 are turned on, whereby data are transmitted to the data bus lines DB and *DB. The potential of the word line for buffer cells is caused to rise, thereby storing the output state of the CMOS sense amplifier into the buffer memory cell circuit 18A is started.

Next, the above-described operations from (c21) through (c24) are carried out for other memory cell row.

In FIG. 30, since both sides of the buffer memory cell circuit 18A are symmetrical to each other, the read operation from the memory cell array MC2 is made symmetrical to the above-described operation from the memory cell array MC1. Therefore, the description thereof is omitted.

Ninth Embodiment

Figure 31:
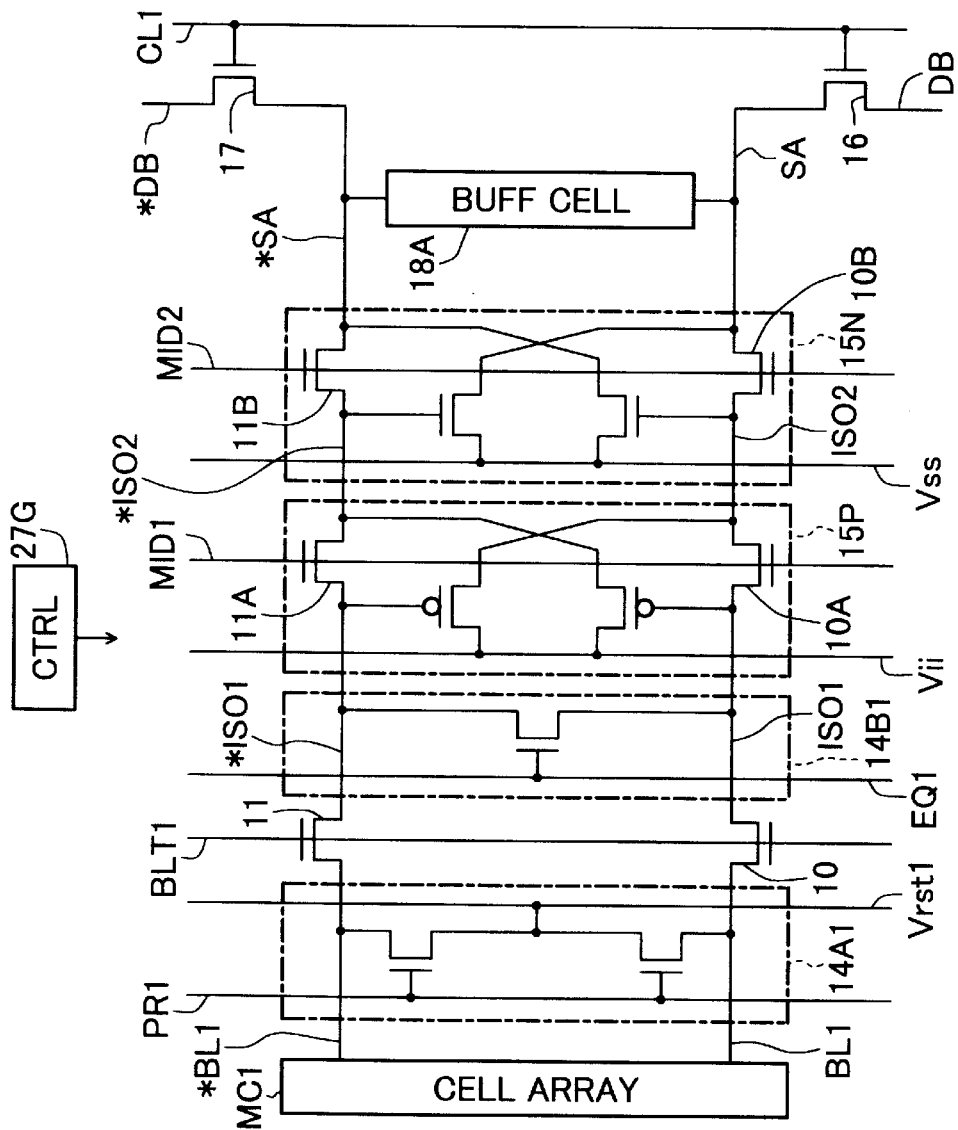
FIG. 31 is a diagram showing a circuit connected to a bit line pair in a DRAM according to the ninth embodiment of the present invention, which corresponds to FIG. 22.

FIG. 31 shows a circuit connected to a bit line pair in a DRAM according to the ninth embodiment of the present invention, which corresponds to that of FIG. 22.

The circuit is identical to that of FIG. 22, excepting that the buffer memory cell circuit 18A is connected between the wirings SA and *SA. The controls for the circuit are carried out by a control circuit 27G.

The operations of the circuit are like those of the circuit of FIG. 22, excepting the operation with respect to the buffer memory cell circuit 18A.

Next, a description will be given of a read operation from the memory cell array MC1 of the circuit.

(c31) The data read starting operation from a cell of the memory cell array MC1 and the post-processing for the previous data are carried out in parallel.

That is, with the transfer gates 10 and 11 being off, on one hand, the precharge circuit 14A1 is turned off, the potential of the selected word line is caused to rise, whereby a potential difference arises between BL1 and *BL1 by movement of electric charge of a cell capacitor. On the other hand, storing data into the buffer memory cell circuit 18A is completed, and the column gates 16 and 17 are turned off. Thereafter, the wirings SA and *SA are short-circuited by the equalizer 14B1, and the short-circuiting is cancelled after the wirings SA and *SA are made to the same potential.

(c32) Next, the first amplification step is carried out.

That is, the transfer gates 10A, 11A, 10B and 11B are turned off and the transfer gates 10 and 11 are turned on, whereby the direct sensing of two stages is carried out by the PMOS cross-coupled circuit 15P and NMOS cross-coupled circuit 15N, and then the column gates 16 and 17 are turned on.

(c33) Next, the second amplification step by the CMOS sense amplifier and precharge of the bit line pair are carried out in parallel.

That is, the transfer gates 10B and 11B are made on after there is a potential difference between the wirings SA and *SA to such a degree that no erroneous operation arises even though amplification is performed by the NMOS cross-coupled circuit 15N with the transfer gates 10B and 11B being on. Next, similarly the transfer gates 10A and 11A are turned on, whereby the CMOS sense amplifier of high drive ability, in which the PMOS cross-coupled circuit 15P and an NMOS cross-coupled circuit 15N are combined, is operated. On the other hand, since a restoring operation is not carried out, the transfer gates 10 and 11 are turned off in such a state where the potential difference between the bit line BL1 and *BL1 is not amplified, and the precharge signal PR1 is changed high, whereby the bit lines BL1 and *BL1 are precharged to the potential Vii/2 in a short time.

Next, the above-described operations from (c31) through (c33) are carried out for other memory cell row.

Tenth Embodiment

Figure 32:
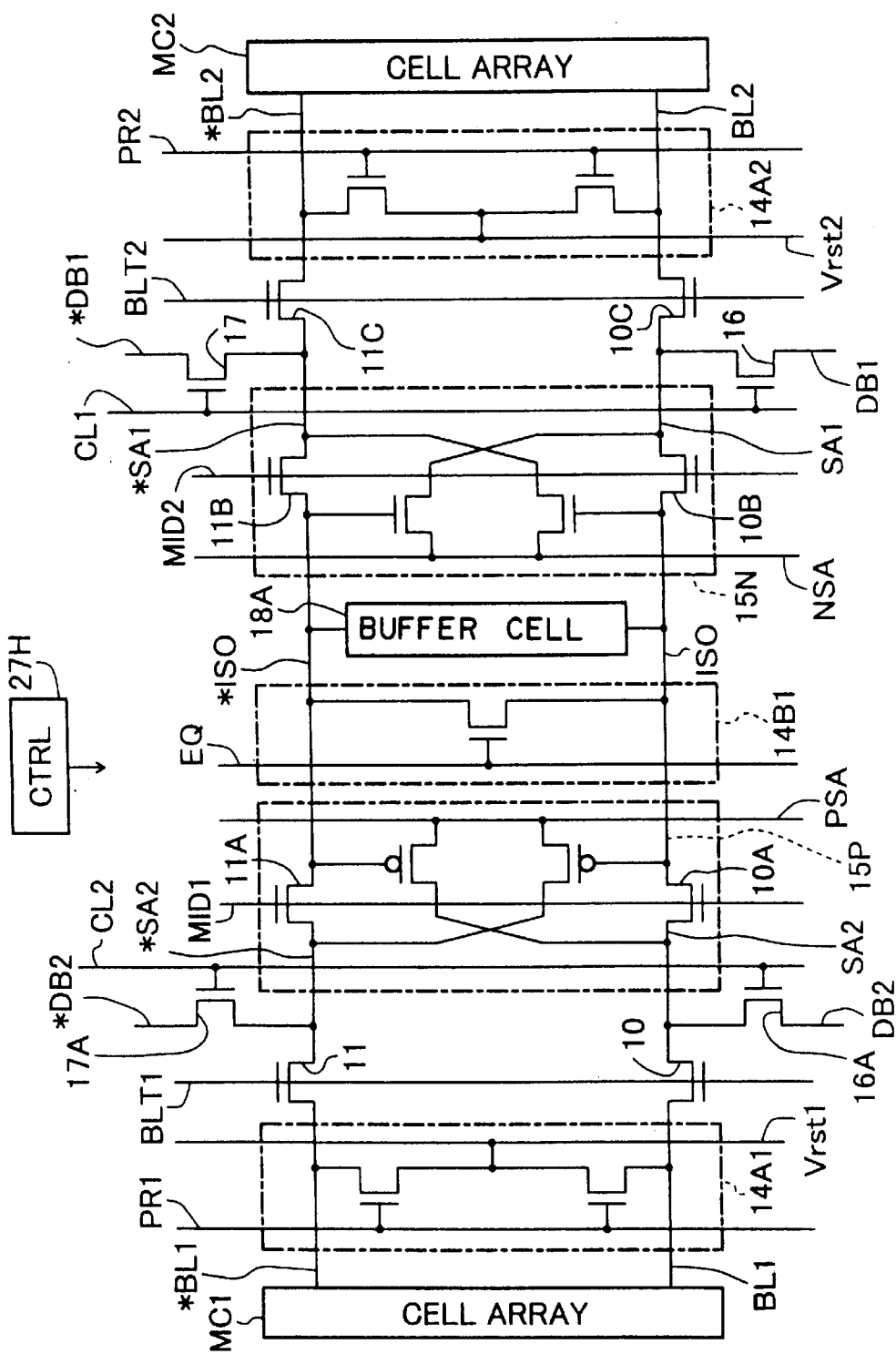
FIG. 32 is a diagram showing a circuit connected to a bit line pair in a DRAM according to the tenth embodiment of the present invention, which corresponds to FIG. 24.

FIG. 32 shows a circuit connected to a bit line pair in a DRAM according to the tenth embodiment of the present invention, which corresponds to that of FIG. 24.

The circuit is the same as that of FIG. 24, excepting that the buffer memory cell circuit 18A is connected between the wirings ISO and *ISO. The controls for the circuit between the bit line pair are carried out by a control circuit 27H.

The operations of the circuit are like those of the circuit of FIG. 25, excepting the operation with respect to the buffer memory cell circuit 18A.

Next, a description will be given of a read operation of the circuit from the memory cell array MC1.

(c41) The data read starting operation from a cell of the memory cell array MC1 and the post-processing for the previous data are carried out in parallel.

That is, with the transfer gates 10 and 11 being off, on one hand, the precharge circuit 14A1 is turned off, the potential of the selected word line is caused to rise, whereby a potential difference arises between BL1 and *BL1 by movement of electric charge of a cell capacitor. On the other hand, storing data into the buffer memory cell circuit 18A is completed, and the column gates 16 and 17 are turned off. Thereafter, the potential of the drive signals PSA and NSA are changed from Vii to Vii/2, and simultaneously the wirings SA and *SA are short-circuited by the equalizer 14B1. After the wirings SA and *SA have become the same potential, this short-circuit is cancelled, the transfer gates 10B and 11B are turned off. Next, the drive signal NSA is made to Vss and transfer gates 10 and 11 are made on.

(c42) Next, the first amplification step is carried out.

That is, the drive signal PSA is caused to rise to the potential Vii. Since no restoring operation is carried out, the transfer gates 10 and 11 are turned off in a state where the potential difference between the bit lines BL1 and *BL1 is not amplified, thereby the load of the PMOS cross-coupled circuit 15P is decreased. With the amplification of the potential difference between the wirings ISO and *ISO by the PMOS cross-coupled circuit 15P, the amplification of the difference of the currents flowing to the wirings SA1 and *SA1 by the direct sensing of the NMOS cross-coupled circuit 15N is made greater.

(c43) Next, the second amplification step is carried out by a CMOS sense amplifier in parallel with the precharge of the bit line pair.

That is, after a potential difference between the wirings ISO and *ISO has become such a degree that no erroneous operation arises even though the amplification is carried out by the NMOS cross-coupled circuit 15N with the transfer gates 10B and 11B being on, these transfer gates 10B and 11B are turned on, whereby the CMOS sense amplification having high drive ability, in which the NMOS cross-coupled circuit 15P and NMOS cross-coupled circuit 15N are combined, is operated. On the other hand, the precharge signal PR1 is changed high, whereby the bit lines BL1 and *BL1 are precharged to the potential Vii/2 in a short time.

Next, the above-described operations from (c41) to (c43) are carried out for the other memory cell row.

In FIG. 32, since both sides of the buffer memory cell circuit 18A are symmetrical to each other, the read operation from the memory cell array MC2 is made symmetrical to the above-described operation from the memory cell array MC1, therefore the description thereof is omitted.

Although preferred embodiments of the present invention has been described, it is to be understood that the invention is not limited thereto and that various changes and modifications may be made without departing from the spirit and scope of the invention.

For example, the present invention is applicable to memories other than DRAM.

What is claimed is:

1. A destructive read type memory circuit comprising:
   a memory cell array having a plurality of memory cells each of which is selected by a row address;

a buffer memory cell;

a restoring address register;

a selection circuit for selecting one of a present row address or an output of the restoring address register; and a control circuit for storing a present row address into said restoring address register, storing a content of the selected memory cell into said buffer memory cell, completing an access to the selected memory cell with a destructed content without restoring to the selected memory cell, and restoring in a free time the content of the stored buffer memory cell into the memory cell addressed by the content held in said restoring address register.

2. A destructive read type memory circuit according to claim 1, wherein each of said memory cell is connected operatively to a bit line, said memory circuit further comprising a sense amplifier for amplifying a signal read out from the selected memory cell onto said bit line.

3. A destructive read type memory circuit according to claim 2, further comprising a switching element connected between said bit line and said sense amplifier, wherein said control circuit turns off said switching element when said sense amplifier starts to amplify.

4. A destructive read type memory circuit comprising:

a plurality of memory cell blocks, said memory cell blocks having respective memory cell arrays, each of said memory cell arrays having a plurality of memory cells, one of said memory cell blocks and one of said memory cells being selected by an address;

buffer memory cells provided for respective buffer memory cell blocks;

restore address registers provided for respective buffer memory cell blocks; and a control circuit for storing a present row address into the restoring address register corresponding to the selected memory cell block, storing a content of the selected memory cell into the buffer memory cell corresponding to the selected memory cell block, completing an access to the selected memory cell with a destructed content without restoring to the selected memory cell, and restoring in a free time the content of the stored buffer memory cell into the memory cell addressed by the content held in the corresponding restoring address register.

5. A destructive read type memory circuit according to claim 1, wherein said control circuit causes the selection circuit corresponding to the selected memory cell block to select the present row address and causes the selection circuit to select the output of the corresponding restoring address register in said free time.

6. A destructive read type memory circuit according to claim 5, further comprises an row address transition detecting circuit, wherein there are provided N buffer memory cells and N restoring address registers for each of said memory cell blocks, wherein said selection circuit selects one of a present row address and outputs of the corresponding N restoring address registers, wherein said control circuit comprises for each of said memory cell blocks:

an up/down counter; and an up/down signal generating circuit for providing said up/down counter with a signal to count up if a row address transition is detected, a corresponding memory cell block is selected and the count of said up/down counter is smaller than N, and with a signal to count down if an address transition is detected, it is in said free time and the count of said up/down counter is not zero.

7. A destructive read type memory circuit according to claim 6, wherein said control circuit further comprises in-block row address control circuits provided for the respective memory cell blocks, each of said in-block row address control circuits is, when the corresponding memory cell block is selected, in regard to the corresponding memory cell block, for causing the restoring address register corresponding to the count of said up/down counter to latch the present row address and causing the corresponding selection circuit to select the present row address, if the count is smaller than n; and for outputting control signals to carry out a restoring to the selected memory cell in a memory access cycle if the count is n, and each of said in-block row address control circuits is, when it is in said free time, in regard to the corresponding memory cell block, for causing the corresponding selection circuit to select an output of the restoring address register corresponding to the count if the count is not zero.

8. A destructive read type memory circuit according to claim 7, wherein each of said in-block row address control circuits is for selecting the buffer memory cell corresponding to the count when causing the corresponding selection circuit to select.

9. A destructive read type memory circuit according to claim 5, further comprising a predecoder for a row address; and word decoders, each for further decoding an output of said predecoder, provided for the respective memory cell blocks, wherein said selection circuits are connected between said predecoder and the corresponding word decoder.

10. A destructive read type memory circuit according to claim 5, wherein there are provided N buffer memory cells and N restoring address registers for each of said memory cell blocks, wherein said selection circuit selects one of a present row address and outputs of the corresponding N restoring address registers, said memory circuit further comprises N flag-storage cells provided for the respective N restoring address registers, each of said N flag-storage cells is for storing a flag designating whether a content of the corresponding restoring address resister is 'EFFECTIVE' or 'INEFFECTIVE', wherein said control circuit, when one of said memory cell blocks is selected by a present row address, causes the flag corresponding to the selected memory cell block to change to 'EFFECTIVE' if the same is 'INEFFECTIVE', and causes the restoring address register corresponding thereto to latch the present row address, and wherein said control circuit, if a flag of said flag-storage cells is 'EFFECTIVE' in said free time, causes the same to change to 'INEFFECTIVE' and causes the selection circuit corresponding thereto to select the content of the restoring address register corresponding thereto.

11. A destructive read type memory circuit comprising:
- a plurality of banks having respective memory cell blocks, said memory cell blocks having respective memory cell arrays, each of said memory cell arrays having a plurality of memory cells, one of said banks, one of said memory cell blocks and one of said memory cells being selected by an address;
- buffer memory cells provided for respective memory cell blocks;
- restoring address registers for respective memory cell blocks;
- selection circuits provided for the respective memory cell blocks, each of said selection circuits selecting one of a present row address or an output of the corresponding restoring address register; and
- a control circuit for storing a present row address into the restoring address register corresponding to the selected bank and selected memory cell block therein, storing a content of the selected memory cell into the buffer memory cell corresponding to the selected memory cell block, completing an access to the selected memory cell without restoring to the selected memory cell, and restoring in a free time the content of the stored buffer memory cell into the memory cell addressed by the content held in the corresponding restoring address register.

12. A destructive read type memory circuit according to claim 11, further comprising:
- flag-storage cells provided for the respective restoring address registers, each of said flag-storage cells is for storing a flag designating whether a content of the corresponding restoring address resister is 'EFFECTIVE' or 'INEFFECTIVE';
- an effective flag selection circuit for selecting a flag from 'EFFECTIVE' flags in the flag-storage cells; and
- a selection circuit for selecting one of the outputs of said restoring address registers, this one corresponding to the selected 'EFFECTIVE' flag;
- wherein said control circuit, in regard to the selected memory cell block by a present row address, causes the corresponding flag to change to 'EFFECTIVE' if the same is 'INEFFECTIVE', and causes the restoring address register corresponding thereto to latch the present row address, and
- wherein said control circuit, in regard to a non-selected memory cell block by the present row address, causes the flag of the flag-storage cell corresponding to the selected 'EFFECTIVE' flag by said effective flag selection circuit to change to 'INEFFECTIVE' and causes the content of the corresponding buffer memory cell to store into the memory cell addressed by the output of said selection circuit.

13. A restoring circuit, comprising:
- a restoring address storage circuit for storing a plurality of restoring addresses;
- a control circuit for storing a row address in said restoring address storage circuit without causing a memory device to restoring when a first chip selection signal is active, and outputting a content of said restoring address storage circuit, an activated restoring signal and an activated second chip selection signal when said first chip selection signal is inactive.

14. A restoring circuit, according to claim 13, further comprising:
- a flag-storage circuit for storing flags designating whether the respective row addresses stored in said restoring address storage circuit are 'EFFECTIVE' or 'INEFFECTIVE';
- an effective flag selection circuit for selecting one flag from the 'EFFECTIVE' flags in said flag-storage circuit; and
- a selection circuit for selecting one of the addresses stored in said restoring address storage circuit, this one corresponding to the selected 'EFFECTIVE' flag;
- wherein said control circuit, when said first chip selection signal is active, causes a flag to change to 'EFFECTIVE' if the same is 'INEFFECTIVE' and causes at a storage place in said restoring address circuit to latch the present row address, said place corresponding to this flag, and
- wherein said control circuit, when said first chip selection signal is inactive, causes the flag in the flag-storage circuit corresponding to the selected 'EFFECTIVE' flag to change to 'INEFFECTIVE'.

15. A destructive read type memory circuit, comprising:
- a memory cell block;
- a buffer memory cell provided for said memory cell block;
- a control circuit for storing the content of an addressed memory cell in said memory cell block into said buffer memory cell with omitting a restoring operation to the addressed memory cell in response to a restoring omission instruction, and storing the content of said buffer memory cell into an addressed memory cell in said memory cell block in response to a restoring instruction.

16. A semiconductor device including a destructive read type memory circuit which comprises:
- a memory cell array having a plurality of memory cells each of which is selected by an address;
- a buffer memory cell;
- a restoring address register;
- a selection circuit for selecting one of a present row address or an output of the restoring address register; and
- a control circuit for storing a present row address into said restoring address register, storing a content of the selected memory cell into said buffer memory cell, completing an access to the selected memory cell without restoring to the selected memory cell, and restoring in a free time the content of the stored buffer memory cell into the memory cell addressed by the content held in said restoring address register.

* * * * *